(12) United States Patent
Kurokawa

(10) Patent No.: US 11,676,986 B2
(45) Date of Patent: Jun. 13, 2023

(54) SEMICONDUCTOR DEVICE AND ELECTRONIC DEVICE

(71) Applicant: Semiconductor Energy Laboratory Co., Ltd., Kanagawa-ken (JP)

(72) Inventor: Yoshiyuki Kurokawa, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 134 days.

(21) Appl. No.: 17/210,857

(22) Filed: Mar. 24, 2021

(65) Prior Publication Data

US 2021/0233952 A1 Jul. 29, 2021

Related U.S. Application Data

(60) Continuation of application No. 16/822,330, filed on Mar. 18, 2020, now Pat. No. 10,964,743, which is a (Continued)

(30) Foreign Application Priority Data

Dec. 10, 2014 (JP) .................................. 2014-250013
Dec. 29, 2014 (JP) .................................. 2014-266957

(51) Int. Cl.
*H01L 27/146* (2006.01)
*H01L 29/24* (2006.01)
(Continued)

(52) U.S. Cl.
CPC .. *H01L 27/14643* (2013.01); *H01L 27/14609* (2013.01); *H01L 27/14612* (2013.01); *H01L 27/14623* (2013.01); *H01L 27/14636* (2013.01); *H01L 27/14667* (2013.01); *H01L 29/24* (2013.01); *H01L 31/0272* (2013.01); *H01L 31/0322* (2013.01)

(58) Field of Classification Search
CPC ......... H01L 27/14643; H01L 27/14609; H01L 27/14612; H01L 27/14623; H01L 27/14636; H01L 27/14667; H01L 29/24; H01L 31/0272; H01L 31/0322
USPC ......................................................... 257/42
See application file for complete search history.

(56) References Cited

U.S. PATENT DOCUMENTS 5,101,255 A    3/1992  Ishioka et al.
5,262,980 A *  11/1993 Shannon ............... G11C 13/04
                                                365/112
(Continued)

FOREIGN PATENT DOCUMENTS

EP    1737044 A    12/2006
EP    2226847 A     9/2010
(Continued)

OTHER PUBLICATIONS

Aslam-Siddiqi.A et al., "A 16 x 16 Nonvolatile Programmable Analog Vector-Matrix Multiplier", IEEE Journal of Solid-State Circuits, Oct. 1, 1998, vol. 33, No. 10, pp. 1502-1509.
(Continued)

*Primary Examiner* — Jami Valentine Miller
(74) *Attorney, Agent, or Firm* — Husch Blackwell LLP

(57) ABSTRACT

A semiconductor device including pixels arranged in a matrix of n rows and m columns, in which the pixels in the m-th column are shielded from light, is provided.

8 Claims, 43 Drawing Sheets

Related U.S. Application Data continuation of application No. 16/122,060, filed on Sep. 5, 2018, now Pat. No. 10,600,839, which is a continuation of application No. 15/708,527, filed on Sep. 19, 2017, now Pat. No. 10,074,687, which is a division of application No. 14/961,181, filed on Dec. 7, 2015, now Pat. No. 9,773,832.

(51) Int. Cl.
  *H01L 31/0272* (2006.01)
  *H01L 31/032* (2006.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,397,507 B2 | 7/2008 | Koseki et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,920,188 B2 | 4/2011 | Koseki et al. |
| 8,120,677 B2 | 2/2012 | Ukita et al. |
| 8,378,391 B2 | 2/2013 | Koyama et al. |
| 8,416,326 B2 | 4/2013 | Koseki et al. |
| 8,654,231 B2 | 2/2014 | Kurokawa et al. |
| 8,836,823 B2 | 9/2014 | Yamauchi |
| 8,916,869 B2 | 12/2014 | Koyama et al. |
| 8,964,085 B2 | 2/2015 | Kurokawa et al. |
| 9,153,619 B2 | 10/2015 | Kurokawa et al. |
| 9,257,567 B2 | 2/2016 | Kurokawa et al. |
| 9,515,107 B2 | 12/2016 | Kurokawa et al. |
| 9,716,852 B2 | 7/2017 | Kurokawa |
| 9,761,730 B2 | 9/2017 | Kurokawa |
| 9,773,787 B2 | 9/2017 | Matsuzaki |
| 9,773,832 B2 | 9/2017 | Kurokawa |
| 9,848,146 B2 | 12/2017 | Kurokawa |
| 9,870,827 B2 | 1/2018 | Nakagawa et al. |
| 9,883,129 B2 | 1/2018 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0091191 A1* | 4/2007 | Oike .............. H04N 5/357 348/294 |
| 2007/0108446 A1 | 5/2007 | Akimoto |
| 2007/0139539 A1* | 6/2007 | Ohara .............. H04N 5/361 348/E5.081 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0128158 A1* | 5/2010 | Wang .............. H04N 5/3653 348/311 |
| 2011/0101351 A1 | 5/2011 | Yamazaki |
| 2011/0198484 A1 | 8/2011 | Kurokawa |
| 2012/0001286 A1 | 1/2012 | Yoon |
| 2012/0120293 A1 | 5/2012 | Mabuchi |
| 2012/0212657 A1 | 8/2012 | Mo et al. |
| 2013/0056619 A1 | 3/2013 | Shinohara |
| 2013/0069132 A1 | 3/2013 | Atsumi et al. |
| 2013/0082912 A1 | 4/2013 | Smith |
| 2014/0132814 A1* | 5/2014 | Ishii .............. H03M 1/0604 341/158 |
| 2014/0368705 A1* | 12/2014 | Tanaka .............. H04N 5/378 348/300 |
| 2015/0048366 A1 | 2/2015 | Koyama et al. |
| 2015/0091629 A1 | 4/2015 | Ishizu et al. |
| 2015/0294992 A1 | 10/2015 | Kato |
| 2015/0332568 A1 | 11/2015 | Kurokawa |
| 2016/0021314 A1 | 1/2016 | Kurokawa et al. |
| 2016/0037106 A1 | 2/2016 | Ohmaru |

(56) References Cited

U.S. PATENT DOCUMENTS

| | | |
|---|---|---|
| 2016/0293649 A1 | 10/2016 | Kurokawa et al. |
| 2016/0293655 A1 | 10/2016 | Yoneda et al. |
| 2016/0301890 A1 | 10/2016 | Kurokawa |
| 2016/0316160 A1 | 10/2016 | Kurokawa |
| 2018/0103216 A1 | 4/2018 | Sakakibara et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-032349 A | 1/2000 |
| JP | 2000-044236 A | 2/2000 |
| JP | 2000-150900 A | 5/2000 |
| JP | 2002-076356 A | 3/2002 |
| JP | 2002-289953 A | 10/2002 |
| JP | 2003-086000 A | 3/2003 |
| JP | 2003-086808 A | 3/2003 |
| JP | 2003-259228 A | 9/2003 |
| JP | 2003-298946 A | 10/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-068056 A | 3/2010 |
| JP | 2010-130317 A | 6/2010 |
| JP | 2011-119711 A | 6/2011 |
| JP | 2011-171702 A | 9/2011 |
| JP | 2013-232918 A | 11/2013 |
| WO | WO-2004/114391 | 12/2004 |
| WO | WO-2011/111549 | 9/2011 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated By TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn-O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YBFE_2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000", Journal of Solid State Chemistry, 1985, vol. 60, pp. 382-384.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZNO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

(56) References Cited

OTHER PUBLICATIONS

Van De Walle, C. "Hydrogen as a Cause of Doping in Zinc Oxide", Phys. Rev. Lett. (Physical Review Letters), Jul. 31, 2000, vol. 85, No. 5, pp. 1012-1015.

Kotera, N. et al., "Constant-Current Circuit-Biasing Technology for GaAs FET ICs", IEEE Journal of Solid-State Circuits, 1995, vol. 30, No. 1, pp. 61-64.

\* cited by examiner

FIG. 20A1
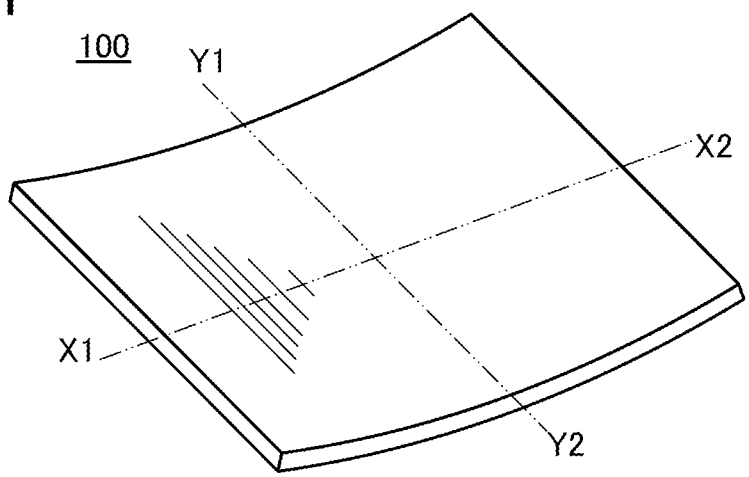
FIG. 20A2
FIG. 20A3
FIG. 20B1
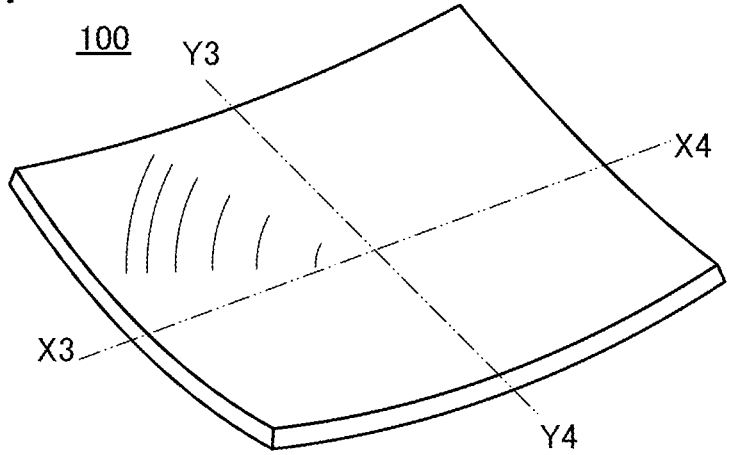
FIG. 20B2
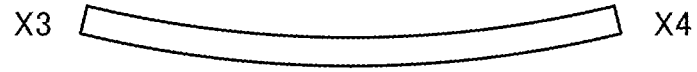
FIG. 20B3

SEMICONDUCTOR DEVICE AND ELECTRONIC DEVICE

This application is a continuation of copending U.S. application Ser. No. 16/822,330, filed on Mar. 18, 2020 which is a continuation of U.S. application Ser. No. 16/122,060, filed on Sep. 5, 2018 (now U.S. Pat. No. 10,600,839 issued Mar. 24, 2020) which is a continuation of U.S. application Ser. No. 15/708,527, filed on Sep. 19, 2017 (now U.S. Pat. No. 10,074,687 issued Sep. 11, 2018) is a divisional of U.S. application Ser. No. 14/961,181, filed on Dec. 7, 2015 (now U.S. Pat. No. 9,773,832 issued Sep. 26, 2017) which are all incorporated herein by reference.

BACKGROUND OF THE INVENTION

1. Field of the Invention

One embodiment of the present invention relates to a semiconductor device including an oxide semiconductor.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

A technique by which transistors are formed using semiconductor thin films formed over a substrate having an insulating surface has attracted attention. The transistor is used in a wide range of electronic devices such as an integrated circuit (IC) and a display device. A silicon-based semiconductor is widely known as a semiconductor material applicable to the transistor. As another material, an oxide semiconductor has attracted attention.

For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor and having extremely low off-state current is used in part of a pixel circuit and a transistor including silicon with which a complementary metal oxide semiconductor (CMOS) circuit can be formed is used in a peripheral circuit.

Patent Document 4 discloses a technique for forming a storage device by using a transistor including an oxide semiconductor.

REFERENCE

Patent Document 1: Japanese Published Patent Application No. 2007-123861

Patent Document 2: Japanese Published Patent Application No. 2007-096055

Patent Document 3: Japanese Published Patent Application No. 2011-119711

Patent Document 4: Japanese Published Patent Application No. 2011-171702

SUMMARY OF THE INVENTION

When a captured image is subjected to image processing, in a CMOS image sensor that is one embodiment of an imaging device, data read from each pixel is converted into digital data by A/D conversion and the digital data is output. Next, the digital data needs to be subjected to image processing by a dedicated image processing circuit, or the digital data needs to be loaded into a computer or the like and then image processing software needs to be executed, for example.

Specifically, A/D conversion in a CMOS image sensor, digital arithmetic processing in a dedicated image processing circuit, data transfer for loading a large quantity of data into a computer, execution of image processing software for the digital data by the computer, reading of image processing data from the computer, and the like are needed. Therefore, image processing is executed while consuming a large quantity of power.

In the case where vector matrix multiplication is performed by a digital circuit, multiplication of digital data corresponding to a certain row element in a vector stored in a digital memory and digital data corresponding to a certain matrix element in a matrix stored in the digital memory is performed by a multiplication circuit. Next, data of the obtained product is stored in the digital memory, and this operation is performed in all the row elements. Then, data of the products needs to be read from the digital memory one by one, and addition needs to be performed in an addition circuit, for example.

In the above procedure, data is read from and stored in the digital memory frequently; thus, the increase in arithmetic processing speed is required. Note that the arithmetic processing time can be shortened when a plurality of multiplication circuits or a plurality of addition circuits are provided to perform parallel processing. However, processing with such a structure increases power consumption.

An object of one embodiment of the present invention is to provide a semiconductor device with an image processing function. Another object of one embodiment of the present invention is to provide a semiconductor device capable of outputting data subjected to image processing. Another object of one embodiment of the present invention is to provide a low-power semiconductor device. Another object of one embodiment of the present invention is to provide a semiconductor device that is suitable for high-speed operation. Another object of one embodiment of the present invention is to provide a semiconductor device with high resolution. Another object of one embodiment of the present invention is to provide a highly integrated semiconductor device. Another object of one embodiment of the present invention is to provide a semiconductor device capable of imaging under a low illuminance condition. Another object of one embodiment of the present invention is to provide a semiconductor device with a wide dynamic range. Another object of one embodiment of the present invention is to provide a semiconductor device that can be used in a wide temperature range. Another object of one embodiment of the present invention is to provide a semiconductor device with a high aperture ratio. Another object of one embodiment of the present invention is to provide a semiconductor device with high reliability.

Another object of one embodiment of the present invention is to provide a semiconductor device with an arithmetic processing function. Another object of one embodiment of the present invention is to provide a semiconductor device capable of outputting data subjected to arithmetic processing. Another object of one embodiment of the present invention is to provide a semiconductor device including a memory element with excellent retention performance. Another object of one embodiment of the present invention is to provide a semiconductor device including a memory element with excellent write performance. Another object of one embodiment of the present invention is to provide a semiconductor device including a highly integrated memory element. Another object of one embodiment of the present invention is to provide a semiconductor device including a memory element with high capacity. Another object of one embodiment of the present invention is to provide a semiconductor device including a highly reliable memory element. Another object of one embodiment of the present invention is to provide a semiconductor device or the like including a novel memory element. Another object of one embodiment of the present invention is to provide a novel semiconductor device or the like.

The description of these objects does not disturb the existence of other objects. In one embodiment of the present invention, there is no need to achieve all the objects. Other objects will be apparent from and can be derived from the description of the specification, the drawings, the claims, and the like. Other objects will be apparent from and can be derived from the description of the specification, the drawings, the claims, and the like.

One embodiment of the present invention is a semiconductor device that includes pixels each provided with a first transistor, a second transistor, a third transistor, a photoelectric conversion element, and a first capacitor; a plurality of first circuits; and a second circuit. One electrode of the photoelectric conversion element is electrically connected to one of a source electrode and a drain electrode of the first transistor. The other of the source electrode and the drain electrode of the first transistor is electrically connected to one of a source electrode and a drain electrode of the second transistor. The other of the source electrode and the drain electrode of the first transistor is electrically connected to a gate electrode of the third transistor. The other of the source electrode and the drain electrode of the first transistor is electrically connected to one electrode of the first capacitor. The other electrode of the first capacitor is electrically connected to a first wiring provided in each row. One of a source electrode and a drain electrode of the third transistor is electrically connected to a second wiring provided in each column. The pixels are arranged in a matrix of n rows and m columns (each of n and m is a natural number of 2 or more). The plurality of first circuits are electrically connected to the second wirings electrically connected to pixels in first to (m−1)th columns. The first wiring is capable of supplying a different potential to each row. The second wiring electrically connected to pixels in an m-th column can be electrically connected to a first power supply line. The second wirings electrically connected to the pixels in the first to (m−1)th columns, the first circuits, and the first power supply line can be electrically connected to the second circuit. The pixels in the m-th column are shielded from light.

The first circuit can function as a constant-current circuit, and the second circuit can function as an output circuit.

The first circuit can include a fourth transistor, a fifth transistor, and a second capacitor. One of a source electrode and a drain electrode of the fourth transistor is electrically connected to one of a source electrode and a drain electrode of the fifth transistor. One of the source electrode and the drain electrode of the fourth transistor is electrically connected to the second wiring electrically connected to the pixels in any of the first to (m−1)th columns. The other of the source electrode and the drain electrode of the fourth transistor is electrically connected to one electrode of the second capacitor. The other of the source electrode and the drain electrode of the fourth transistor is electrically connected to a second power supply line. The other of the source electrode and the drain electrode of the fifth transistor is electrically connected to a gate electrode of the fourth transistor. The other of the source electrode and the drain electrode of the fifth transistor is electrically connected to the other electrode of the second capacitor.

The second wiring electrically connected to the pixels in any of the first to (m−1)th columns and the first circuit can be electrically connected to a first current mirror circuit.

The second circuit can include an operational amplifier. A first input terminal of the operational amplifier is electrically connected to the second wiring electrically connected to the pixels in any of the first to (m−1)th columns and the first circuit. A second input terminal of the operational amplifier is electrically connected to the first power supply line.

The second circuit can include a second current mirror circuit and a third current mirror circuit. An input transistor of the second current mirror circuit is electrically connected to the second wiring electrically connected to the pixels in any of the first to (m−1)th columns and the first circuit. An output transistor of the second current mirror circuit is electrically connected to the first input terminal of the operational amplifier. An input transistor of the third current mirror circuit is electrically connected to the second wiring electrically connected to the pixels in the m-th column. An output transistor of the third current mirror circuit is electrically connected to the second input terminal of the operational amplifier.

The transistor included in the pixel and the first circuit can include an oxide semiconductor for an active layer. The oxide semiconductor preferably includes In, Zn, and M (M is Al, Ti, Ga, Sn, Y, Zr, La, Ce, Nd, or Hf).

The photoelectric conversion element can contain selenium or a compound containing selenium in a photoelectric conversion layer.

Another embodiment of the present invention is a semiconductor device that includes memory elements each provided with a first transistor, a second transistor, and a first capacitor; a first circuit; and a second circuit. One of a source electrode and a drain electrode of the first transistor is electrically connected to a gate electrode of the second transistor. The gate electrode of the second transistor is electrically connected to one electrode of the first capacitor. The other electrode of the first capacitor is electrically connected to a first wiring provided in each row. A gate electrode of the first transistor is electrically connected to a second wiring provided in each row. The other of the source electrode and the drain electrode of the first transistor is electrically connected to a third wiring provided in each column. One of a source electrode and a drain electrode of the second transistor is electrically connected to a fourth wiring provided in each column. The other of the source electrode and the drain electrode of the second transistor is electrically connected to a fifth wiring provided in each column. The memory elements are arranged in a matrix of n rows and m columns (each of n and m is a natural number of 2 or more). The first wiring is capable of supplying a different potential to each row. The fifth wirings electrically connected to the memory elements in the first to (m−1)th columns are each electrically connected to the first circuit. The fifth wiring electrically connected to memory elements in an m-th column is electrically connected to a first power supply line. One input terminal of the second circuit is electrically connected to the fifth wirings electrically connected to the memory elements in the first to (m−1)th columns and the first circuit through a first current mirror circuit. The other input terminal of the second circuit is electrically connected to the fifth wiring electrically connected to the memory elements in the m-th column and the first circuit through a second current mirror circuit.

The first circuit can function as a constant-current circuit, and the second circuit can function as an output circuit.

The first circuit can include a third transistor, a fourth transistor, and a second capacitor. One of a source electrode and a drain electrode of the third transistor is electrically connected to one of a source electrode and a drain electrode of the fourth transistor. One of the source electrode and the drain electrode of the third transistor is electrically connected to the fifth wiring electrically connected to the memory elements in any of the first to (m−1)th columns. The other of the source electrode and the drain electrode of the third transistor is electrically connected to one electrode of the second capacitor. The other of the source electrode and the drain electrode of the third transistor is electrically connected to a second power supply line. The other of the source electrode and the drain electrode of the fourth transistor is electrically connected to a gate electrode of the third transistor. The other of the source electrode and the drain electrode of the fourth transistor is electrically connected to the other electrode of the second capacitor.

One of a source electrode and a drain electrode of an input transistor of the first current mirror circuit can be electrically connected to the first power supply line. The other of the source electrode and the drain electrode of the input transistor of the first current mirror circuit can be electrically connected to the fifth wiring electrically connected to the memory elements in any of the first to (m−1)th columns and one of the source electrode and the drain electrode of the third transistor. One of a source electrode and a drain electrode of an output transistor of the first current mirror circuit can be electrically connected to the first power supply line. The other of the source electrode and the drain electrode of the output transistor of the first current mirror circuit can be electrically connected to one input terminal of the second circuit.

One of a source electrode and a drain electrode of an input transistor of the second current mirror circuit can be electrically connected to the first power supply line. The other of the source electrode and the drain electrode of the input transistor of the second current mirror circuit can be electrically connected to the fifth wiring electrically connected to the memory elements in the m-th column. One of a source electrode and a drain electrode of an output transistor of the second current mirror circuit can be electrically connected to the first power supply line. The other of the source electrode and the drain electrode of the output transistor of the second current mirror circuit can be electrically connected to the other input terminal of the second circuit.

The second circuit can include an operational amplifier. One input terminal of the operational amplifier is electrically connected to the second power supply line through a first resistor.

The transistor included in the memory element and the first circuit can include an oxide semiconductor for an active layer. The oxide semiconductor preferably includes In, Zn, and M (M is Al, Ti, Ga, Sn, Y, Zr, La, Ce, Nd, or Hf).

According to one embodiment of the present invention, a semiconductor device with an image processing function can be provided. A semiconductor device capable of outputting data subjected to image processing can be provided. A low-power semiconductor device can be provided. A semiconductor device that is suitable for high-speed operation can be provided. A semiconductor device with high resolution can be provided. A highly integrated semiconductor device can be provided. A semiconductor device capable of imaging under a low illuminance condition can be provided. A semiconductor device with a wide dynamic range can be provided. A semiconductor device that can be used in a wide temperature range can be provided. A semiconductor device with a high aperture ratio can be provided. A semiconductor device with high reliability can be provided.

A semiconductor device with an arithmetic processing function can be provided. A semiconductor device capable of outputting data subjected to arithmetic processing can be provided. A semiconductor device including a memory element with excellent retention performance can be provided. A semiconductor device including a memory element with excellent write performance can be provided. A semiconductor device including a highly integrated memory element can be provided. A semiconductor device including a memory element with high capacity can be provided. A semiconductor device including a highly reliable memory element can be provided. A semiconductor device or the like including a novel memory element can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings.

FIGS. 20A1, 20A2, 20A3, 20B1, 20B2, and 20B3 illustrate a bent imaging device;

DETAILED DESCRIPTION OF THE INVENTION

Figure 1:
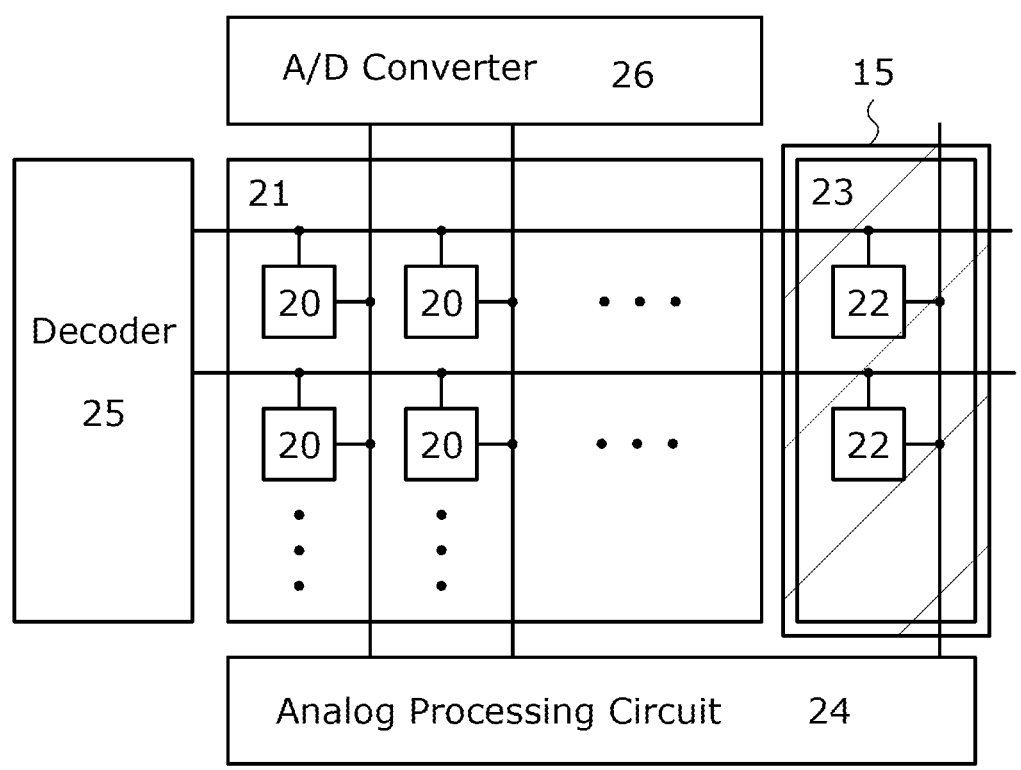
FIG. 1 is a block diagram illustrating an imaging device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Embodiment 1

In this embodiment, an imaging device that is one embodiment of the present invention is described with reference to drawings.

FIG. 1 is a block diagram illustrating an imaging device in one embodiment of the present invention. The imaging device includes a pixel array 21 where pixels 20 for imaging are arranged in a matrix, a reference pixel array 23 where reference pixels 22 for image processing are arranged, an analog processing circuit 24, and a row decoder 25 that outputs a potential for image processing to each pixel. Note that an A/D converter 26 can be used when image processing is not performed. Thus, the A/D converter 26 can be omitted.

Although the pixel array 21 and the reference pixel array 23 are separately illustrated, circuits of the pixels 20 and the reference pixels 22 have the same structure. Therefore, in the plurality of pixels arranged in a matrix, the pixels in one column at an end function as the reference pixel array 23, and the other pixels function as the pixel array 21. In addition, a light-blocking layer 15 shields the reference pixel array 23 from light.

The imaging device in FIG. 1 that is one embodiment of the present invention has a function of retaining imaging data in the pixel 20. When selection signals with different potentials are applied from the row decoder 25 to the pixels 20 in a plurality of rows, current that depends on the product of the potential of the imaging data and the potential of the selection signal can flow from each pixel 20. Then, an output signal based on the sum of these currents is obtained by the analog processing circuit 24, and image processing data can be output. Furthermore, by changing the number of selection signal lines for applying potentials and changing the kind of potentials applied to the selection signal lines, image processing such as edge detection of imaging data can be performed. Moreover, different image processing can be performed on the same imaging data retained in the pixels.

Figure 2:
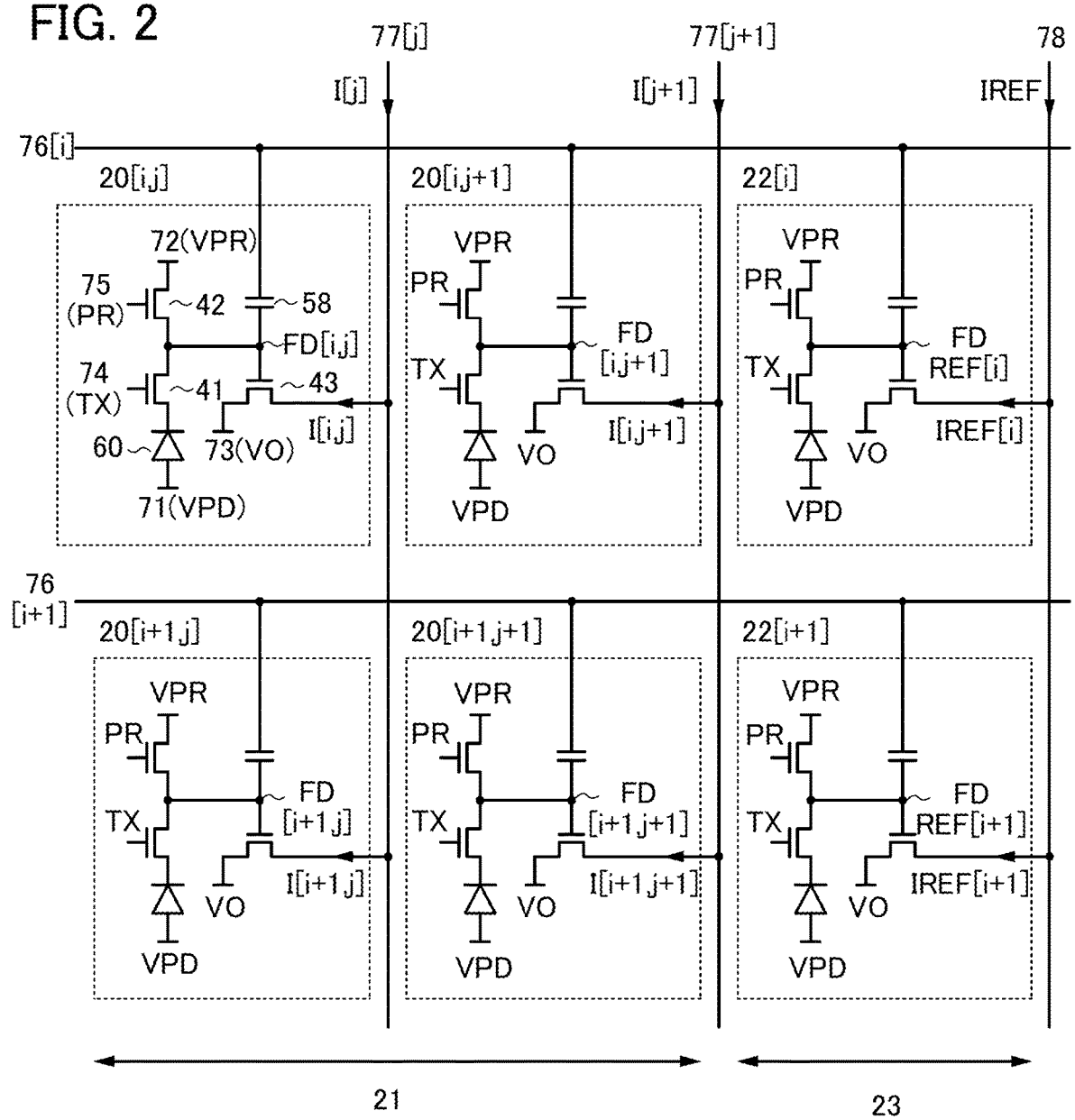
FIG. 2 illustrates a pixel circuit of an imaging device.

FIG. 2 is a circuit diagram illustrating the specific structure of the pixel array 21 and the reference pixel array 23. The circuits of the pixel 20 and the reference pixel 22 each include a photoelectric conversion element 60, a transistor 41, a transistor 42, a transistor 43, and a capacitor 58.

One electrode of the photoelectric conversion element 60 (photodiode) is electrically connected to one of a source electrode and a drain electrode of the transistor 41. The other of the source electrode and the drain electrode of the transistor 41 is electrically connected to one of a source electrode and a drain electrode of the transistor 42. The other of the source electrode and the drain electrode of the transistor 41 is electrically connected to a gate electrode of the transistor 43. The other of the source electrode and the drain electrode of the transistor 41 is electrically connected to one electrode of the capacitor 58.

Here, the other electrode of the photoelectric conversion element 60 is electrically connected to a wiring 71 (VPD). The other of the source electrode and the drain electrode of the transistor 42 is electrically connected to a wiring 72 (VPR). One of a source electrode and a drain electrode of the transistor 43 is electrically connected to a wiring 73 (VO). The wiring 71 (VPD), the wiring 72 (VPR), and the wiring 73 (VO) can function as power supply lines. For example, the wiring 71 (VPD) and the wiring 73 (VO) can function as low power supply potential lines, and the wiring 72 (VPR) can function as a high power supply potential line. A wiring 74 (TX) and a wiring 75 (PR) can function as signal lines for controlling the on/off states of transistors.

The other electrode of the capacitor 58 is electrically connected to a wiring 76. The other of the source electrode and the drain electrode of the transistor 43 is electrically connected to a wiring 77 (a wiring 78 in the case of the reference pixel 22). The wiring 76 can function as a signal line for supplying a given potential to a charge accumulation portion (FD). The wirings 77 and 78 can function as signal lines for supplying signal current based on the potential of the charge accumulation portion (FD) from the transistor 43.

Here, the transistor 41 can function as a transfer transistor for controlling the potential of the charge accumulation portion (FD) in response to output of the photoelectric conversion element 60. The transistor 42 can function as a reset transistor for initializing the potential of the charge accumulation portion (FD). The transistor 43 can function as an amplifying transistor that outputs a signal based on the potential of the charge accumulation portion (FD).

In FIG. 2, the pixel array 21 includes a pixel 20[i,j], a pixel 20[i,j+1], a pixel 20[i+1,j], and a pixel 20[i+1,j+1] in two rows and two columns; however, the pixel array 21 can include the pixels 20 in n rows and m columns (each of n and m is a natural number of 2 or more). In addition, the reference pixel array 23 includes a reference pixel 22[i] and a reference pixel 22[i+1] in two rows and one column; however, the reference pixel array 23 can include the reference pixels 22 in n rows and one column.

Here, when potentials are supplied from the wiring 71 (VPD), the wiring 72 (VPR), and the wiring 73 (VO) and control signals are supplied from the wiring 74 (TX), the wiring 75 (PR), a wiring 76[i], and a wiring 76[i+1], imaging data of the pixel 20 or the reference pixel 22 is output to a wiring 77[j], a wiring 77[j+1], and the wiring 78.

A charge retention portion (FD)[i,j], a charge retention portion (FD)[i,j+1], a charge retention portion (FD)[i+1,j], a charge retention portion (FD)[i+1,j+1], a charge retention portion (FDREF[i]), and a charge retention portion (FDREF [i+1]) accumulate charge corresponding to imaging data. Note that as described above, the reference pixel 22[i] and the reference pixel 22[i+1] are shielded from light so that light does not enter the photoelectric conversion element 60.

Figure 3:
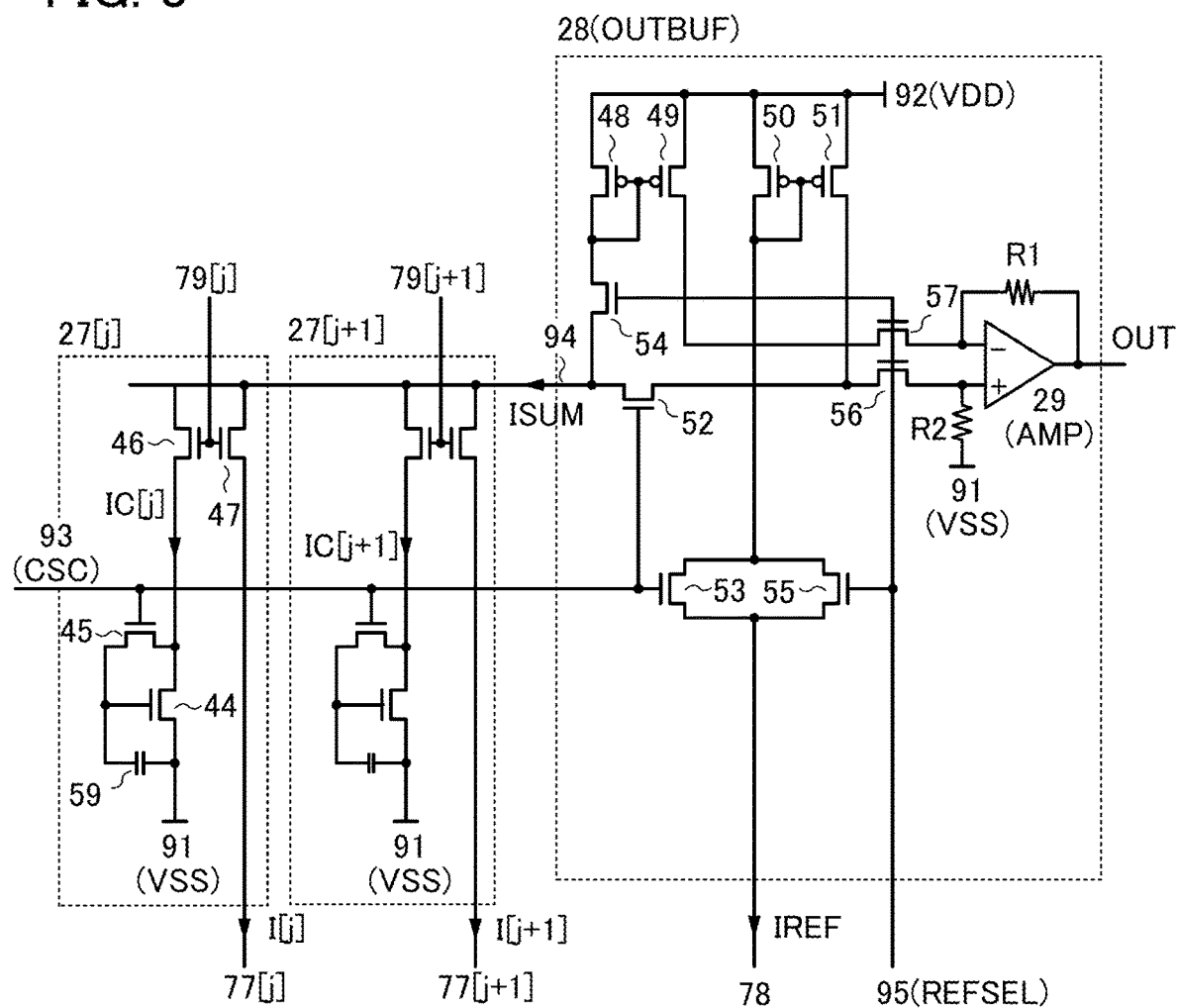
FIG. 3 illustrates an analog processing circuit.

FIG. 3 illustrates a structure example of the analog processing circuit 24 in FIG. 1. The analog processing circuit 24 includes a plurality of offset correction circuits 27. Note that in FIG. 3, two offset correction circuits (an offset correction circuit 27[j] and an offset correction circuit 27[j+1]) that correspond to the number of columns in the pixel array 21 in FIG. 2 are illustrated. The offset correction circuit 27 can include a transistor 44, a transistor 45, a transistor 46, a transistor 47, and a capacitor 59.

One of a source electrode and a drain electrode of the transistor 44 is electrically connected to one of a source electrode and a drain electrode of the transistor 45. The other of the source electrode and the drain electrode of the transistor 44 is electrically connected to one electrode of the capacitor 59. The other of the source electrode and the drain electrode of the transistor 44 is electrically connected to a wiring 91. The other of the source electrode and the drain electrode of the transistor 45 is electrically connected to a gate electrode of the transistor 44. The other of the source electrode and the drain electrode of the transistor 45 is electrically connected to the other electrode of the capacitor 59. A gate electrode of the transistor 45 is electrically connected to a wiring 93 (CSC). Here, the wiring 91 can function as a power supply line, for example, a low power supply potential line. The wiring 93 (CSC) can function as a signal line for controlling the on/off states of the transistor 45 and transistors 52 and 53 to be described later.

One of a source electrode and a drain electrode of the transistor 46 is electrically connected to one of a source electrode and a drain electrode of the transistor 47 to form a current mirror circuit, and gate electrodes of the transistors 46 and 47 are electrically connected to a wiring 79. The other of the source electrode and the drain electrode of the transistor 46 is electrically connected to one of the source electrode and the drain electrode of the transistor 44. The other of the source electrode and the drain electrode of the transistor 47 is electrically connected to the wiring 77. Here, the wiring 79 can function as a signal line for controlling the operation of the current mirror circuit.

Here, when a potential is supplied from the wiring 91 (VSS) and control signals are supplied from the wiring 93 (CSC), a wiring 79[j], and a wiring 79[j+1], current ISUM flows to a wiring 94 in each column.

An output circuit 28 (OUTBUF) in FIG. 3 can include transistors 48 to 57, an operational amplifier 29 (AMP), a resistor R1, and a resistor R2.

One of a source electrode and a drain electrode of the transistor 48 is electrically connected to one of a source electrode and a drain electrode of the transistor 49 to form a current mirror circuit. In the case where the transistors 48 and 49 are p-channel transistors as illustrated in FIG. 3, gate electrodes of the transistors 48 and 49 can be electrically connected to the other of the source electrode and the drain electrode of the transistor 48. The transistor 48 can be referred to as an input transistor, and the transistor 49 can be referred to as an output transistor.

The other of the source electrode and the drain electrode of the transistor 48 can be electrically connected to one of a source electrode and a drain electrode of the transistor 54.

The other of the source electrode and the drain electrode of the transistor 54 can be electrically connected to the wiring 94 and one of a source electrode and a drain electrode of the transistor 52.

The other of the source electrode and the drain electrode of the transistor 49 can be electrically connected to one of a source electrode and a drain electrode of the transistor 57. The other of the source electrode and the drain electrode of the transistor 57 can be electrically connected to a first input terminal (−) of the operational amplifier 29 (AMP). Note that the first input terminal (−) of the operational amplifier 29 (AMP) is electrically connected to an output terminal (OUT) of the operational amplifier 29 (AMP) through the resistor R1.

One of a source electrode and a drain electrode of the transistor 50 is electrically connected to one of a source electrode and a drain electrode of the transistor 51 to form a current mirror circuit. In the case where the transistors 50 and 51 are p-channel transistors as illustrated in FIG. 3, gate electrodes of the transistors 50 and 51 can be electrically connected to the other of the source electrode and the drain electrode of the transistor 50. The transistor 50 can be referred to as an input transistor, and the transistor 51 can be referred to as an output transistor.

The other of the source electrode and the drain electrode of the transistor 50 is electrically connected to one of a source electrode and a drain electrode of the transistor 53 and one of a source electrode and a drain electrode of the transistor 55. The other of the source electrode and the drain electrode of the transistor 53 and the other of the source electrode and the drain electrode of the transistor 55 are electrically connected to the wiring 78.

The other of the source electrode and the drain electrode of the transistor 51 can be electrically connected to the other of the source electrode and the drain electrode of the transistor 52 and one of a source electrode and a drain electrode of the transistor 56. The other of the source electrode and the drain electrode of the transistor 56 can be electrically connected to a second input terminal (+) of the operational amplifier 29 (AMP). Note that the second input terminal (+) of the operational amplifier 29 (AMP) is electrically connected to the wiring 91 through the resistor R2.

Gate electrodes of the transistors 54 to 57 are electrically connected to a wiring 95. The wiring 95 can function as a signal line for controlling the on/off states of the transistors 54 to 57.

When potentials are supplied from the wiring 91 and a wiring 92 and control signals are supplied from the wiring 93 and 95, the current of the offset correction circuit 27 flows to the wiring 94. In addition, the current of the reference pixel flows to the wiring 78, and data is output to the output terminal (OUT) of the operational amplifier 29 (AMP).

Note that the structure of the pixel 20, the reference pixel 22, and the analog processing circuit 24 is just an example, and some circuit, some transistor, some capacitor, some wiring, or the like might not be included. Alternatively, a circuit, a transistor, a capacitor, a wiring, or the like that is not included in the above structure might be included. Alternatively, connection of some wiring might be different from the above connection.

Figure 4:
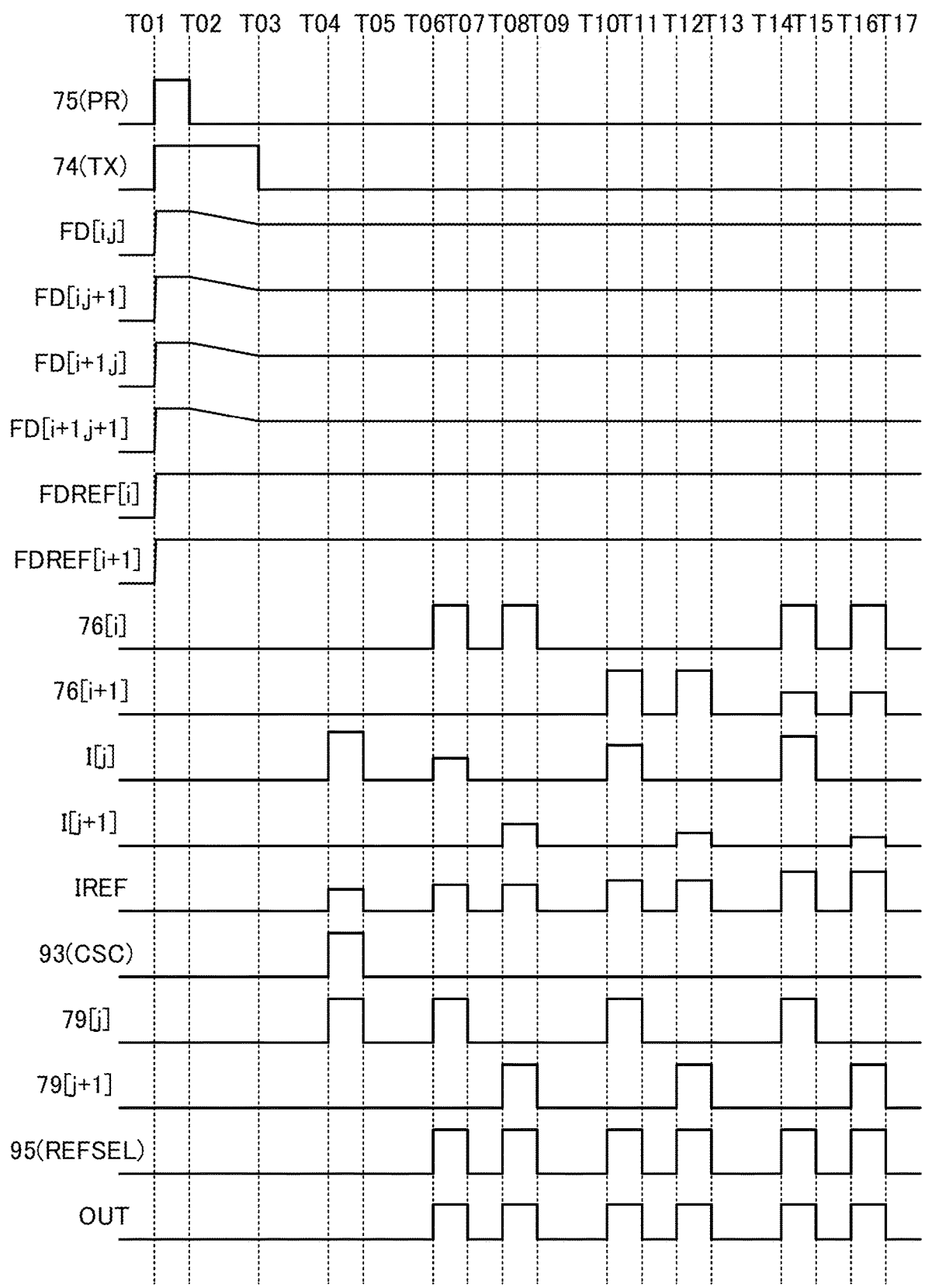
FIG. 4 is a timing chart illustrating operations of imaging and image processing.

Next, an operation example of the imaging device in one embodiment of the present invention is described with reference to a timing chart in FIG. 4. Note that I[j], I[j+1], and IREF in FIG. 4 represent a current signal supplied to the wiring 77[j], a current signal supplied to the wiring 77[j+1], and a current signal supplied to the wiring 78, respectively. The wiring 71 (VPD) has a low potential, the wiring 72 (VPR) has a high potential, the wiring 73 (VO) has a low potential, the wiring 91 (VSS) has a low potential, and the wiring 92 (VDD) has a high potential.

In FIG. 4, operation from time T01 to time T03 corresponds to operation of obtaining imaging data of each pixel 20 and each reference pixel 22. Operation from time T04 to time T05 corresponds to operation of setting correction voltage for the offset correction circuit 27. Operation from time T06 to time T13 corresponds to operation of obtaining output data that corresponds to the imaging data of each pixel 20 and each reference pixel 22. Operation from time T14 to time T17 corresponds to operation of obtaining output data that corresponds to the imaging data of each pixel 20 and each reference pixel 22 subjected to arithmetic processing.

Note that the transistor 43, the transistor 44, and the transistors 48 to 51 operate in a saturation region unless otherwise specified. In other words, gate voltage, source voltage, and drain voltage of the transistors are appropriately biased to voltage so that the transistors operate in the saturation region. Note that even when the operation of the transistors is deviated from operation in an ideal saturation region, the gate voltage, source voltage, and drain voltage of the transistors are regarded as being appropriately biased as long as the accuracy of output data is within a desired range. Note that other transistors, that is, the transistor 41, the transistor 42, the transistors 45 to 47, and the transistors 52 to 57 may each have a switch function for controlling the on/off state.

From the time T01 to the time T02, the potential of the wiring 75 (PR) is set to "H" and the potential of the wiring 74 (TX) is set to "H." At this time, the potentials of a charge retention portion (FD) and a charge retention portion (FDREF) are set to the potential of the wiring 72 (VPR).

From the time T02 to the time T03, the wiring 75 (PR) is set to "L" and the wiring 74 (TX) is set to "H." At this time, the potential of the charge retention portion (FD) is decreased in accordance with light delivered to the photoelectric conversion element 60. Here, if the potential of the wiring 72 is denoted by VPR and the decrease in the potential of the charge retention portion (FD) is denoted by VP, the potential of the charge retention portion (FD) is VPR−VP. Note that as the intensity of light delivered to the photoelectric conversion element 60 becomes higher, the potential of the charge retention portion (FD) becomes lower.

Note that in the reference pixel 22, the photoelectric conversion element 60 is shielded from light; thus, ideally, the potential of the charge retention portion (FDREF) is maintained at VPR. However, actually, dark current flows to the photoelectric conversion element 60; thus, the potential of the charge retention portion (FDREF) is slightly decreased from VPR. Note that the decrease in the potential due to dark current occurs also in the charge retention portion (FD) in the pixel 20. Furthermore, a potential difference between the charge retention portion (FD) in the pixel 20 and the charge retention portion (FDREF) in the reference pixel 22 contributes to output data, so that the decrease in the potential due to dark current is canceled. Consequently, it is not necessary to explicitly consider the decrease in the potential due to dark current.

If the potential of the wiring 76[i] is VW[i], drain current I[i,j] of the transistor 43 in the pixel 20[i,j] is k(VW[i]−Vth+VPR−VP[i,j])$^2$. Drain current Iref[i] of the transistor 43 in the reference pixel 22[i] is k(VW[i]−Vth+VPR)$^2$. Here, k is a coefficient and Vth is the threshold voltage of the transistor 43. Note that the potential of the wiring 76[i] is superimposed on the gate potential of the transistor 43 through the capacitor 58; thus, the change in the potential of the wiring 76[$i$] does not directly increase the gate potential of the transistor 43. Specifically, a potential change obtained by multiplication of a capacitive coupling coefficient that can be calculated from the capacitance of the capacitor 58, the gate capacitance of the transistor 43, and parasitic capacitance by the potential change of the wiring 76[$i$] corresponds to the increase in the gate potential of the transistor 43. Here, for simplicity, a potential obtained by multiplication of the capacitive coupling coefficient is VW[$i$]; however, actually, a potential supplied to the wiring 76[$i$] is converted as appropriate using the capacitive coupling coefficient.

Here, if current I[$j$] flowing to the wiring 77[$j$] is $\Sigma_i \text{I}[i,j]$ and current IREF flowing to the wiring 78 is $\Sigma_i \text{Iref}[i]$, a difference $\Delta \text{I}[j] = \text{IREF} - \text{I}[j] = \Sigma_i \text{Iref}[i] - \Sigma_i \text{I}[i,j] = \Sigma_i (k(\text{VW}[i] - \text{Vth} + \text{VPR})^2 - k(\text{VW}[i] - \text{Vth} + \text{VPR} - \text{VP}[i,j])^2) = 2k\Sigma_i(\text{VW}[i] \cdot \text{VP}[i,j]) - 2k\Sigma_i(\text{Vth} - \text{VPR}) \cdot \text{VP}[i,j] - k\Sigma_i \text{VP}[i,j]^2$.

The first term $2k\Sigma_i(\text{VW}[i] \cdot \text{VP}[i,j])$ corresponds to the sum of products of the potential VW[$i$] of the wiring 76[$i$] in a j-th column and VP[$i,j$] corresponding to the potential change in the charge retention portion (FD[$i,j$]) in the pixel 20[$i,j$]. The first term $2k\Sigma_i(\text{VW}[i] \cdot \text{VP}[i,j])$ can be calculated by subtracting the sum of the second term and the third term $-2k\Sigma_i(\text{Vth} - \text{VPR}) \cdot \text{VP}[i,j] - k\Sigma_i \text{VP}[i,j]^2 = \text{Ioffset}[j]$ from a difference $\Delta \text{I}[j]$ between the current I[$j$] flowing to the wiring 77[$j$] and the current IREF flowing to the wiring 78.

Note that Ioffset[$j$] corresponds to the difference between the current I[$j$] flowing to the wiring 77[$j$] and the current IREF flowing to the wiring 78 when VW[$i$] is 0 V, that is, the potential of the wiring 76[$i$] is 0 V.

From the time T04 to the time T05, the potential of the wiring 93 is set to "H," the potential of the wiring 79[$j$] is set to "H," the potential of the wiring 79[$j$+1] is set to "L," the potential of the wiring 76[$i$] is set to 0 V, and the potential of the wiring 76[$i$+1] is set to 0 V. At this time, the current I[$j$] flows to the wiring 77[$j$], the current IREF flows to the wiring 78, and current IC[$j$] flows to the transistor 44 in the offset correction circuit 27[$j$].

With the use of the current mirror circuit formed using the transistors 50 and 51, the current ISUM flowing through the transistors 51 and 52 is equal to the current IREF flowing through the transistors 50 and 53. Here, the current ISUM is equal to the sum of the current I[$j$] and the current IC[$j$] (ISUM=I[$j$]+IC[$j$]).

A potential for supplying the current IC[$j$]=ISUM−I[$j$] is stored in the capacitor 59. Here, since Ioffset[$j$]=IREF−I[$j$] and IREF=ISUM as described above, the current IC[$j$] is equal to Ioffset[$j$]. Therefore, after the potential of the wiring 93 is set to "L," the transistor 44 in the offset correction circuit 27[$j$] functions as a current source for supplying Ioffset[$j$] owing to the potential held in the capacitor 59.

Similarly, if the potential of the wiring 93 is set to "H," the potential of the wiring 79[$j$] is set to "L," the potential of the wiring 79[$j$+1] is set to "H," the potential of the wiring 76[$i$] is set to 0 V, and the wiring 76[$i$+1] is set to 0 V, after the potential of the wiring 93 is set to "L," the transistor 44 in the offset correction circuit 27[$j$+1] functions as a current source for supplying Ioffset[$j$+1] owing to the potential held in the capacitor 59.

From the time T06 to the time T07, the potential of the wiring 76[$i$] is set to VW[$i$], the potential of the wiring 76[$i$+1] is set to 0 V, the potential of the wiring 79[$j$] is set to "H," the potential of the wiring 79[$j$+1] is set to "L," and the potential of the wiring 95 (REFSEL) is set to "H." At this time, the current ISUM is the sum of the current I[$j$] and the current IC[$j$]=Ioffset[$j$], which flows to the transistor 48 through the transistor 54.

The current ISUM is equal to current flowing through the transistors 49 and 57 owing to the current mirror circuit formed using the transistors 48 and 49.

The current IREF flows to the transistor 50 through the transistor 55. The current IREF is equal to current flowing through the transistors 51 and 56 owing to the current mirror circuit formed using the transistors 50 and 51.

Here, if both the resistance of the resistor R1 and the resistance of the resistor R2 are R, the output of the operational amplifier 29 (AMP) is in proportion to IREF−ISUM, where IREF−ISUM=IREF−I[$j$]−Ioffset[$j$]=$2k\Sigma(\text{VW}[i] \cdot \text{VP}[i,j])=2k \cdot \text{VW}[i] \cdot \text{VP}[i,j]$ because $\Delta \text{I}[j]=\text{IREF}-\text{I}[j]=2k\Sigma(\text{VW}[i] \cdot \text{VP}[i,j])+\text{Ioffset}[j]$ and ISUM=I[$j$]+IC[$j$], IC[$j$]=Ioffset[$j$]. In other words, output that is in proportion to the imaging data of the pixel 20[$i,j$] is obtained. That is, appropriate normalization can produce the imaging data of the pixel 20[$i,j$].

Similarly, from the time T08 to the time T09, if the potential of the wiring 76[$i$] is set to VW[$i$], the potential of the wiring 76[$i$+1] is set to 0 V, the potential of the wiring 79[$j$] is set to "L," the potential of the wiring 79[$j$+1] is set to "H," and the potential of the wiring 95 (REFSEL) is set to "H," the imaging data of the pixel 20[$i,j$+1] can be obtained.

Similarly, from the time T10 to the time T11, if the potential of the wiring 76[$i$] is set to 0 V, the potential of the wiring 76[$i$+1] is set to VW[$i$+1], the potential of the wiring 79[$j$] is set to "H," the potential of the wiring 79[$j$+1] is set to "L," and the potential of the wiring 95 (REFSEL) is set to "H," the imaging data of the pixel 20[$i$+1,$j$] can be obtained.

Similarly, from the time T12 to the time T13, if the potential of the wiring 76[$i$] is set to 0 V, the potential of the wiring 76[$i$+1] is set to VW[$i$+1], the potential of the wiring 79[$j$] is set to "L," the potential of the wiring 79[$j$+1] is set to "H," and the potential of the wiring 95 (REFSEL) is set to "H," the imaging data of the pixel 20[$i$+1,$j$+1] can be obtained.

From the time T14 to the time T15, the potential of the wiring 76[$i$] is set to VW[$i$], the potential of the wiring 76[$i$+1] is set to VW[$i$+1], the potential of the wiring 79[$j$] is set to "H," the potential of the wiring 79[$j$+1] is set to "L," and the potential of the wiring 95 (REFSEL) is set to "H." At this time, the current ISUM is the sum of the current I[$j$] and the current IC[$j$]=Ioffset[$j$], which flows to the transistor 48 through the transistor 54.

Here, the current ISUM is equal to current flowing through the transistors 49 and 57 owing to the current mirror circuit formed using the transistors 48 and 49.

The current IREF flows to the transistor 50 through the transistor 55. The current IREF is equal to current flowing through the transistors 51 and 56 owing to the current mirror circuit formed using the transistors 50 and 51.

Here, if both the resistance of the resistor R1 and the resistance of the resistor R2 are R, the output of the operational amplifier 29 (AMP) is in proportion to IREF−ISUM and is $2k\Sigma(\text{VW}[i] \cdot \text{VP}[i,j])=2k \cdot (\text{VW}[i] \cdot \text{VP}[i,j]+\text{VW}[i+1] \cdot \text{VP}[i+1,j])$ in consideration of the description of a period from the time T06 to the time T07.

In other words, output that is in proportion to a value obtained by weighting of the imaging data of the pixel 20[$i,j$] and image data of the pixel 20[$i$+1,$j$] with VW[$i$]:VW[$i$+1] is obtained. That is, data subjected to image processing can be obtained. For example, if VW[$i$−1]:VW[$i$]:VW[$i$+1]=−1/

2:0:+1/2, the gradient of luminance of an image can be obtained from the formula of a centered difference, that is, edge detection can be performed.

Similarly, from the time T16 to the time T17, if the potential of the wiring 76[i] is set to VW[i], the potential of the wiring 76[i+1] is set to VW[i+1], the potential of the wiring 79[j] is set to "L," the potential of the wiring 79[j+1] is set to "H," and the potential of the wiring 95 (REFSEL) is set to "H," output that is in proportion to a value obtained by weighting of the imaging data of the pixel 20[i,j+1] and image data of the pixel 20[i+1,j+1] with VW[i]:VW[i+1] is obtained. That is, data subjected to image processing can be obtained.

With the above structure, a captured image can be obtained without performing digital arithmetic processing or the like by an A/D converter or an image processing circuit for image processing. Alternatively, image data subjected to image processing can be obtained. Thus, the power consumption of the imaging device can be reduced.

Figure 13A:
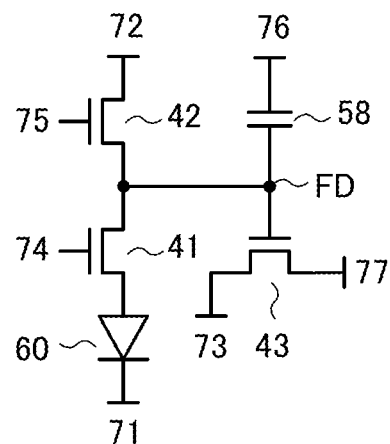
FIGS. 13A to 13F each illustrate a pixel circuit.
Figure 13B:
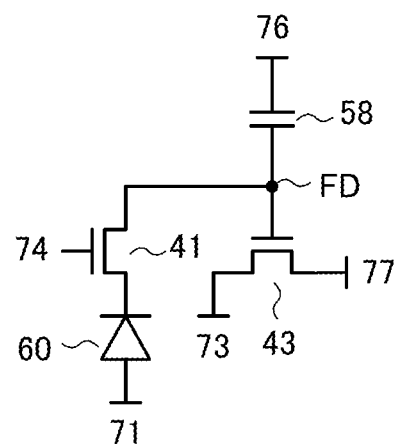
Figure 13C:
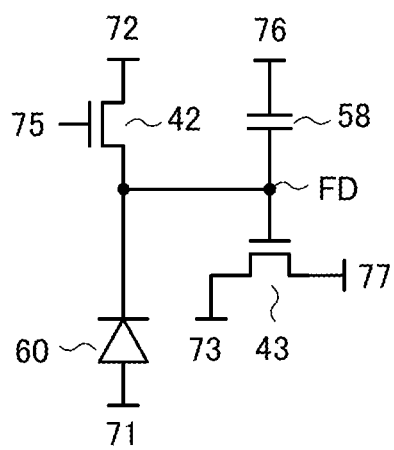
Figure 13D:
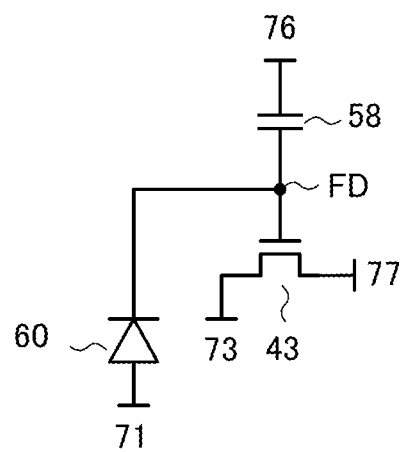
Figure 13E:
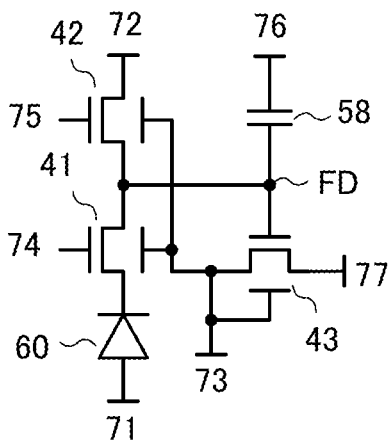
Figure 13F:
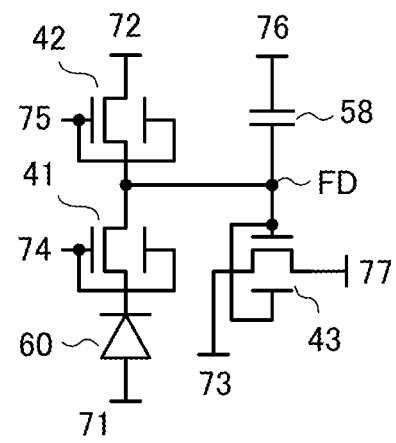

Note that the structures of the circuits of the pixel 20 and the reference pixel 22 are not limited to the structures in FIG. 2, and structures in FIGS. 13A to 13D may be used. The transistors 41, 42, and 43 in the pixel circuit may each include a back gate as illustrated in FIGS. 13E and 13F. FIG. 13E illustrates a structure in which a constant potential is applied to the back gates, which enables control of the threshold voltage. FIG. 13F illustrates a structure in which the back gates are supplied with the same potential as front gates, which enables an increase in on-state current. Although the back gates are electrically connected to the wiring 73 in FIG. 13E, the back gates may be electrically connected to a different wiring to which a constant potential is applied. Although FIGS. 13E and 13F each illustrate an example in which back gates are provided in the transistors of the pixel circuit in FIG. 2, the circuits in FIGS. 13A to 13D may have similar structures. Moreover, a structure in which the same potential is applied to a front gate and a back gate, a structure in which a constant potential is applied to a back gate, and a structure without a back gate may be optionally combined as necessary for the transistors included in one pixel circuit.

Figure 23A:
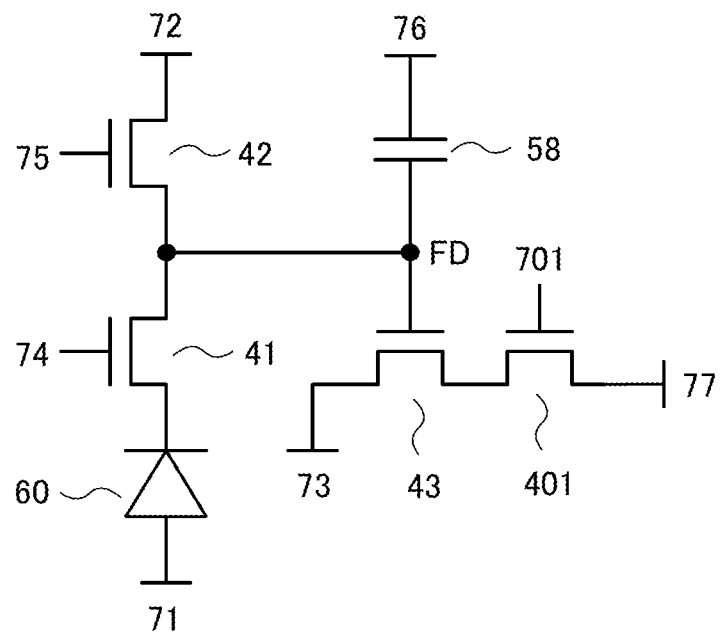
FIGS. 23A and 23B each illustrate a pixel circuit of an imaging device.
Figure 23B:
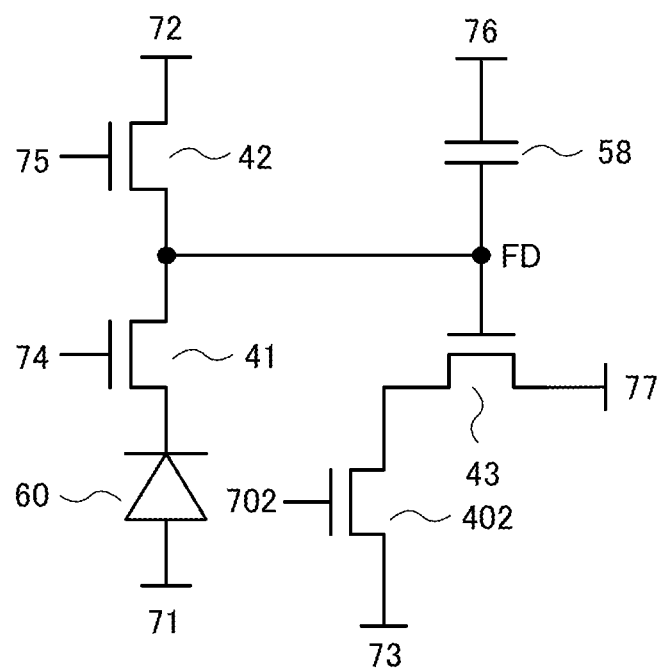

As illustrated in FIG. 23A, a transistor 401 may be provided between the transistor 43 and the wiring 77. The transistor 401 functions as a switching transistor whose on/off state is controlled by the potential of a wiring 701. As illustrated in FIG. 23B, a transistor 402 may be provided between the transistor 43 and the wiring 73. The transistor 402 functions as a switching transistor whose on/off state is controlled by the potential of a wiring 702.

Figure 24:
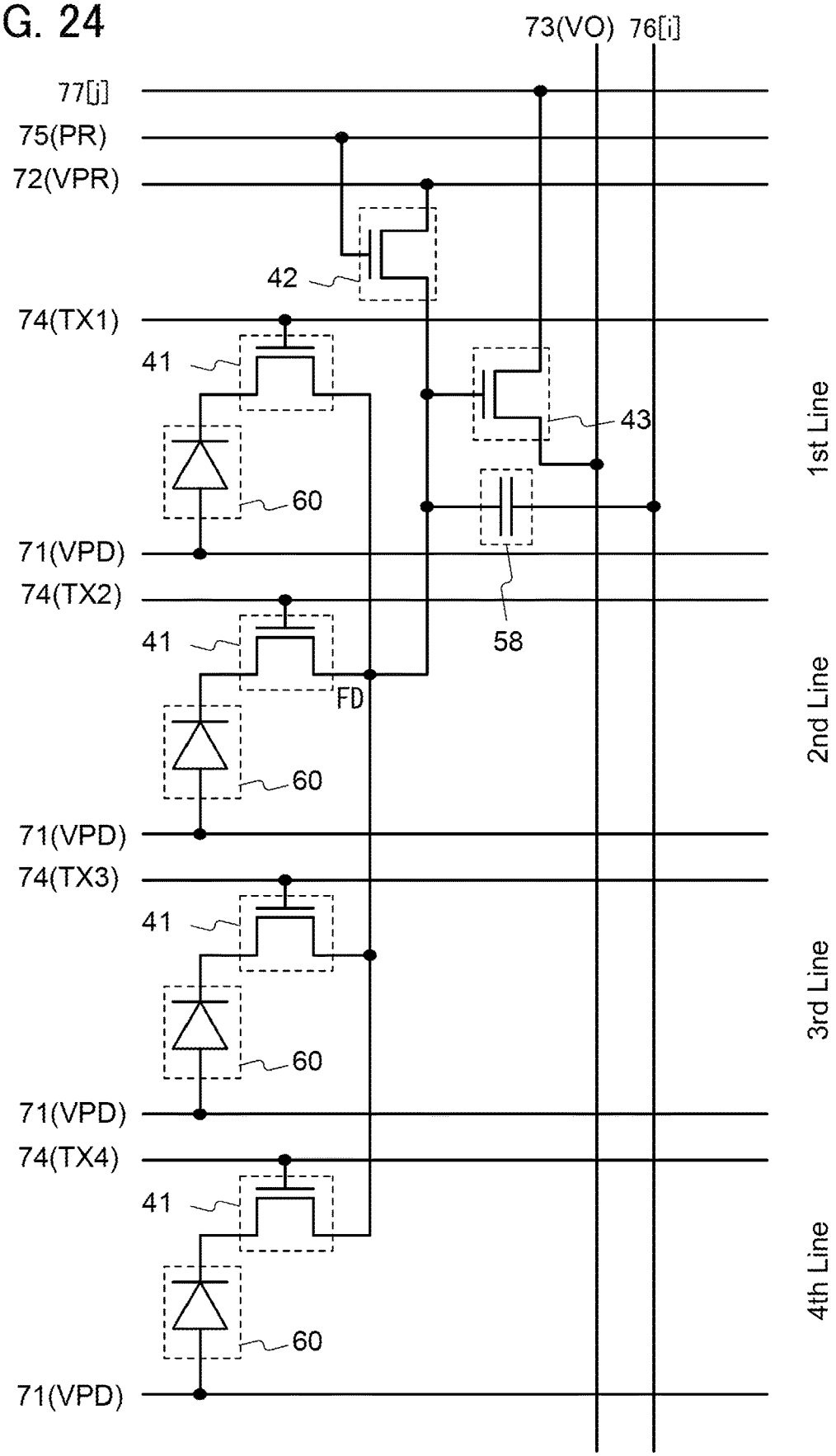
FIG. 24 illustrates a pixel circuit of an imaging device.

Note that the circuits of the pixel 20 and the reference pixel 22 may have a structure in which the transistors 42 and 43 are shared among a plurality of pixels as illustrated in FIG. 24. FIG. 24 illustrates a structure in which the transistors 42 and 43 are shared among a plurality of pixels in a perpendicular direction; however, the transistors 42 and 43 may be shared among a plurality of pixels in a horizontal direction or in a horizontal and perpendicular direction. Such a structure can reduce the number of transistors included in one pixel. Although FIG. 24 illustrates a structure in which the transistors 42 and 43 are shared among four pixels, the transistors 42 and 43 may be shared among two pixels, three pixels, or five or more pixels. Note that the structure can be optionally combined with any of the structures in FIGS. 13A to 13D and the structures in FIGS. 23A and 23B.

Figure 5A:
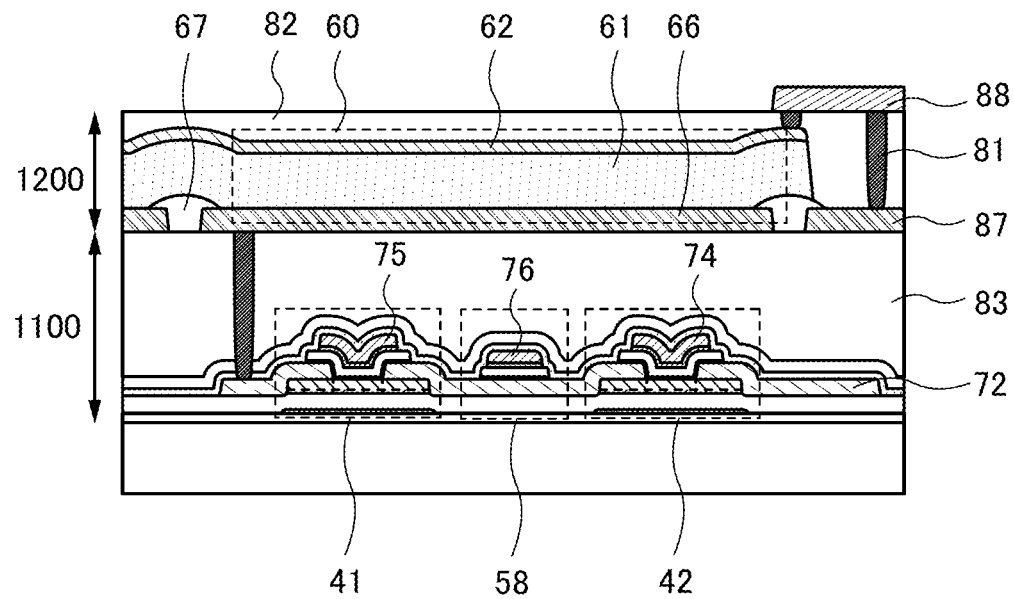
FIGS. 5A to 5C are cross-sectional views each illustrating the structure of an imaging device.

Specific structure examples of the imaging device in one embodiment of the present invention are described below with reference to drawings. FIG. 5A is an example of a cross-sectional view of the imaging device in one embodiment of the present invention and illustrates an example of specific connection between the photoelectric conversion element 60, the transistor 41, the transistor 42, and the capacitor 58 which are included in the pixel 20 in FIG. 2. Note that FIG. 5A does not illustrate the transistor 43. The imaging device includes a layer 1100 including the transistors 41 to 43 and the capacitor 58 and a layer 1200 including the photoelectric conversion element 60.

Although the wirings, the electrodes, and conductors 81 are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor 81 is only an example, and the gate electrode, the source electrode, and the drain electrode of the transistor might each function as a wiring.

In addition, insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

It is particularly preferable to use oxide semiconductor transistors (hereinafter referred to as OS transistors) as the transistors 41 to 43.

Extremely low off-state current of the OS transistor can widen the dynamic range of imaging. In the circuit structure of the pixel 20 illustrated in FIG. 2, an increase in the intensity of light entering the photoelectric conversion element 60 reduces the potential of the charge accumulation portion (FD). Since the OS transistor has extremely low off-state current, current based on a gate potential can be accurately output even when the gate potential is extremely low. Thus, it is possible to widen the detection range of illuminance, i.e., the dynamic range.

A period during which charge can be held in the charge accumulation portion (FD) can be extremely long owing to the low off-state current of the transistors 41 and 42. Therefore, a global shutter system in which accumulation operation is performed in all the pixels at the same time can be used without a complicated circuit structure and operation method. Consequently, an image with little distortion can be easily obtained even in the case of a moving object.

Figure 14A:
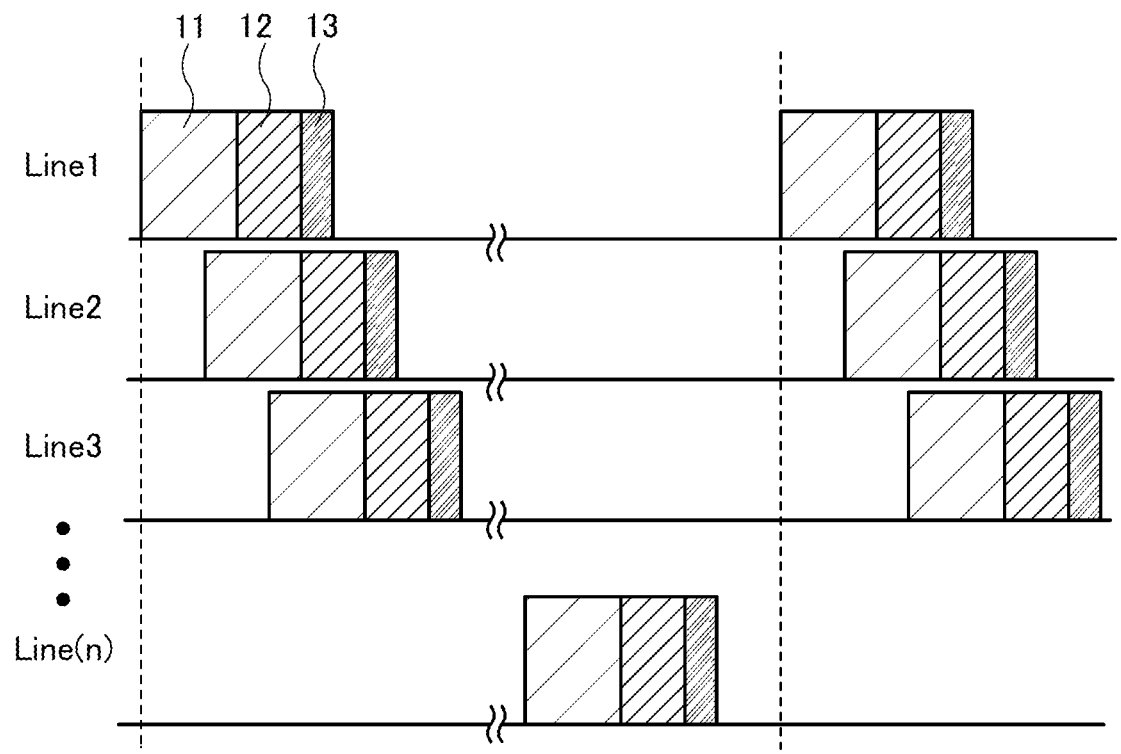
FIGS. 14A and 14B are timing charts illustrating operations of a global shutter system and a rolling shutter system, respectively.

In general, in an imaging device where pixels are arranged in a matrix as illustrated in FIG. 1, a rolling shutter system is employed in which imaging operation 11, retention operation 12, and read operation 13 are performed row by row as illustrated in FIG. 14A. In the case of employing the rolling shutter system, simultaneousness of imaging is lost. Therefore, when an object moves, an image is distorted.

Figure 14B:
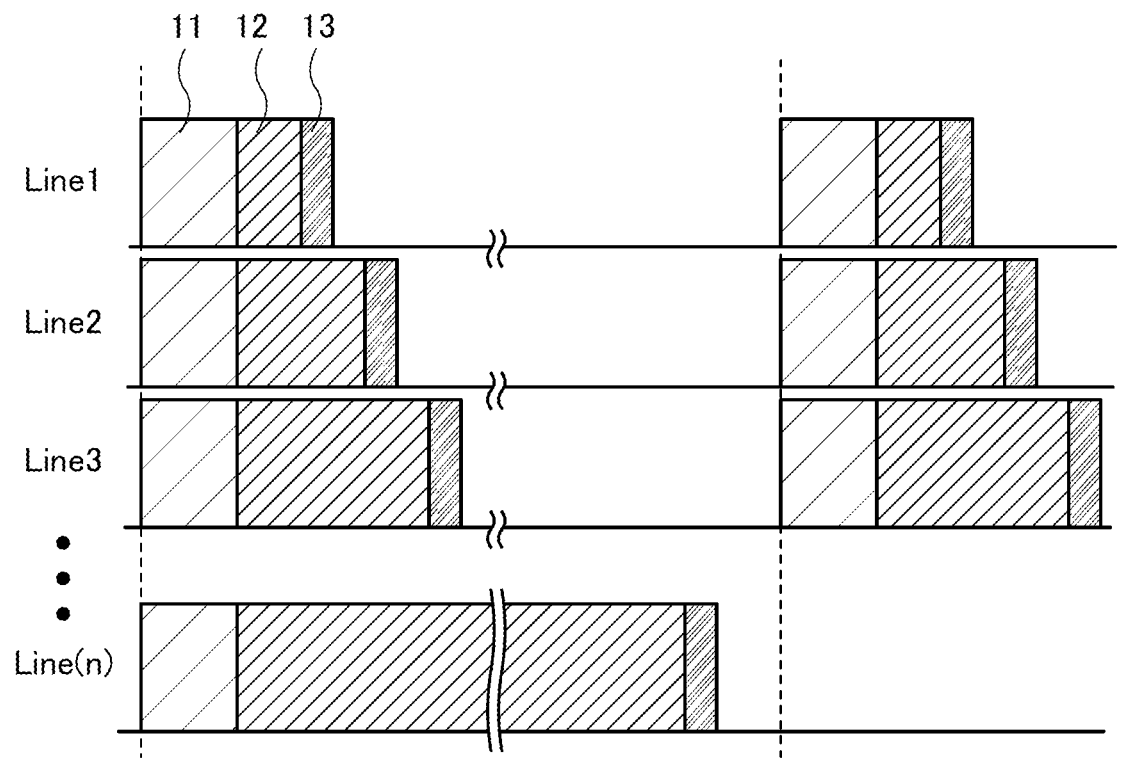

As a result, in one embodiment of the present invention, it is preferable to employ a global shutter system in which the imaging operation 11 and the retention operation 12 can be performed simultaneously in all the rows and the read operation 13 can be performed row by row as illustrated in FIG. 14B. By employing the global shutter system, simultaneousness of imaging in all the pixels in the imaging device can be secured, and an image with little distortion can be easily formed even when an object moves. Furthermore, exposure time (a period of performing charge accumulation operation) can be long in a global shutter system; thus, the imaging device is suitable for imaging even in a low illuminance environment.

In addition, the OS transistor has lower temperature dependence of change in electrical characteristics than a transistor including silicon in an active region or an active layer (hereinafter referred to as a Si transistor), and thus can be used in an extremely wide range of temperatures. Therefore, an imaging device and a semiconductor device that include the OS transistors are suitable for automobiles, aircrafts, and spacecrafts.

Moreover, the OS transistor has higher drain breakdown voltage than the Si transistor. In a photoelectric conversion element in which a selenium-based material is used for a photoelectric conversion layer, comparatively high voltage (e.g., 10 V or higher) is preferably applied to cause an avalanche phenomenon easily. Therefore, by combination of the OS transistor and the photoelectric conversion element in which the selenium-based material is used for the photoelectric conversion layer, a highly reliable imaging device can be obtained.

Figure 5B:
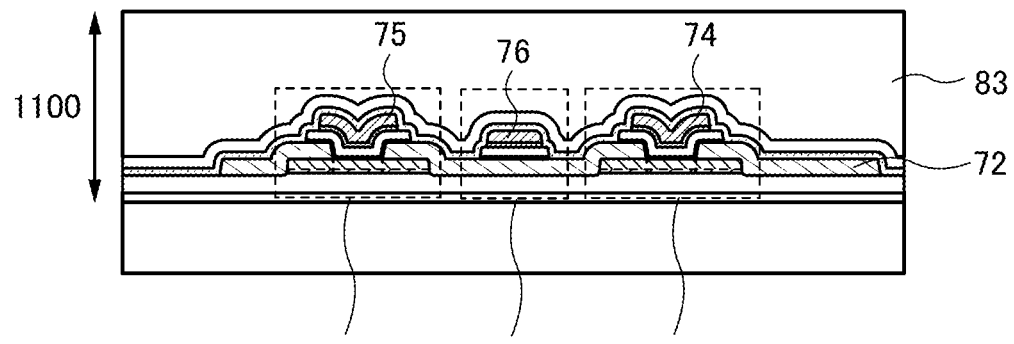
Figure 5C:
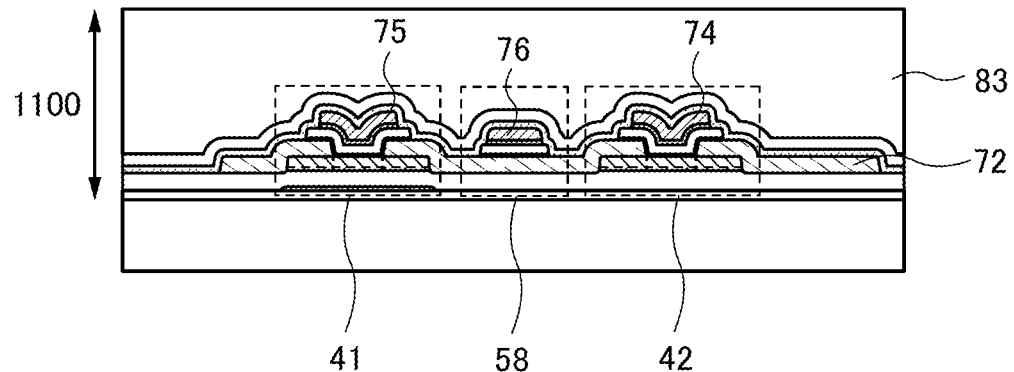

Note that although each transistor includes a back gate in FIG. 5A, as illustrated in FIG. 5B, each transistor does not necessarily include a back gate. Alternatively, as illustrated in FIG. 5C, one or more transistors, for example, only the transistor 41 may include a back gate. The back gate might be electrically connected to a front gate of an opposite transistor. Alternatively, different fixed potentials might be supplied to the back gate and the front gate. Note that the presence or absence of the back gate can also be applied to another imaging device described in this embodiment.

A variety of elements can be used as the photoelectric conversion element 60 provided in the layer 1200. FIG. 5A illustrates the photoelectric conversion element 60 including a selenium-based material for a photoelectric conversion layer 61. The photoelectric conversion element 60 including a selenium-based material has high external quantum efficiency with respect to visible light. In the photoelectric conversion element, a highly sensitive sensor in which the amount of amplification of electrons with respect to the amount of incident light by an avalanche phenomenon is large can be obtained. Furthermore, the selenium-based material has a high light absorption coefficient, which leads to an advantage that the photoelectric conversion layer 61 is easily formed to be thin.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than those of amorphous selenium.

Although the photoelectric conversion layer 61 is a single layer, a structure can be employed in which gallium oxide, cerium oxide, or the like is used on a light-receiving surface side of a selenium-based material for a layer for preventing hole injection and nickel oxide, antimony sulfide, or the like is used for a layer for preventing electron injection.

Furthermore, the photoelectric conversion layer 61 may be a layer including a compound of copper, indium, and selenium (CIS). Alternatively, a layer including a compound of copper, indium, gallium, and selenium (CIGS) may be used. With the CIS layer or the CIGS layer, a photoelectric conversion element that can utilize an avalanche phenomenon in a manner similar to that of a single layer of selenium can be formed.

In the photoelectric conversion element 60 including a selenium-based material, for example, the photoelectric conversion layer 61 can be provided between a light-transmitting conductive layer 62 and the electrode 66 formed using a metal material or the like. CIS and CIGS are p-type semiconductors and may be formed in contact with an n-type semiconductor such as cadmium sulfide or zinc sulfide to form a junction.

Comparatively high voltage (e.g., 10 V or higher) is preferably applied to the photoelectric conversion element to cause the avalanche phenomenon. Since the OS transistor has higher drain breakdown voltage than the Si transistor, comparatively high voltage can be easily applied to the photoelectric conversion element. Therefore, by combination of the OS transistor with high drain breakdown voltage and the photoelectric conversion element in which the selenium-based material is used for the photoelectric conversion layer, a highly sensitive, highly reliable imaging device can be obtained.

Figure 6A:
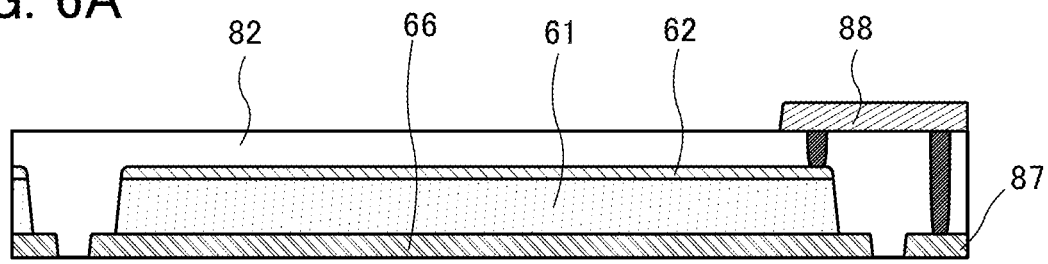
FIGS. 6A to 6D are cross-sectional views each illustrating connection of a photoelectric conversion element.
Figure 6B:
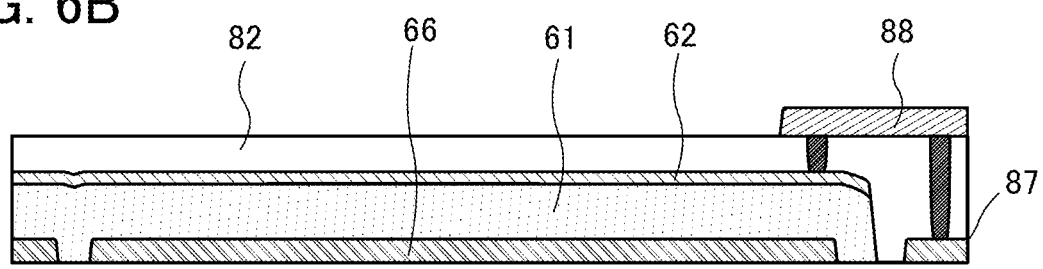
Figure 6C:
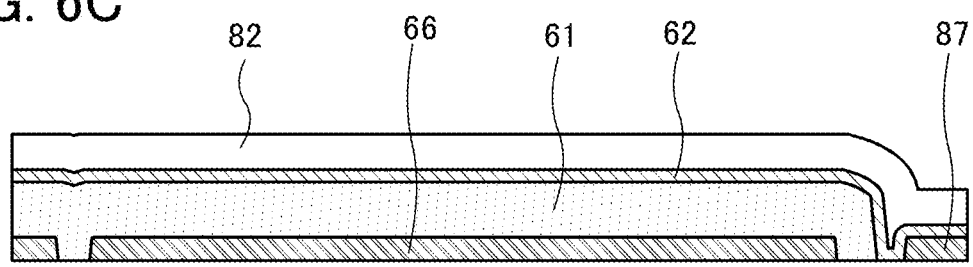
Figure 6D:
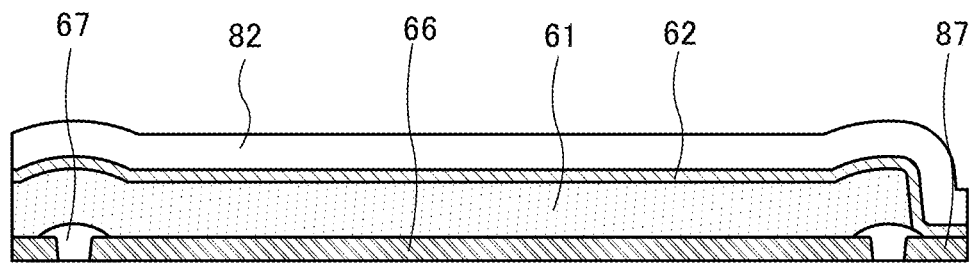

Although the photoelectric conversion layer 61 and the light-transmitting conductive layer 62 are not divided between pixel circuits in FIG. 5A, the photoelectric conversion layer 61 and the light-transmitting conductive layer 62 may be divided between circuits as illustrated in FIG. 6A. Furthermore, a partition wall 67 formed using an insulator is preferably provided in a region between pixels where the electrode 66 is not provided so as not to generate a crack in the photoelectric conversion layer 61 and the light-transmitting conductive layer 62; however, the partition wall 67 is not necessarily provided as illustrated in FIG. 6B. Although the light-transmitting conductive layer 62 and a wiring 87 are connected to each other through a wiring 88 and the conductor 81 in FIG. 5A, the light-transmitting conductive layer 62 and the wiring 87 may be in direct contact with each other as in FIGS. 6C and 6D.

Figure 7A:
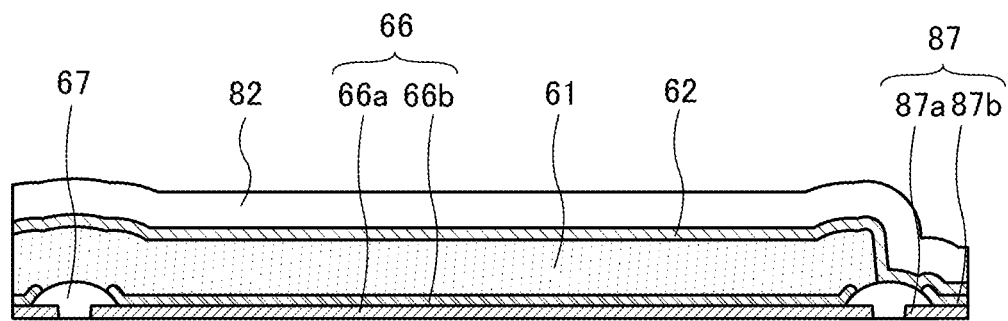
FIGS. 7A and 7B are cross-sectional views each illustrating connection of a photoelectric conversion element.

The electrode 66, the wiring 87, and the like may each be a multilayer. For example, as illustrated in FIG. 7A, the electrode 66 can include two conductive layers 66a and 66b and the wiring 87 can include two conductive layers 87a and 87b. In the structure of FIG. 7A, for example, the conductive layers 66a and 87a may be made of a low-resistance metal or the like, and the conductive layers 66b and 87b may be made of a metal or the like that exhibits an excellent contact property with the photoelectric conversion layer 61. Such a structure improves the electrical properties of the photoelectric conversion element. Furthermore, even when the conductive layer 87a contains a metal that causes electrolytic corrosion, which occurs when some kinds of metal are in contact with the light-transmitting conductive layer 62, electrolytic corrosion can be prevented because the conductive layer 87b is placed between the conductive layer 87a and the light-transmitting conductive layer 62.

The conductive layers 66b and 87b can be formed using, for example, molybdenum, tungsten, or the like. The conductive layers 66a and 87a can be formed using, for example, aluminum, titanium, or a stack of titanium, aluminum, and titanium that are layered in that order.

Figure 7B:
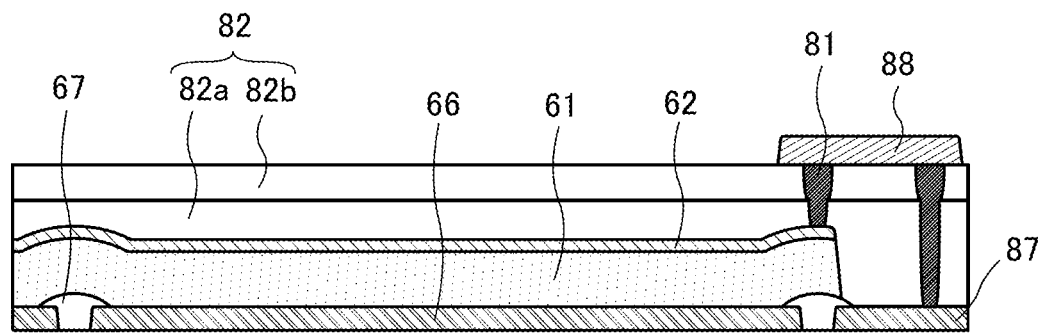

The insulating layer 82 and the like may each be a multilayer. For example, as illustrated in FIG. 7B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

Note that the partition wall 67 can be formed using an inorganic insulator, an insulating organic resin, or the like. The partition wall 67 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 60.

Figure 8:
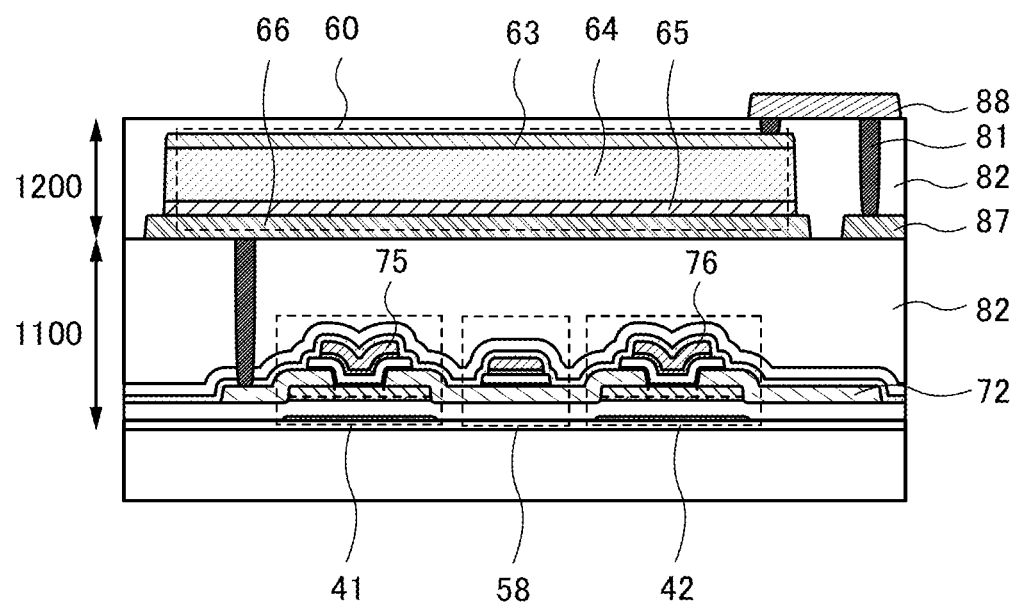
FIG. 8 is a cross-sectional view illustrating an imaging device.

FIG. 8 illustrates an example in which a thin film PIN photodiode is used as the photoelectric conversion element 60. In the photodiode, an n-type semiconductor layer 65, an i-type semiconductor layer 64, and a p-type semiconductor layer 63 are stacked in that order. The i-type semiconductor layer 64 is preferably formed using amorphous silicon. The p-type semiconductor layer 63 and the n-type semiconductor layer 65 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 60 in FIG. 8, the n-type semiconductor layer 65 functioning as a cathode is electrically connected to the electrode 66 that is electrically connected to the transistor 51. Furthermore, the p-type semiconductor layer 63 functioning as an anode is electrically connected to the wiring 87 through the conductor 81.

Note that as to the connection of the photoelectric conversion element 60 with wirings or the like, what the anode is connected to and what the cathode is connected to in the circuit diagram illustrating the pixel 20 in FIG. 2 might be reversed.

In any case, the photoelectric conversion element 60 is preferably formed so that the p-type semiconductor layer 63 serves as a light-receiving surface. When the p-type semiconductor layer 63 serves as a light-receiving surface, the output current of the photoelectric conversion element 60 can be increased.

Furthermore, any of examples illustrated in FIGS. 9A to 9F may be applied to the structure of the photoelectric conversion element 60 having a configuration of a PIN thin film photodiode and the connection between the photoelectric conversion element 60 and the wirings. Note that the structure of the photoelectric conversion element 60 and the connection between the photoelectric conversion element 60 and the wirings are not limited thereto, and other configurations may be applied.

Figure 9A:
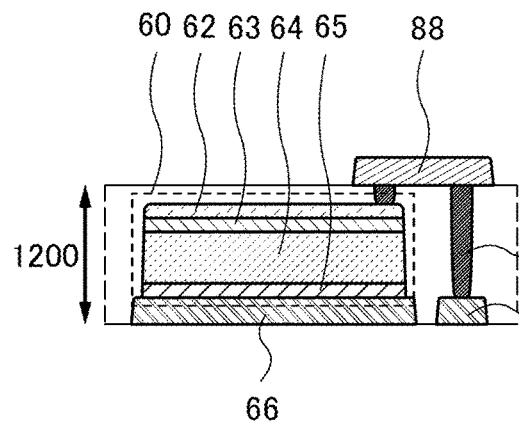
FIGS. 9A to 9F are cross-sectional views each illustrating connection of a photoelectric conversion element.

FIG. 9A illustrates a structure provided with the light-transmitting conductive layer 62 in contact with the p-type semiconductor layer 63 of the photoelectric conversion element 60. The light-transmitting conductive layer 62 functions as an electrode and can increase the output current of the photoelectric conversion element 60.

For the light-transmitting conductive layer 62, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 62 is not limited to a single layer, and may be a stacked layer of different films.

Figure 9B:
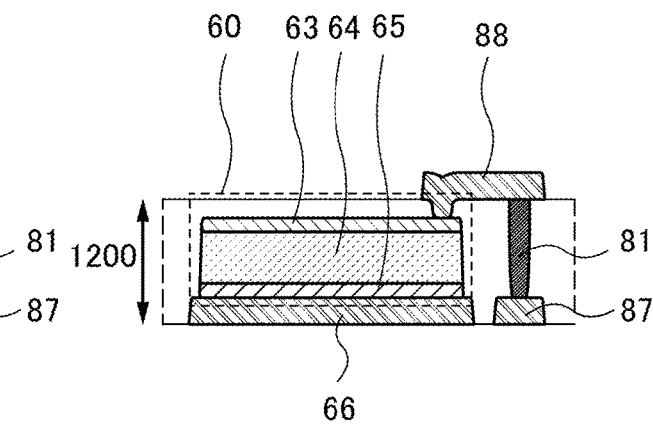

FIG. 9B illustrates a structure in which the p-type semiconductor layer 63 of the photoelectric conversion element 60 is directly connected to the wiring 88.

Figure 9C:
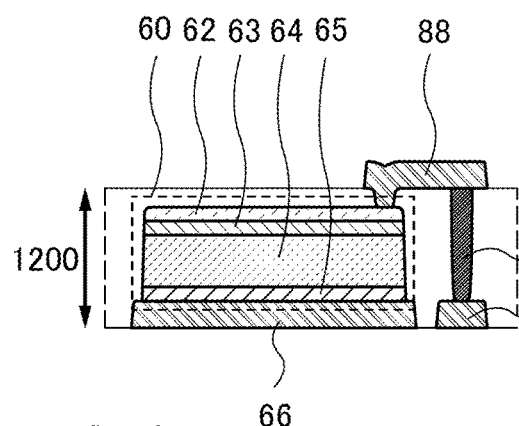

FIG. 9C illustrates a structure in which the light-transmitting conductive layer 62 in contact with the p-type semiconductor layer 63 of the photoelectric conversion element 60 is provided, and the wiring 88 is electrically connected to the light-transmitting conductive layer 62.

Figure 9D:
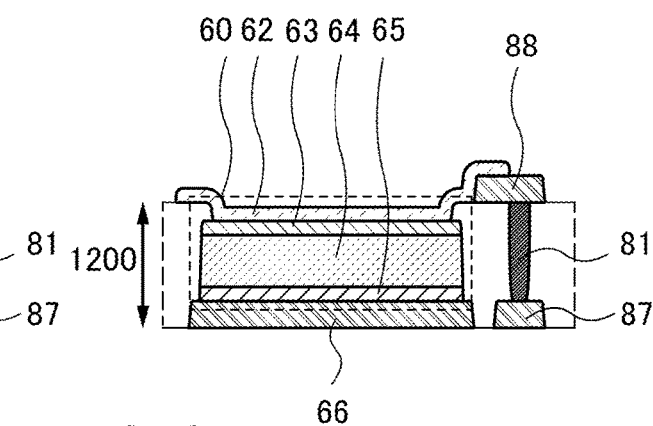

FIG. 9D illustrates a structure in which an opening portion exposing the p-type semiconductor layer 63 is provided in an insulating layer covering the photoelectric conversion element 60, and the light-transmitting conductive layer 62 that covers the opening portion is electrically connected to the wiring 88.

Figure 9E:
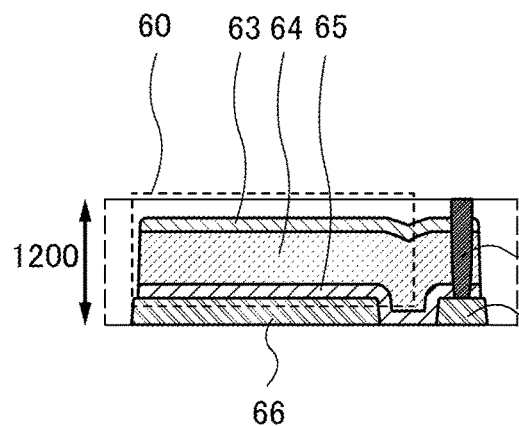

FIG. 9E illustrates a structure provided with the conductor 81 that penetrates the photoelectric conversion element 60. In the structure, the wiring 87 is electrically connected to the p-type semiconductor layer 63 through the conductor 81. Note that in the drawing, the wiring 87 appears to be electrically connected to the electrode 66 through the n-type semiconductor layer 65. However, resistance in the lateral direction of the n-type semiconductor layer 65 is high; therefore, when an appropriate distance is provided between the wiring 87 and the electrode 66, the resistance between the wiring 87 and the electrode 66 is extremely high. Thus, the photoelectric conversion element 60 can have diode characteristics without a short circuit between the anode and the cathode. Note that two or more conductors 81 that are electrically connected to the p-type semiconductor layer 63 may be provided.

Figure 9F:
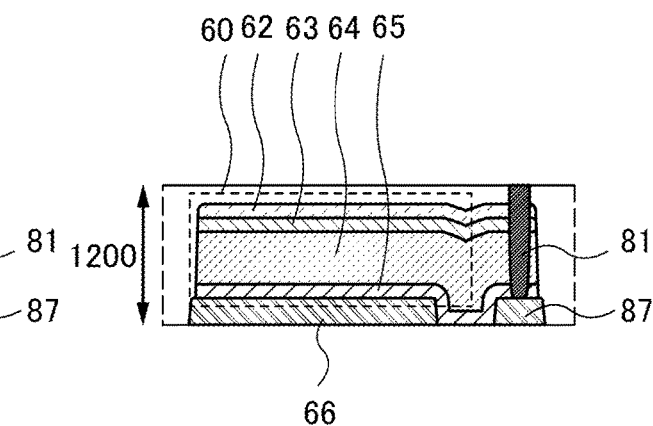

FIG. 9F illustrates a structure in which the photoelectric conversion element 60 in FIG. 9E is provided with the light-transmitting conductive layer 62 in contact with the p-type semiconductor layer 63.

Note that each of the photoelectric conversion elements 60 in FIGS. 9D to 9F has an advantage of having a large light-receiving area because wirings and the like do not overlap with a light-receiving region.

Figure 10:
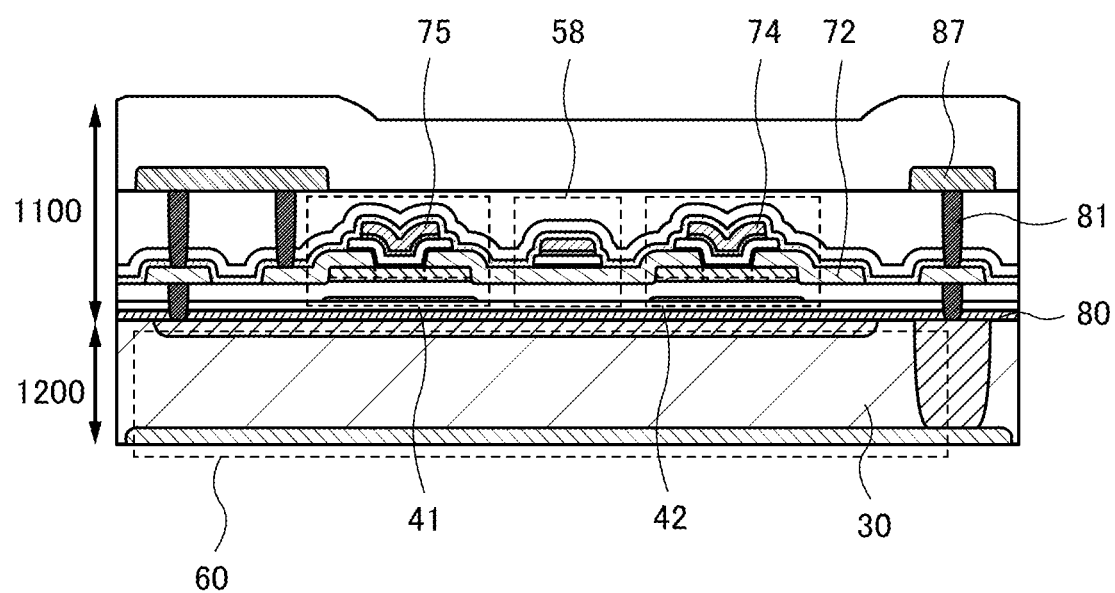
FIG. 10 is a cross-sectional view illustrating an imaging device.

Alternatively, as illustrated in FIG. 10, the photoelectric conversion element 60 can be a photodiode including a silicon substrate 30 as a photoelectric conversion layer.

The photoelectric conversion element 60 formed using the selenium-based material, amorphous silicon, or the like can be formed through general semiconductor manufacturing processes such as a deposition process, a lithography process, and an etching process. Furthermore, the resistance of the selenium-based material is high; thus, a structure in which the photoelectric conversion layer 61 is not divided between the circuits can be employed as illustrated in FIG. 5A. Therefore, the imaging device in one embodiment of the present invention can be manufactured with a high yield at low cost. Meanwhile, to form a photodiode including the silicon substrate 30 as the photoelectric conversion layer, processes with high difficulty, such as a polishing process and a bonding process, are needed.

Figure 11A:
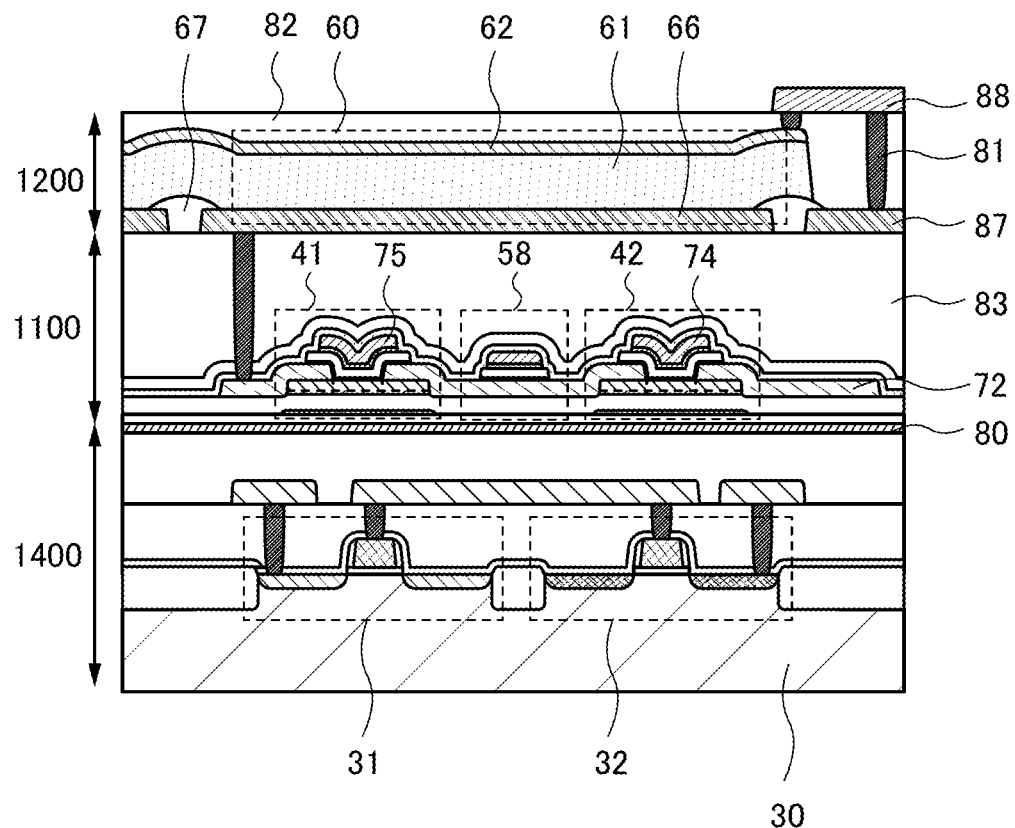
FIGS. 11A to 11C are cross-sectional views and a circuit diagram illustrating an imaging device.

Furthermore, the imaging device in one embodiment of the present invention may be stacked over the silicon substrate 30 including circuits. For example, as illustrated in FIGS. 11A and 11B, the pixel circuit may overlap with a layer 1400 that includes transistors 31 and 32 whose active regions are formed in the silicon substrate 30.

Figure 11B:
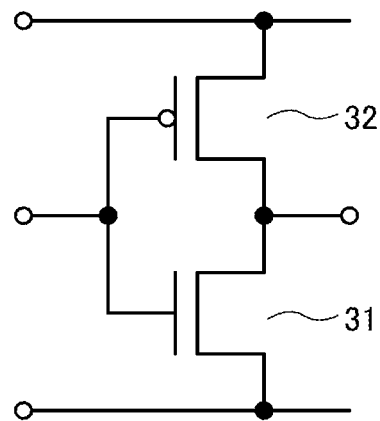

The circuit formed in the silicon substrate 30 is capable of reading a signal output from the pixel circuit and converting the signal; for example, the circuit can include a CMOS inverter as illustrated in the circuit diagram in FIG. 11B. A gate electrode of the transistor 31 (n-channel transistor) is electrically connected to a gate electrode of the transistor 32 (p-channel transistor). One of a source electrode and a drain electrode of one transistor is electrically connected to one of a source electrode and a drain electrode of the other transistor. The other of the source electrode and the drain electrode of the one transistor is electrically connected to a wiring, and the other of the source electrode and the drain electrode of the other transistor is electrically connected to another wiring.

Furthermore, the silicon substrate 30 is not limited to a bulk silicon substrate and can be a substrate made of germanium, silicon germanium, silicon carbide, gallium arsenide, aluminum gallium arsenide, indium phosphide, gallium nitride, or an organic semiconductor.

Figure 11C:
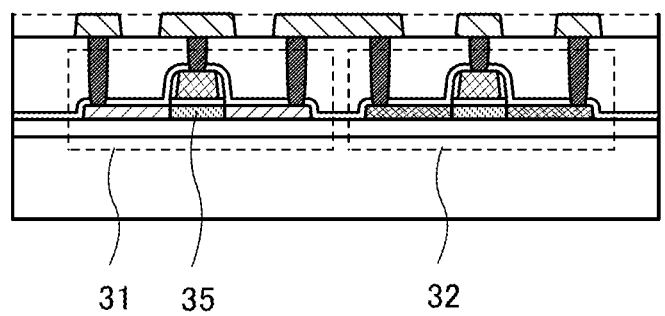

As illustrated in FIG. 11C, the transistors 31 and 32 may each be a transistor including an active layer 35 formed using a silicon thin film. The active layer 35 can be formed using polycrystalline silicon or single crystal silicon of a silicon-on-insulator (SOI) structure.

Here, as illustrated in FIG. 10 and FIG. 11A, an insulating layer 80 is provided between a region including an oxide semiconductor transistor and a region including a Si transistor (a Si photodiode in FIG. 10).

Dangling bonds of silicon are terminated with hydrogen in insulating layers provided in the vicinities of the active regions of the transistors 31 and 32. Therefore, hydrogen has an effect of improving the reliability of the transistors 31 and 32. Meanwhile, hydrogen in insulating layers which are provided in the vicinity of the oxide semiconductor layer that is the active layer of the transistor 41 or the like causes generation of carriers in the oxide semiconductor layer. Therefore, hydrogen might reduce the reliability of the transistor 41 or the like. Consequently, in the case where one layer including the transistor formed using a silicon-based semiconductor material and the other layer including the OS transistor are stacked, it is preferable that the insulating layer 80 having a function of preventing diffusion of hydrogen be provided between the layers. Hydrogen is confined in the one layer by the insulating layer 80, so that the reliability of the transistors 31 and 32 can be improved. Furthermore, diffusion of hydrogen from the one layer to the other layer is inhibited, so that the reliability of the transistor 41 or the like can also be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 11A, a circuit (e.g., a driver circuit) formed using the silicon substrate 30, the transistor 41 or the like, and the photoelectric conversion element 60 can overlap with each other; thus, the integration degree of pixels can be increased. In other words, the resolution of the imaging device can be increased. For example, the imaging device is suitable for an imaging device whose number of pixels is 4k2k, 8k4k, 16k8k, or the like.

In the imaging device in FIG. 11A, no photoelectric conversion element is provided on the silicon substrate 30. Therefore, an optical path for the photoelectric conversion element 60 can be secured without being influenced by the transistors or wirings, and a pixel with a high aperture ratio can be formed.

Figure 12:
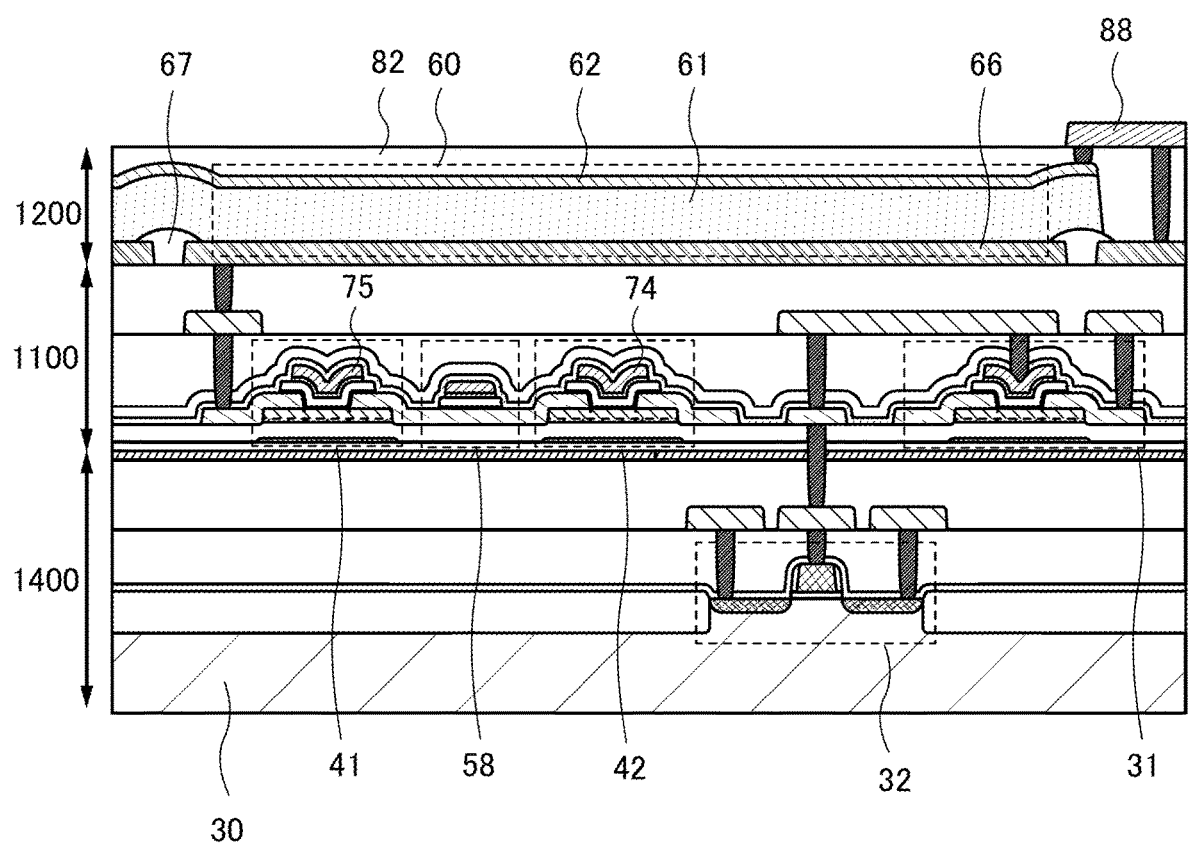
FIG. 12 is a cross-sectional view illustrating an imaging device.

The imaging device in one embodiment of the present invention can have a structure in FIG. 12.

The imaging device in FIG. 12 is a modification example of the imaging device in FIG. 11A. A CMOS inverter is formed using an OS transistor and a Si transistor.

Here, the transistor 32 is a p-channel Si transistor provided in the layer 1400, and the transistor 31 is an n-channel OS transistor provided in the layer 1100. When only the p-channel transistor is provided on the silicon substrate 30, a step of forming a well, an n-type impurity layer, or the like can be skipped.

Although selenium is used for the photoelectric conversion element 60 in the imaging device in FIG. 12, a PIN thin film photodiode may be used as in FIG. 8.

In the imaging device in FIG. 12, the transistor 31 can be formed in the same process as the transistors 41 and 42 formed in the layer 1100. Thus, the manufacturing process of the imaging device can be simplified.

Note that the structure of the transistor and the photoelectric conversion element included in each of the imaging devices described in this embodiment is only an example. Therefore, for example, one or more of the transistors 41 to 43 can be formed using a transistor in which an active region or an active layer includes silicon or the like. Furthermore, either one or both the transistors 31 and 32 can be formed using a transistor including an oxide semiconductor layer as an active layer.

Figure 15A:
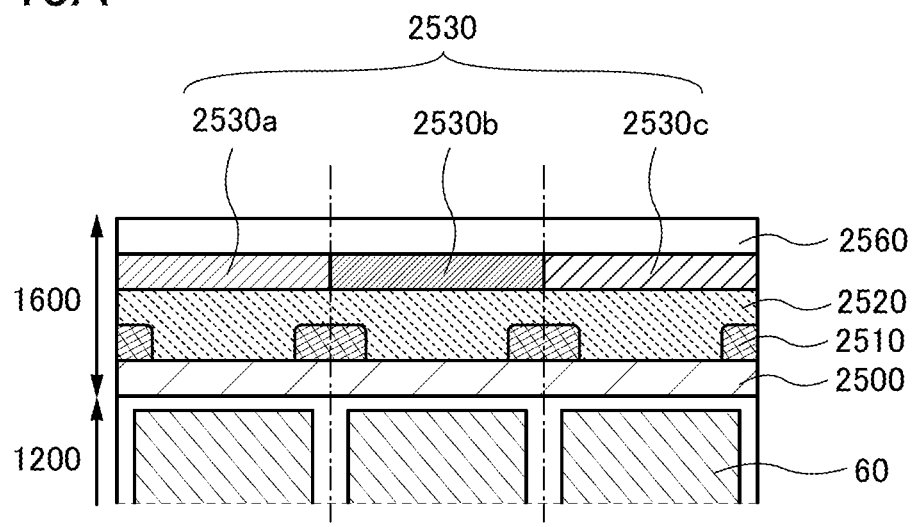
FIGS. 15A to 15C are cross-sectional views each illustrating the structure of an imaging device.

FIG. 15A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element 60 is formed. As the insulating layer 2500, for example, a silicon oxide film with a high visible-light transmitting property can be used. In addition, a silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 is formed in each pixel. For example, a color filter 2530a, a color filter 2530b, and a color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 15B:
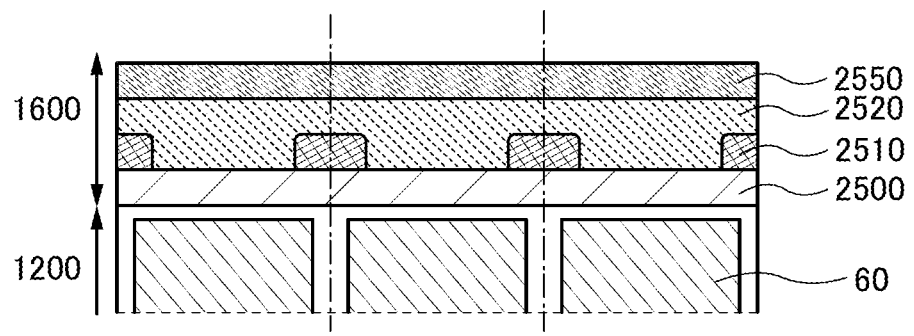

As illustrated in FIG. 15B, an optical conversion layer 2550 may be used instead of the color filter 2530. Such a structure enables the imaging device to capture images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that captures an image visualizing the intensity of radiation and is used for an X-ray imaging device, for example, can be obtained. Radiation such as X-rays passes through an object to enter a scintillator, and then is converted into light (fluorescence) such as visible light or ultraviolet light owing to a phenomenon known as photoluminescence. Then, the photoelectric conversion element 60 detects the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. For example, materials such as $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$ and a resin or ceramics in which any of the materials is dispersed can be used.

In the photoelectric conversion element 60 including a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned thereunder to reach the photoelectric conversion element 60. Note that a region other than the layer 1200 in FIGS. 15A to 15C is referred to as a layer 1600.

Figure 15C:
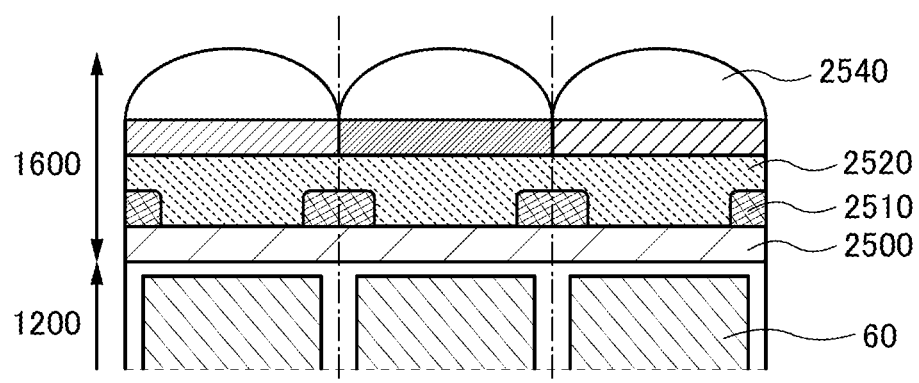
Figure 16:
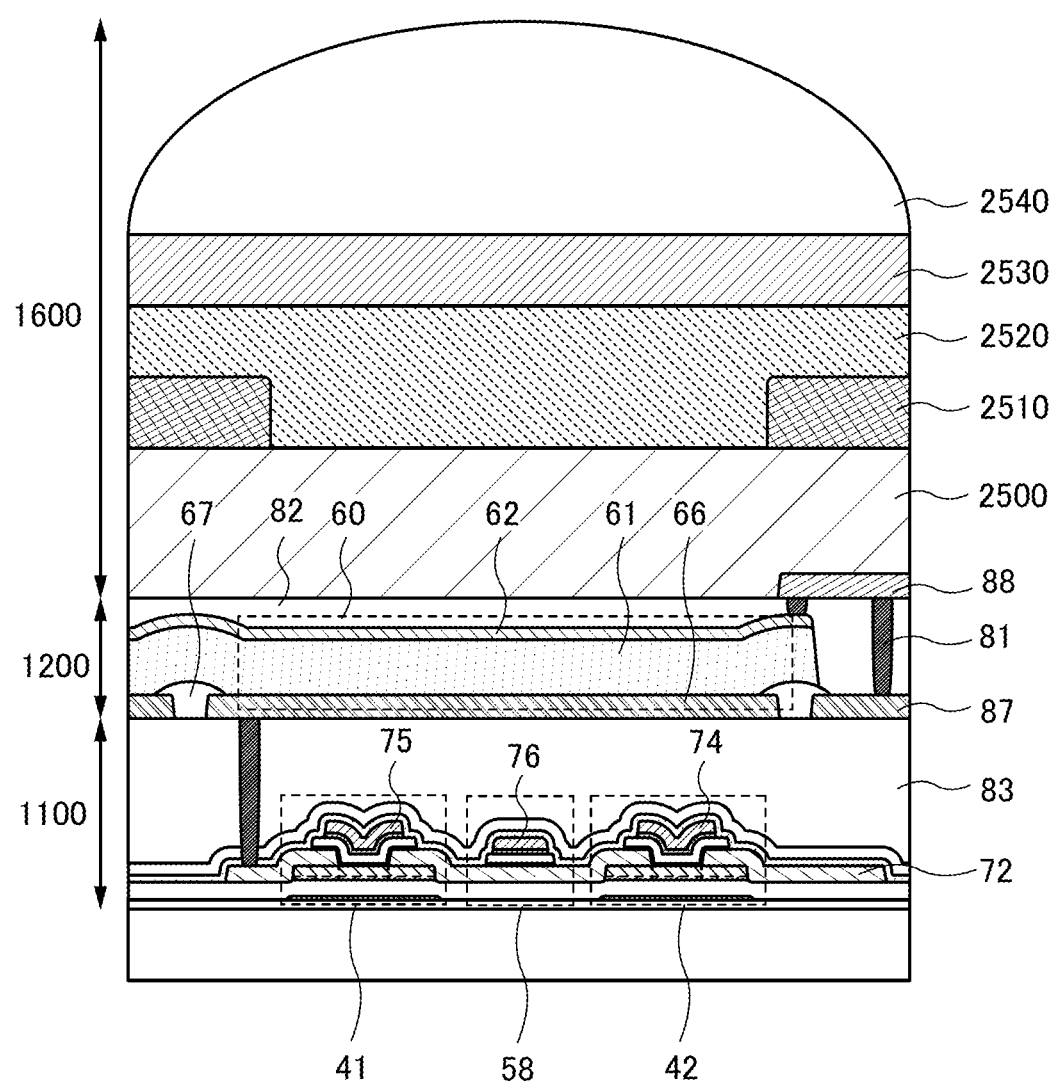
FIG. 16 is a cross-sectional view illustrating the structure of an imaging device.
Figure 17:
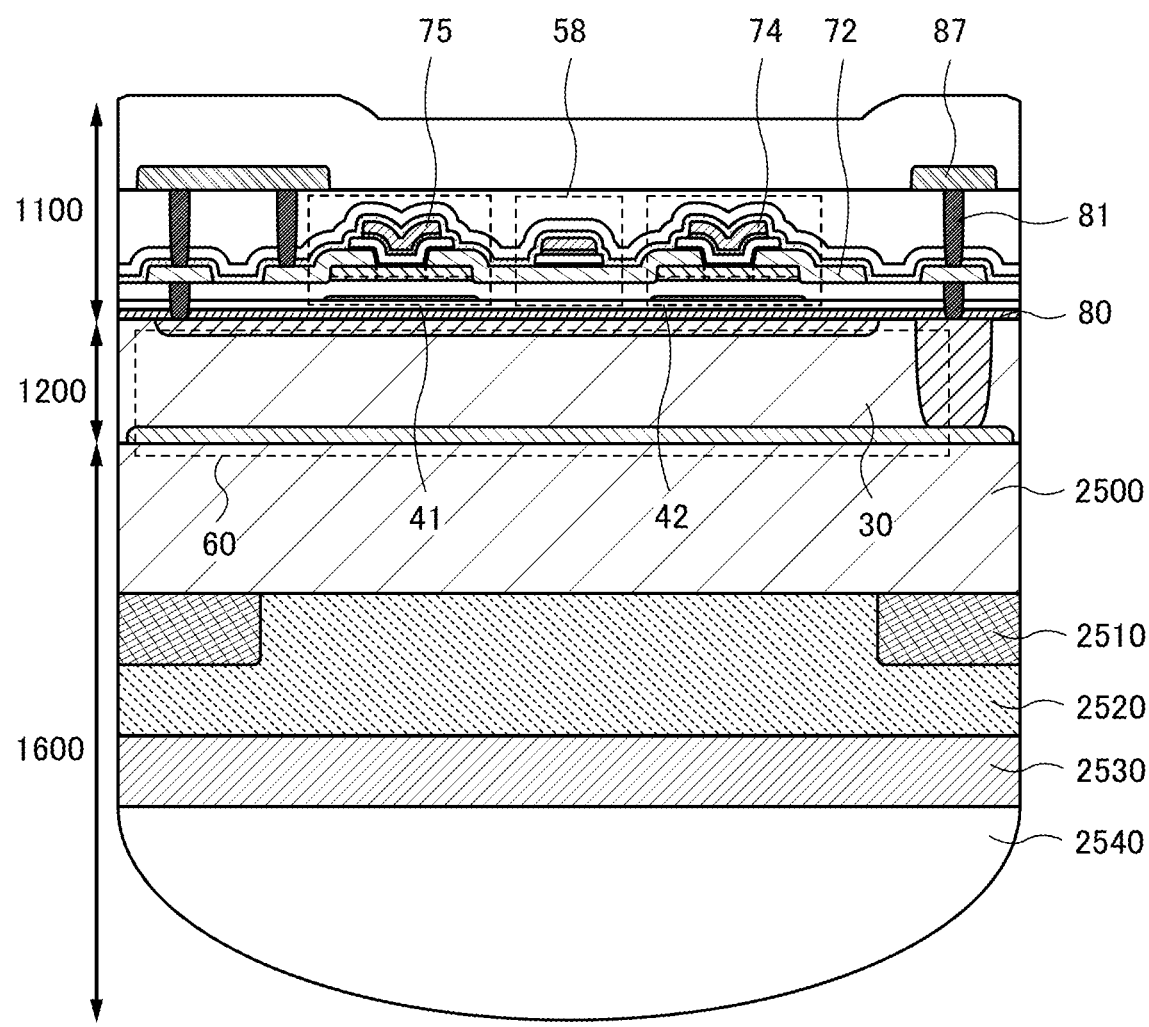
FIG. 17 is a cross-sectional view illustrating the structure of an imaging device.

The specific structure of the imaging device in FIG. 15C is illustrated in FIG. 16 by taking an example of the imaging device in FIGS. 5A to 5C. In addition, the specific structure of the imaging device in FIG. 15C is illustrated in FIG. 17 by taking an example of the imaging device in FIG. 10.

Figure 18:
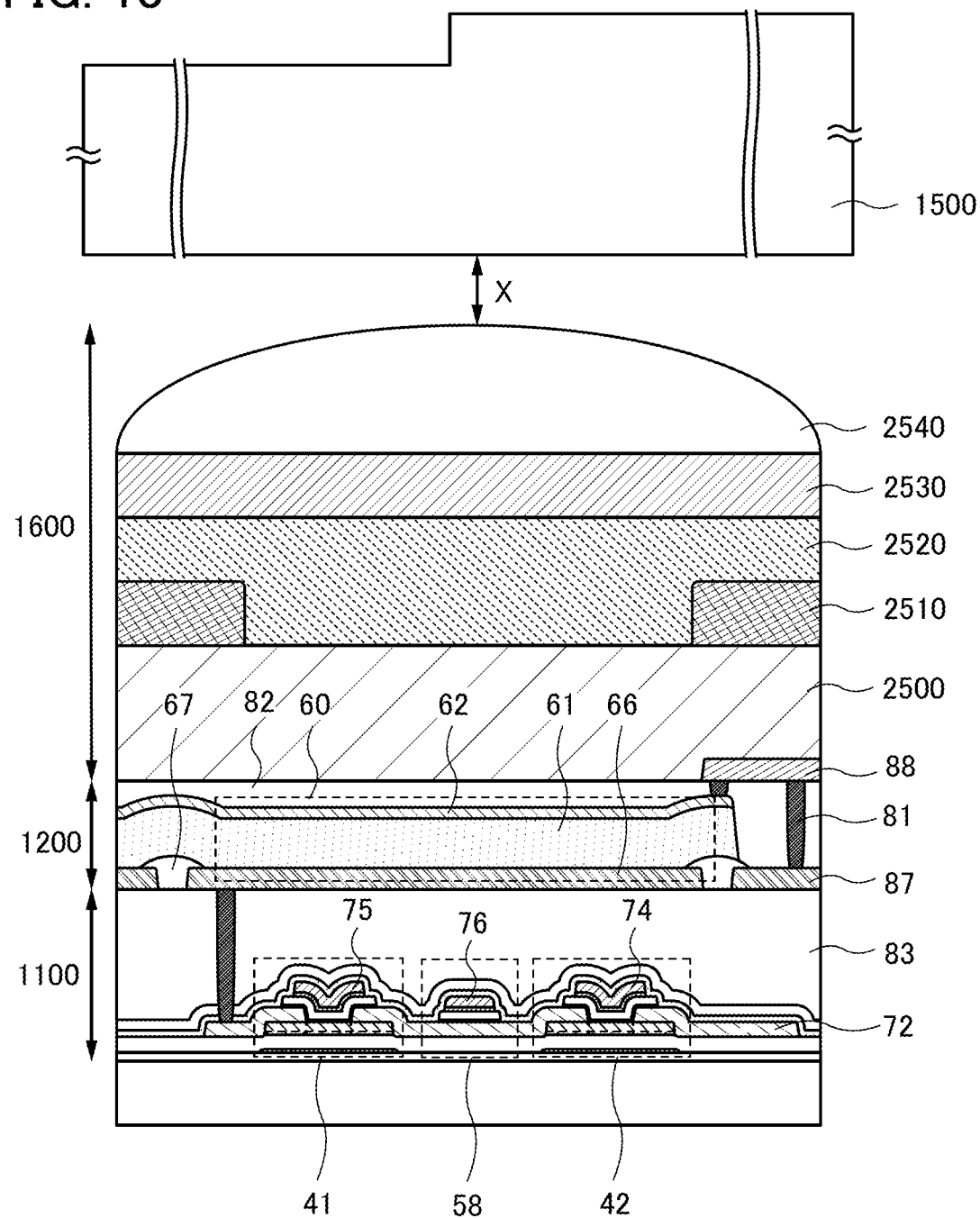
FIG. 18 is a cross-sectional view illustrating the structure of an imaging device.
Figure 19:
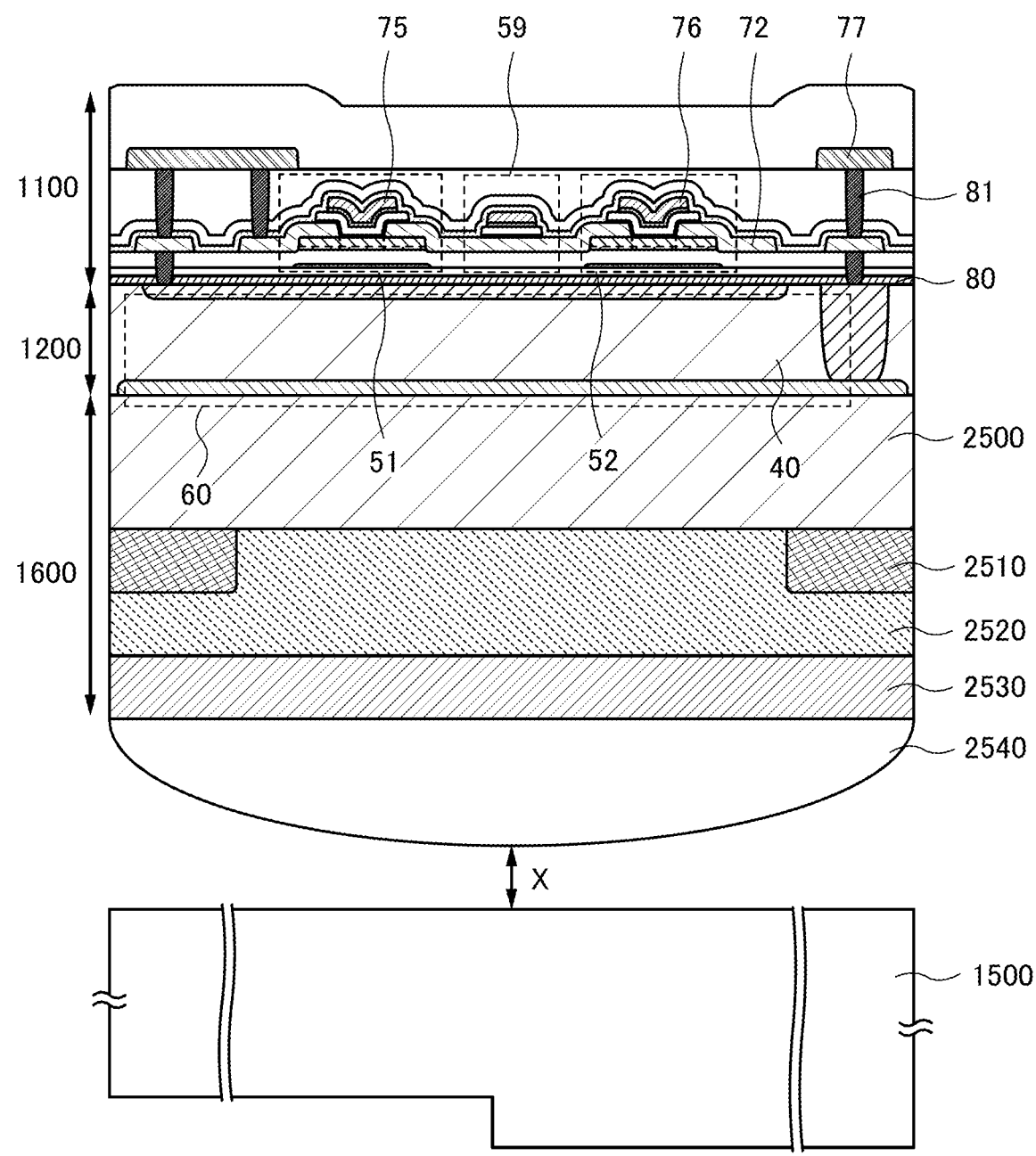
FIG. 19 is a cross-sectional view illustrating the structure of an imaging device.

The imaging device in one embodiment of the present invention may be combined with a diffraction grating 1500 as illustrated in FIG. 18 and FIG. 19. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 20A1 and 20B1, the imaging device may be bent. FIG. 20A1 illustrates a state in which the imaging device is bent in the direction of dashed-two dotted line X1-X2. FIG. 20A2 is a cross-sectional view illustrating a portion indicated by dashed-two dotted line X1-X2 in FIG. 20A1. FIG. 20A3 is a cross-sectional view illustrating a portion indicated by dashed-two dotted line Y1-Y2 in FIG. 20A1.

FIG. 20B1 illustrates a state where the imaging device is bent in the direction of dashed-two dotted line X3-X4 and the direction of dashed-two dotted line Y3-Y4. FIG. 20B2 is a cross-sectional view illustrating a portion indicated by dashed-two dotted line X3-X4 in FIG. 20B1. FIG. 20B3 is a cross-sectional view illustrating a portion indicated by dashed-two dotted line Y3-Y4 in FIG. 20B1.

Bending the imaging device can reduce field curvature and astigmatism. Thus, the optical design of the lens and the like, which are used in combination of the imaging device, can be facilitated. For example, the number of lenses used for aberration correction can be reduced; accordingly, the size or weight of semiconductor devices including the imaging device can be easily reduced. In addition, the quality of captured images can be improved.

Figure 21:
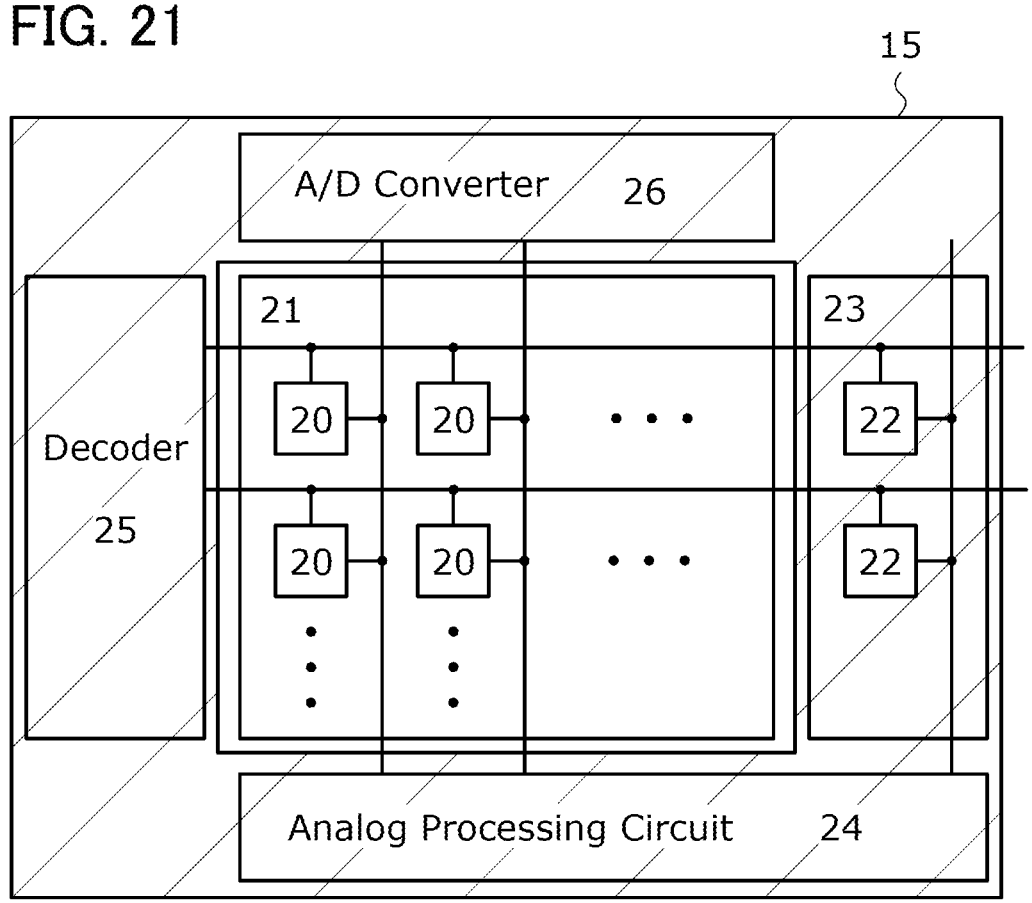
FIG. 21 is a block diagram illustrating an imaging device.
Figure 22:
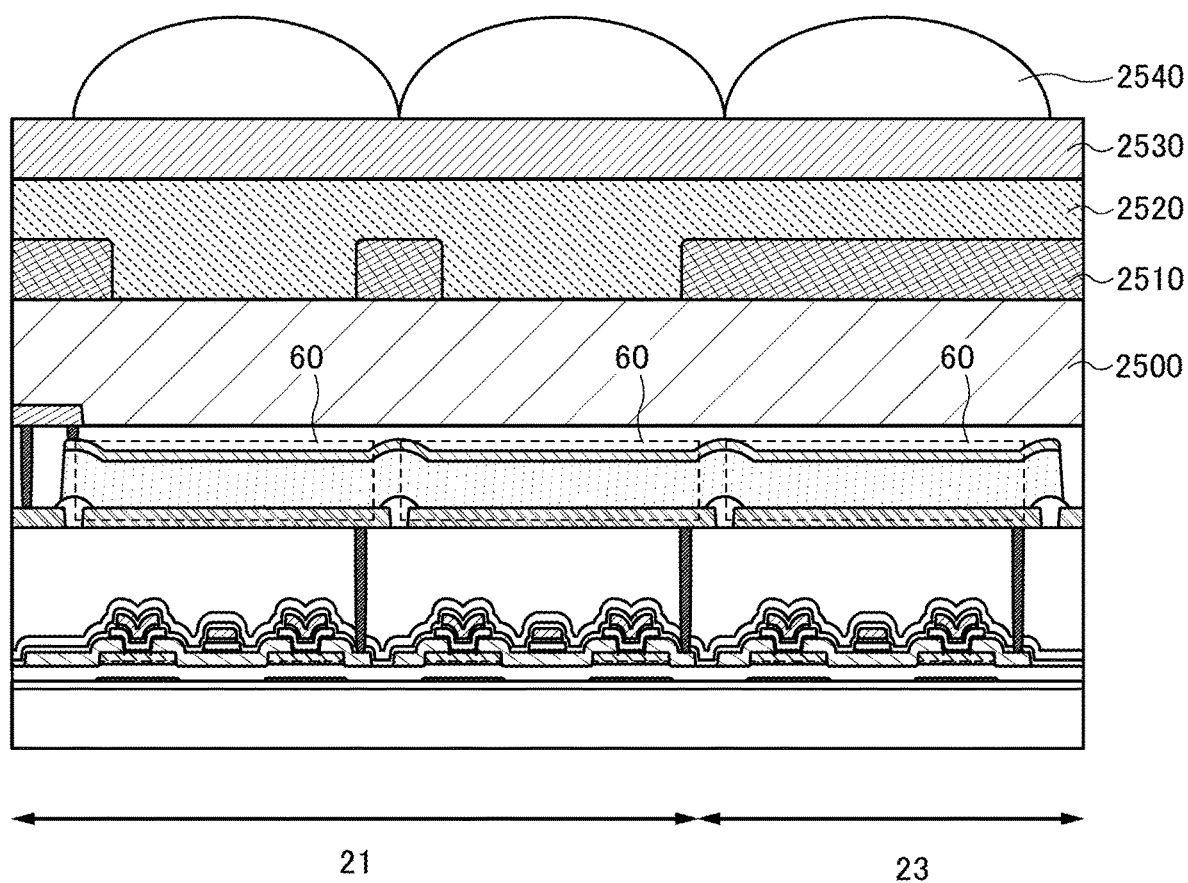
FIG. 22 is a cross-sectional view illustrating the structure of an imaging device.

Note that although FIG. 1 illustrates the structure in which the light-blocking layer 15 shields the reference pixel array 23 from light, the light-blocking layer 15 may cover the reference pixel array 23, the analog processing circuit 24, the row decoder 25, and the A/D converter 26, as illustrated in FIG. 21. Such a structure can suppress deterioration of electrical characteristics of a transistor due to light irradiation. FIG. 22 is a cross-sectional view illustrating the positional relationship among the pixel 20, the reference pixel 22, and the light-blocking layer 15. The light-blocking layer 15 may be provided, for example, above the microlens array 2540, or may be provided by extending the light-blocking layer 2510 of the reference pixel 22, as illustrated in FIG. 22.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. For example, depending on circumstances or conditions, either one or both the transistors 31 and 32 do not necessarily include an oxide semiconductor in the active layer.

This embodiment can be combined with any of the structures described in the other embodiments as appropriate.

Embodiment 2

In this embodiment, a semiconductor device including a memory element in one embodiment of the present invention is described with reference to drawings. The semiconductor device including a memory element in one embodiment of the present invention can perform vector matrix multiplication. The vector matrix multiplication is, for example, operation frequently used in an arithmetic processing unit, such as smoothing processing, edge enhancement processing, or cosine transform in image processing.

Figure 25:
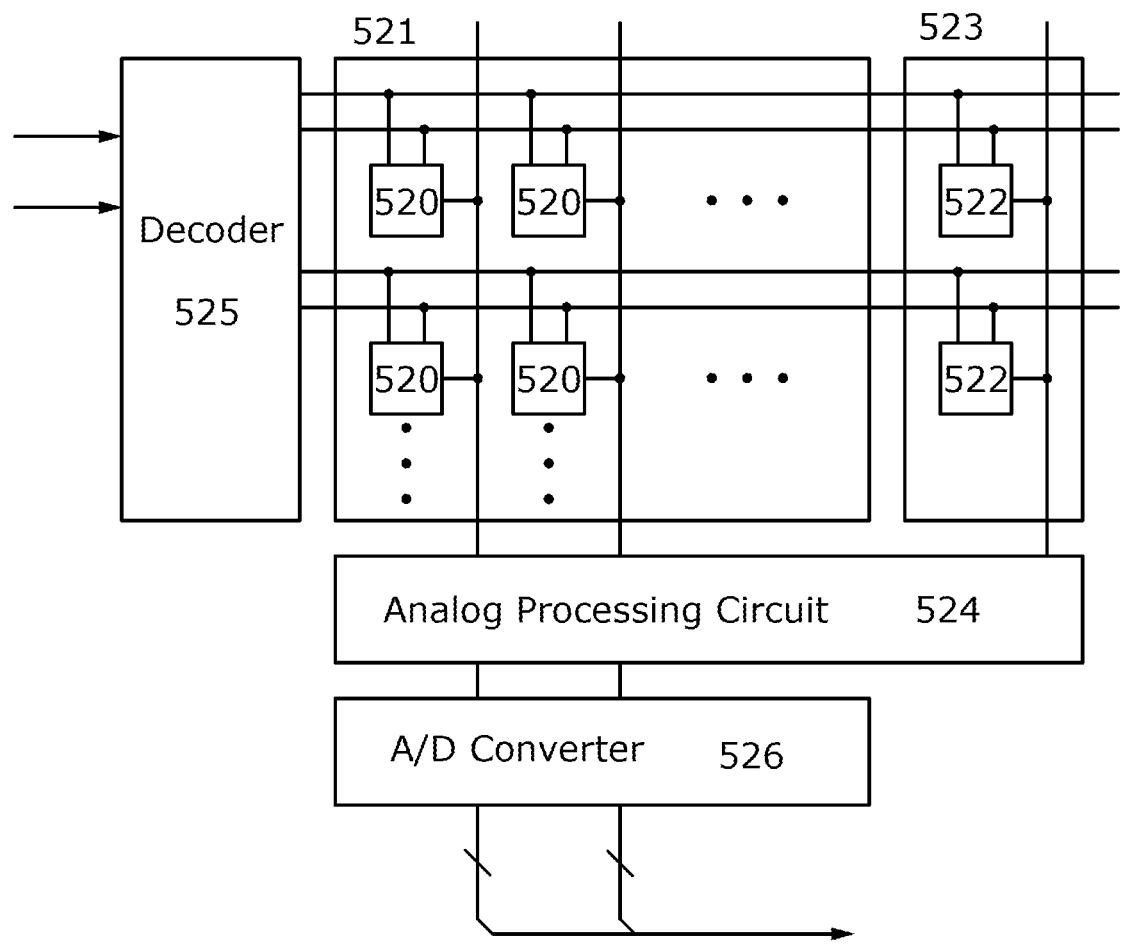
FIG. 25 is a block diagram illustrating a semiconductor device.

FIG. 25 is a block diagram illustrating a semiconductor device in one embodiment of the present invention. The semiconductor device includes a memory element array 521 where memory elements 520 are arranged in a matrix, a reference memory element array 523 where reference memory elements 522 for arithmetic processing are arranged, an analog processing circuit 524, and a row decoder 525 that outputs a potential for writing or reading to the memory element 520 and the reference memory element 522. Note that an A/D converter 526 can be used when output data of the analog processing circuit 524 is obtained as digital data. Thus, the A/D converter 526 can be omitted.

Examples of input signals of the row decoder 525 include an address signal for specifying the row of the memory element 520 to which data is written and a data signal and an address signal for specifying a potential for reading data from the memory element 520. Examples of output signals of the A/D converter 526 include a digitally converted data signal.

Although the memory element array 521 and the reference memory element array 523 are separately illustrated, circuits of the memory element 520 and the reference memory element 522 have the same structure. Therefore, in the plurality of memory elements arranged in a matrix, the memory elements in one column at an end function as the reference memory element array 523, and the other memory elements function as the memory element array 521.

In the semiconductor device in FIG. 25 that is one embodiment of the present invention, when selection signals with different potentials are applied to the memory elements in a plurality of rows, current that depends on the product of the potential of data and the potential of the selection signal can flow from each memory element. Then, an output signal based on the sum of these currents can be obtained.

In other words, when the potential of data stored in each memory element corresponds to a matrix element of the matrix and the potential of the selection signal corresponds to a row element of the vector, multiplication and sum operation of each component can be performed in parallel. Then, data corresponding to the result of vector matrix multiplication can be obtained.

Figure 26:
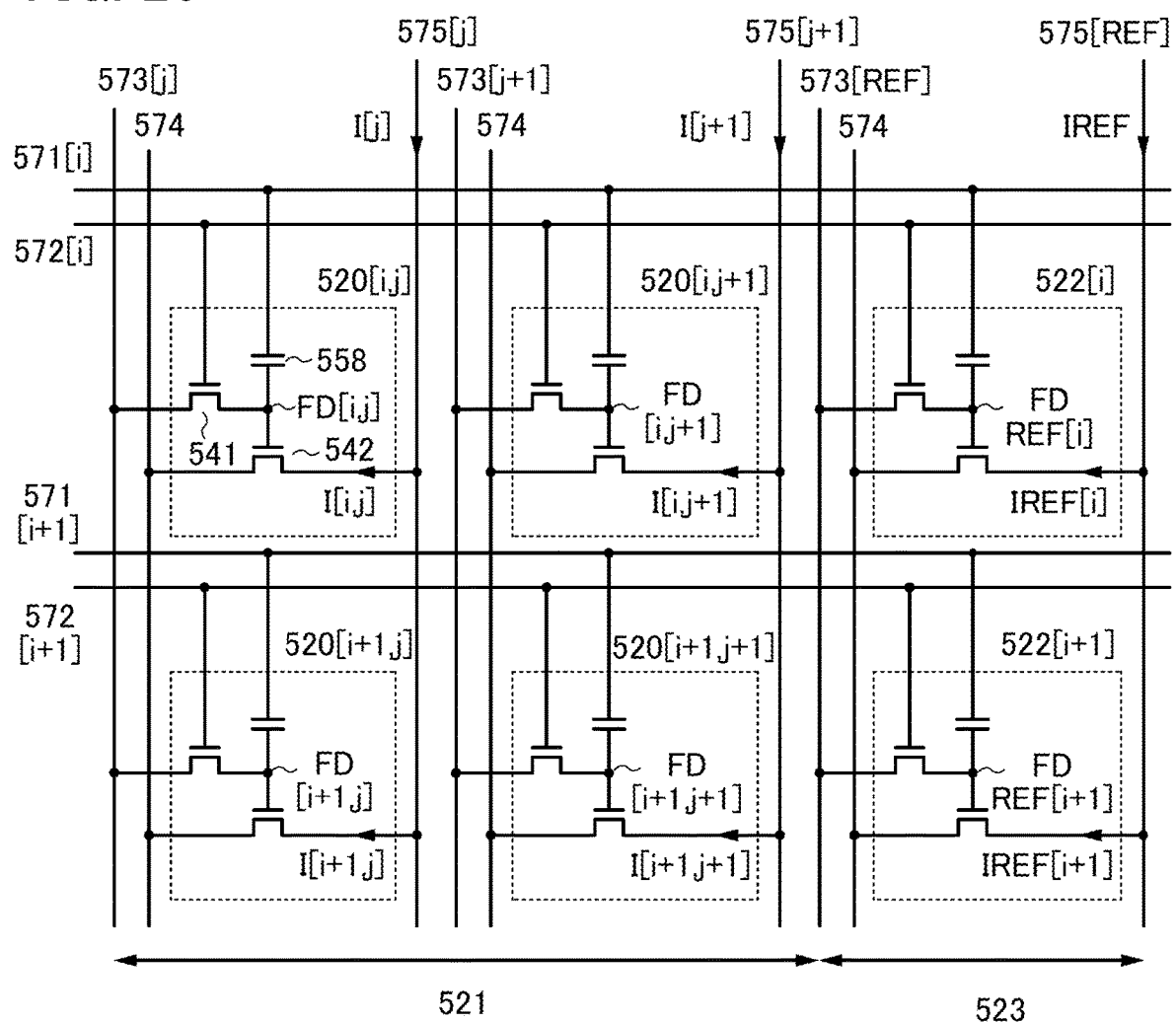
FIG. 26 illustrates a memory element circuit of a semiconductor device.

FIG. 26 is a circuit diagram illustrating the specific structure of the memory element array 521 and the reference memory element array 523. The circuits of the memory element 520 and the reference memory element 522 each include a transistor 541, a transistor 542, and a capacitor 558.

One of a source electrode and a drain electrode of the transistor 541 is electrically connected to a gate electrode of the transistor 542. The gate electrode of the transistor 542 is electrically connected to one electrode of the capacitor 558.

Here, the other electrode of the capacitor 558 is electrically connected to a wiring 571 provided in each row, and a gate electrode of the transistor 541 is electrically connected to a wiring 572. The other of the source electrode and the drain electrode of the transistor 541 is electrically connected to a wiring 573. One of a source electrode and a drain electrode of the transistor 542 is electrically connected to a wiring 574. The other of the source electrode and the drain electrode of the transistor 542 is electrically connected to a wiring 575.

The wirings 571 and 572 can each function as, for example, a signal line for controlling the on/off state of the transistor. The wiring 573 can function as a signal line for supplying the potential of data written to the memory element 520. The wiring 574 can function as a power supply line. The wiring 575 can function as, for example, a signal line for outputting data from the memory element 520. The wiring 572 can also function as a signal line for supplying a potential needed for operation.

Here, the transistor 541 can function as a write transistor for writing data to the charge accumulation portion (FD). The transistor 542 can function as a read transistor that outputs a signal based on the potential of the charge accumulation portion (FD).

In FIG. 26, the memory element array 521 includes a memory element 520[i,j], a memory element 520[i,j+1], a memory element 520[i+1,j], and a memory element 520[i+1,j+1] in two rows and two columns; however, the memory element array 521 can include the memory elements 520 in n rows and m columns (each of n and m is a natural number of 2 or more). In addition, the reference memory element array 523 includes a reference memory element 522[i] and a reference memory element 522[i+1] in two rows and one column; however, the reference memory element array 523 can include the memory elements 520 in n rows and one column.

Here, when a potential is supplied from the wiring 574 and control signals are supplied from a wiring 571[i], a wiring 571[i+1], a wiring 572[i], a wiring 572[i+1], a wiring 573[j], a wiring 573[j+1], and a wiring 573[REF], data of the memory element 520 is output to a wiring 575[j] and a wiring 575[j+1]. Data of the reference memory element 522 is output to a wiring 575[REF].

The charge retention portion (FD)[i,j], the charge retention portion (FD)[i,j+1], the charge retention portion (FD)[i+1,j], the charge retention portion (FD)[i+1,j+1], the charge retention portion (FDREF[i]), and the charge retention portion (FDREF[i+1]) accumulate charge corresponding to the potentials of the wiring 573[j], the wiring 573[j+1], and the wiring 573[REF].

Figure 27:
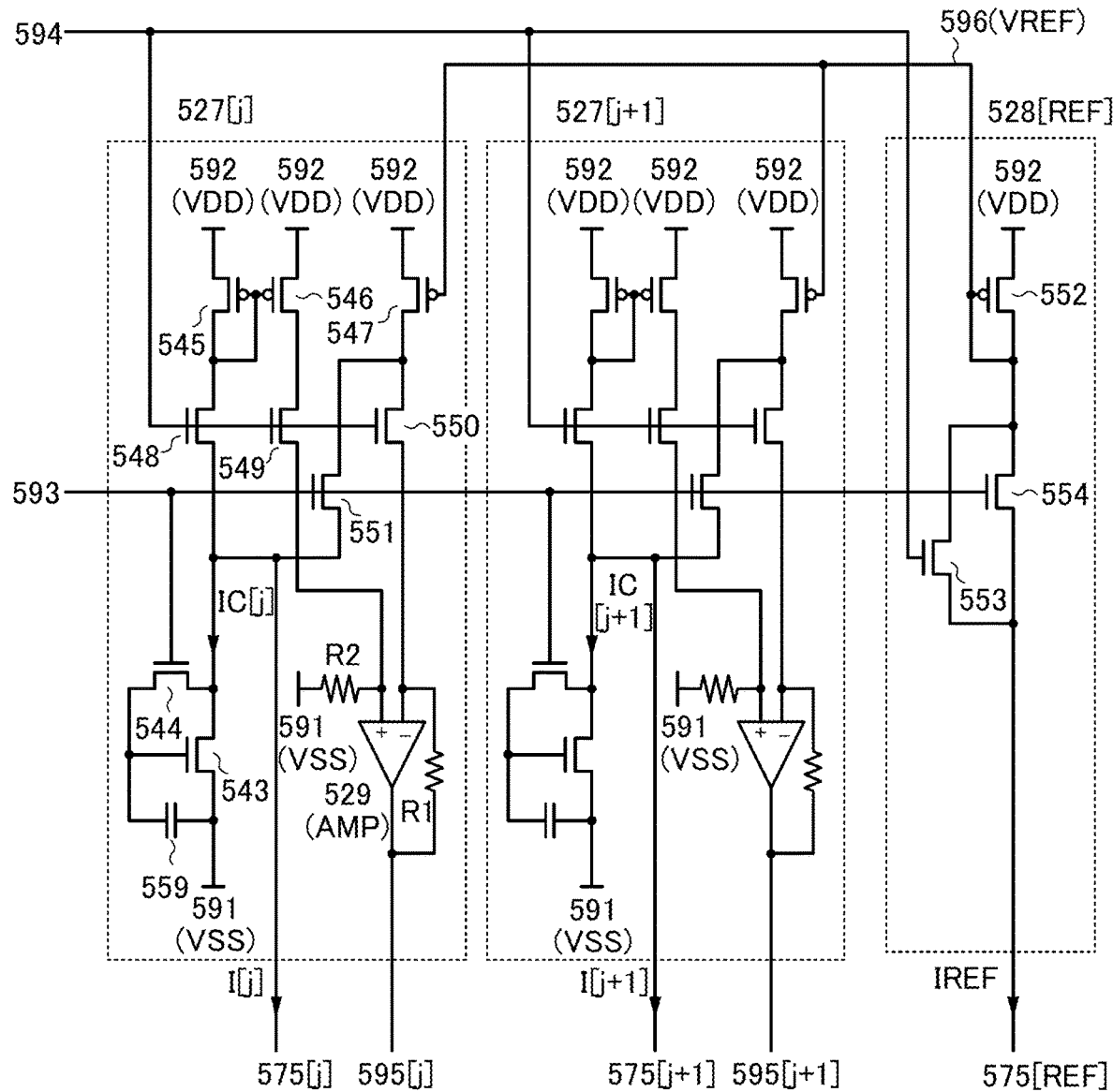
FIG. 27 illustrates an analog processing circuit.

FIG. 27 illustrates a structure example of the analog processing circuit 524 in FIG. 25. The analog processing circuit 524 includes a plurality of column output circuits 527 and a reference current circuit 528[REF]. Note that in FIG. 27, two column output circuits (a column output circuit 527[j] and a column output circuit 527[j+1]) that correspond to the number of columns in the memory element array 521 in FIG. 26 are illustrated.

The column output circuit 527[j] includes transistors 543 to 551, a capacitor 559, the resistor R1, the resistor R2, and an operational amplifier 529. One of a source electrode and a drain electrode of the transistor 543 is electrically connected to one of a source electrode and a drain electrode of the transistor 544. The other of the source electrode and the drain electrode of the transistor 543 is electrically connected to one electrode of the capacitor 559. The other of the source electrode and the drain electrode of the transistor 543 is electrically connected to a wiring 591. The other of the source electrode and the drain electrode of the transistor 544 is electrically connected to a gate electrode of the transistor 543. The other of the source electrode and the drain electrode of the transistor 544 is electrically connected to the other electrode of the capacitor 559. A gate electrode of the transistor 544 is electrically connected to a wiring 593. Here, the wiring 591 can function as a power supply line, for example, can supply a low power supply potential (VSS). The wiring 593 can function as a signal line for controlling the on/off states of the transistors 544 and 551, and a transistor 554 to be described later.

Gate electrodes of the transistors 545 and 546 are electrically connected to one of a source electrode and a drain electrode of the transistor 545 to form a current mirror circuit. Here, the transistor 545 can be referred to as an input transistor, and the transistor 546 can be referred to as an output transistor.

One of the source electrode and the drain electrode of the transistor 545 is electrically connected to one of the source electrode and the drain electrode of the transistor 543 and the wiring 575[j] through the transistor 548. One of the source electrode and the drain electrode of the transistor 546 is electrically connected to one input terminal (+) of the operational amplifier 529 through the transistor 549. One input terminal of the operational amplifier 529 is electrically connected to the wiring 591 through the resistor R2.

The other of the source electrode and the drain electrode of the transistor 545 and the other of the source electrode and the drain electrode of the transistor 546 are electrically connected to a wiring 592. Gate electrodes of the transistors 548 and 549 are electrically connected to a wiring 594. Here, the wiring 592 can function as a power supply line, for example, can supply a high power supply potential (VDD). The wiring 594 can function as a signal line for controlling the on/off states of the transistors 548 to 550, and a transistor 553 to be described later.

One of a source electrode and a drain electrode of the transistor 547 is electrically connected to the wiring 592. The other of the source electrode and the drain electrode of the transistor 547 is electrically connected to the other input terminal (−) of the operational amplifier 529 through the transistor 550. The other input terminal of the operational amplifier 529 is electrically connected to an output terminal of the operational amplifier 529 through the resistor R1. The other of the source electrode and the drain electrode of the transistor 547 is electrically connected to one of the source electrode and the drain electrode of the transistor 543 and the wiring 575[j] through the transistor 551.

The reference current circuit 528[REF] includes transistors 552 to 555. One of a source electrode and a drain electrode of the transistor 552 is electrically connected to the wiring 592. The other of the source electrode and the drain electrode of the transistor 552 is electrically connected to the wiring 575[REF] through the transistor 554. One of a source electrode and a drain electrode of the transistor 554 is electrically connected to one of a source electrode and a drain electrode of the transistor 553. The other of the source electrode and the drain electrode of the transistor 554 is electrically connected to the other of the source electrode and the drain electrode of the transistor 553. Note that the transistors 547 and 552 form a current mirror circuit. Here, the transistor 552 can be referred to as an input transistor, and the transistor 547 can be referred to as an output transistor.

Note that in the above structure, the transistors 545, 546, 547, and 552 can be p-channel transistors.

Here, when a potential is supplied from the wiring 592 and a control signal is supplied from the wiring 593 or 594, current flows from the wiring 575[REF] to the reference memory element 522, and the potential of a wiring 596 can be current source bias voltage (VREF).

When a potential is supplied from the wiring 591 and control signals are supplied from the wirings 593 and 594, current flows from the wiring 575[j] and the wiring 575[j+1] to the memory element 520 in each column, and output signals are output to a wiring 595[j] and a wiring 595[j+1] electrically connected to output terminals of the operational amplifier.

Note that the structure of the memory element 520, the reference memory element 522, and the analog processing circuit 524 is just an example, and some circuit, some transistor, some capacitor, some wiring, or the like is not included in some cases. Alternatively, a circuit, a transistor, a capacitor, a wiring, or the like that is not included in the above structure might be included. Alternatively, connection of some wiring might be different from the above connection.

Figure 28:
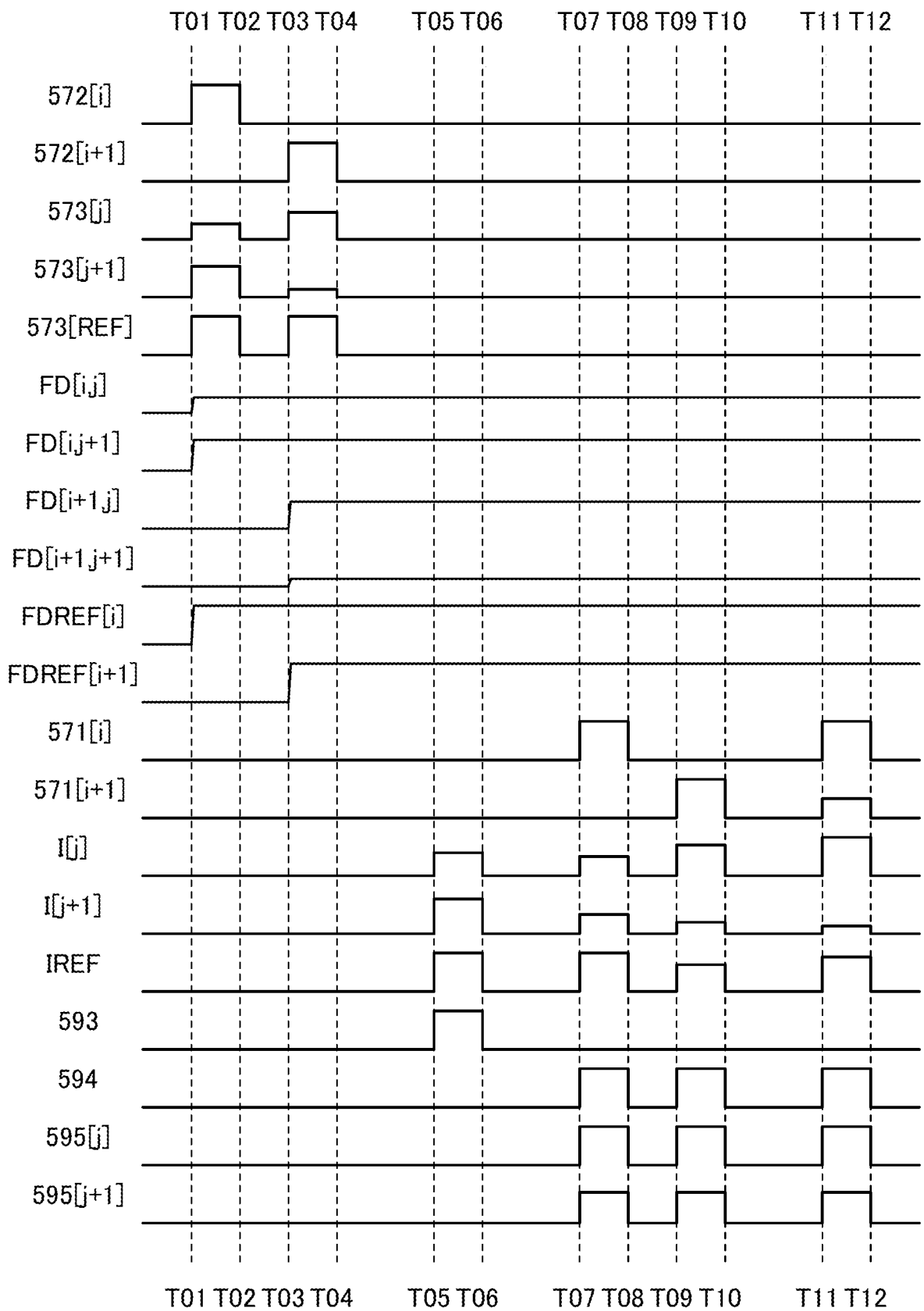
FIG. 28 is a timing chart illustrating operation of arithmetic processing of a semiconductor device.

Next, an operation example of the semiconductor device in one embodiment of the present invention is described with reference to a timing chart in FIG. 28. Note that I[j], I[j+1], and IREF in FIG. 28 represent a current signal supplied to the wiring 575[j], a current signal supplied to the wiring 575[j+1], and a current signal supplied to the wiring 575[REF], respectively. The wiring 573 has a low potential, the wiring 591 has a low potential, and the wiring 592 has a high potential.

In FIG. 28, operation from time T01 to time T04 corresponds to operation of storing data that corresponds to each matrix element of the matrix in each memory element 520. Operation from time T05 to time T06 corresponds to operation of setting correction voltage for the column output circuit 527. Operation from time T07 to time T10 corresponds to operation of obtaining output data that corresponds to the data of the memory element 520 in each column. Operation from time T11 to time T12 corresponds to operation of obtaining data that corresponds to the results of vector matrix multiplication when the potential of data to be stored in each memory element 520 corresponds to the matrix element of the matrix and the potential of the selection signal corresponds to a row element of the vector.

Note that the transistors 542 and 543, the transistors 545 to 547, and the transistor 552 operate in a saturation region unless otherwise specified. In other words, gate voltage, source voltage, and drain voltage of the transistors are appropriately biased to voltage so that the transistors operate in the saturation region. Note that even when the operation of the transistors is deviated from operation in an ideal saturation region, the gate voltage, source voltage, and drain voltage of the transistors are regarded as being appropriately biased as long as the accuracy of output data is within a desired range. Note that other transistors, that is, the transistors 541 and 544, the transistors 548 to 551, and the transistors 553 and 554 may each have a switch function for controlling the on/off state.

From the time T01 to the time T02, the potential of the wiring 572[i] is set to "H," the potential of the wiring 572[i+1] is set to "L," the potential of the wiring 573[j] is VPR−VP[i,j], the potential of the wiring 573[j+1] is set to VPR−VP[i,j+1], and the potential of the wiring 573[REF] is set to VPR. At this time, the potential of a charge retention portion FD[i,j] is set to VPR−VP[i,j], the potential of a charge retention portion FD[i,j+1] is set to VPR−VP[i,j+1], and the potential of a charge retention portion FDREF[i] is set to VPR.

From the time T03 to the time T04, the potential of the wiring 572[i] is set to "L," the potential of the wiring 572[i+1] is set to "H," the potential of the wiring 573[j] is VPR−VP[i+1,j], the potential of the wiring 573[j+1] is set to VPR−VP[i+1,j+1], and the potential of the wiring 573[REF] is set to VPR. At this time, the potential of a charge retention portion FD[i+1,j] is set to VPR−VP[i+1,j], the potential of a charge retention portion FD[i+1,j+1] is set to VPR−VP[i+1,j+1], and the potential of a charge retention portion FDREF[i+1] is set to VPR.

If the potential of the wiring 571[i] is VW[i], the drain current I[i,j] of the transistor 542 in the memory element 520[i,j] is $k(VW[i]-Vth+VPR-VP[i,j])^2$. Drain current IREF[i] of the transistor 542 in the reference memory element 522[i] is $k(VW[i]-Vth+VPR)^2$. Here, k is a coefficient and Vth is the threshold voltage of the transistor 542. Note that the potential of the wiring 571[i] is superimposed on the gate potential of the transistor 542 through the capacitor 558; thus, the change in the potential of the wiring 571[i] does not directly increase the gate potential of the transistor 542. Specifically, a potential change obtained by multiplication of a capacitive coupling coefficient that can be calculated from the capacitance of the capacitor 558, the gate capacitance of the transistor 542, and parasitic capacitance by the potential change of the wiring 571[i] corresponds to the increase in the gate potential of the transistor 542. Here, for simplicity, a potential obtained by multiplication of the capacitive coupling coefficient is VW[i]; however, actually, a potential supplied to the wiring 571[i] is converted as appropriate using the capacitive coupling coefficient.

Here, if the current I[j] flowing to the wiring 575[j] is $\Sigma_i I[i,j]$ and the current IREF flowing to the wiring 575[REF] is $\Sigma_i IREF[i]$, a difference $\Delta I[j]=IREF-I[j]=\Sigma_i IREF[i]-\Sigma_i I[i,j]=\Sigma(k(VW[i]-Vth+VPR)^2-k(VW[i]-Vth+VPR-VP[i,j])^2=2k\Sigma_i(VW[i]\cdot VP[i,j])-2k\Sigma_i(Vth-VPR)\cdot VP[i,j]-k\Sigma_i VP[i,j]^2$.

The first term $2k\Sigma_i(VW[i]\cdot VP[i,j])$ corresponds to the sum of products of the potential VW[i] of the wiring 571[i] in the j-th column and the potential VP[i,j] of the charge retention portion FD[i,j] in the memory element 520[i,j]. The first term $2k\Sigma_i(VW[i]\cdot VP[i,j])$ can be calculated by subtracting the sum of the second term and the third term $-2k\Sigma_i(Vth\cdot VPR)\cdot VP[i,j]-k\Sigma_i VP[i,j]^2=Ioffset[j]$ from a difference $\Delta I[j]$ between the current I[j] flowing to the wiring 575[j] and the current IREF flowing to the wiring 575[REF].

Note that Ioffset[j] corresponds to the difference between the current I[j] flowing to the wiring 575[j] and the current IREF flowing to the wiring 575[REF] when VW[i] is 0 V, that is, the potential of the wiring 571[i] is 0 V.

From the time T05 to the time T06, the potential of the wiring 593 is set to "H," the potential of the wiring 571[i] is set to 0 V, and the potential of the wiring 571[i+1] is set to 0 V. At this time, the current I[j] flows to the wiring 575[j], the current IREF flows to the wiring 575[REF], and the current IC[j] flows to the transistor 543 in the column output circuit 527[j]. Current I[j+1] flows to the wiring 575[j+1], the current IREF flows to the wiring 575[REF], and current IC[j+1] flows to the transistor 543 in the column output circuit 527[j+1].

With the use of the current mirror circuit formed using the transistors 547 and 552, in the column output circuit 527[j], the current I[j] and the current IC[j] flowing through the transistors 547 and 551 is equal to the current IREF flowing through the transistors 552 and 554.

A potential for supplying the current IC[j] is stored in the capacitor 559. Here, since Ioffset[j]=IREF−I[j] and IREF=I[j]+IC[j], the current IC[j] is equal to Ioffset[j]. Therefore, after the potential of the wiring 593 is set to "L," the transistor 543 in the column output circuit 527[j] functions as a current source for supplying Ioffset[j] owing to the potential held in the capacitor 559. Similarly, the transistor 543 in the column output circuit 527[j+1] functions as a current source for supplying Ioffset[j+1] owing to the potential held in the capacitor 559.

From the time T07 to the time T08, the potential of the wiring 571[i] is set to VW[i], the potential of the wiring 571[i+1] is set to 0 V, and the potential of the wiring 594 is set to "H." At this time, in the column output circuit 527[j], current that corresponds to the sum of the current I[j] and the current IC[j]=Ioffset[j] flows through the transistor 548. The current is equal to current flowing to the resistor R2 through the transistors 546 and 549 owing to the current mirror circuit formed using the transistors 545 and 546.

The current IREF flows through the transistor 553. The current IREF is equal to current flowing to the resistor R1 through the transistors 547 and 550 owing to the current mirror circuit formed using the transistors 547 and 552. Here, if both the resistance of the resistor R1 and the resistance of the resistor R2 are R, a signal output from the operational amplifier 529 to the wiring 595[j] is in proportion to I[j]+Ioffset[j]−IREF and is $2k\Sigma i(VW[i]\cdot VP[i,j])=2k\cdot VW[i]\cdot VP[i,j]$. In other words, output that depends on the data of the memory element 520[i,j] is obtained. That is, by appropriate normalization, the data of the memory element 520[i,j] can be output to the wiring 595[j]. Similarly, data of the memory element 520[i,j+1] can be output to the wiring 595[j+1] in the column output circuit 527[j+1].

Similarly, from the time T09 to the time T10, if the potential of the wiring 571[i] is set to 0 V, the potential of the wiring 571[i+1] is set to VW[i+1], and the potential of the wiring 594 is set to "H," data of the memory element 520[i+1,j] can be output to the wiring 595[j]. Data of the memory element 520[i+1,j+1] can be output to the wiring 595[j+1] in the column output circuit 527[j+1].

From the time T11 to the time T12, the potential of the wiring 571[i] is set to VW[i], the potential of the wiring 571[i+1] is set to VW[i+1], and the potential of the wiring 594 is set to "H." At this time, in the column output circuit 527[j], current that corresponds to the sum of the current I[j] and the current IC[j]=Ioffset[j] flows through the transistor 548. The current is equal to the current flowing to the resistor R2 through the transistors 546 and 549 owing to the current mirror circuit formed using the transistors 545 and 546.

The current IREF flows through the transistor 552. The current IREF is equal to current flowing to the resistor R1 through the transistors 547 and 550 owing to the current mirror circuit formed using the transistors 547 and 552.

Here, if both the resistance of the resistor R1 and the resistance of the resistor R2 are R, a signal output from the operational amplifier 529 to the wiring 595[$j$] is in proportion to I[$j$]+Ioffset[$j$]−IREF and is 2k$\Sigma$(VW[i]·VP[i,j])=2k(VW[i]·VP[i,j]+VW[i+1]·VP[i+1,j]). In other words, output that is in proportion to a value obtained by weighting of the data of the memory element 520[$i,j$] and the data of the memory element 520[$i$+1,j] with VW[i]:VW[i+1] is obtained.

That is, by appropriate normalization, data corresponding to a j-th component obtained by vector matrix multiplication can be output from the operational amplifier 529 to the wiring 595[$j$] when the potential of data to be stored in each memory element 520 corresponds to the matrix element in the matrix and the potential of the wiring 571 corresponds to the row element of the vector. Similarly, data corresponding to a (j+1)th component obtained by vector matrix multiplication can be output from the operational amplifier 529 to the wiring 595[$j$+1].

With the above circuit structure and operating method, it is possible to provide a low-power semiconductor device that can perform vector matrix multiplication at high speed with a small circuit size.

Figure 29A:
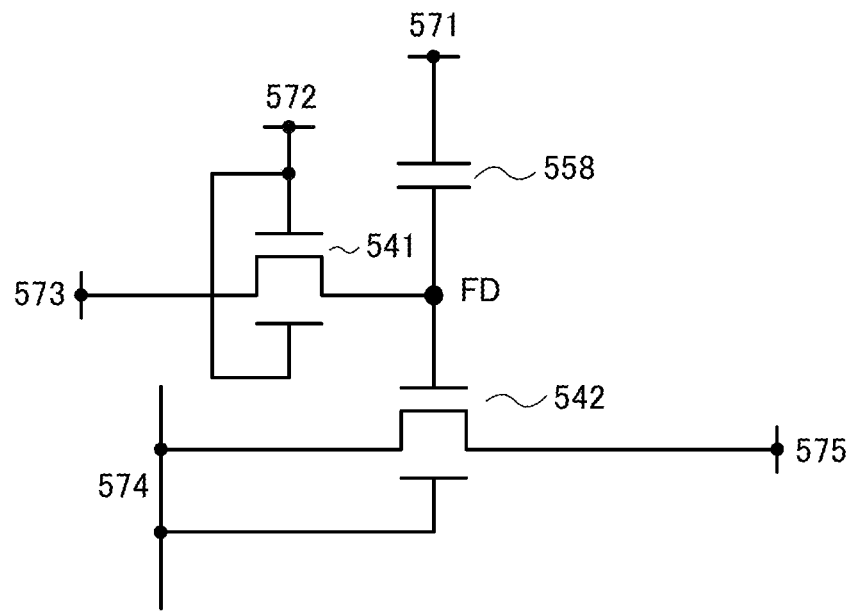
FIGS. 29A and 29B each illustrate a memory element circuit.
Figure 29B:
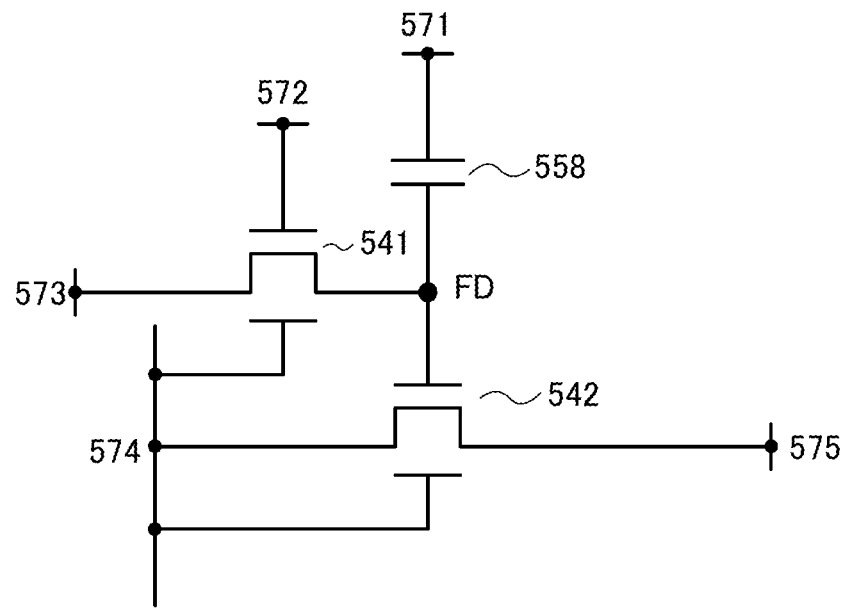

Note that the structures of the circuits of the memory element 520 and the reference memory element 522 are not limited to the structures in FIG. 26, and the transistors 541 and 542 may each include a back gate as illustrated in FIGS. 29A and 29B. FIG. 29A illustrates a structure in which a front gate and a back gate of the transistor 541 have the same potential and a constant potential is applied to the back gate of the transistor 542. FIG. 29B illustrates a structure in which a constant potential is applied to the back gates of the transistors 541 and 542. The structure in which the back gates are supplied with the same potential as front gates enables an increase in on-state current. The structure in which a constant potential is applied to the back gates enables control of the threshold voltage. A structure in which the same potential is applied to a front gate and a back gate, a structure in which a constant potential is applied to a back gate, and a structure without a back gate may be optionally combined as necessary for the transistors included in one memory element.

Figure 30A:
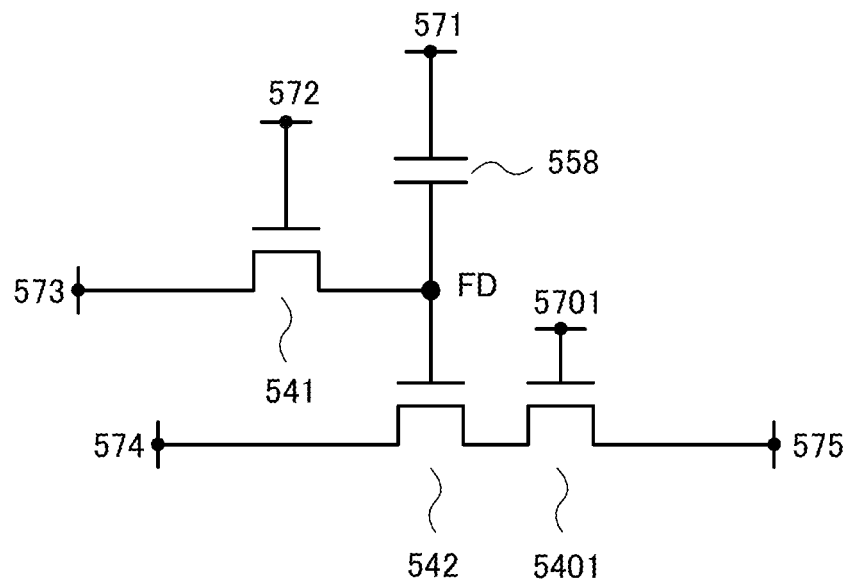
FIGS. 30A and 30B each illustrate a memory element circuit.
Figure 30B:
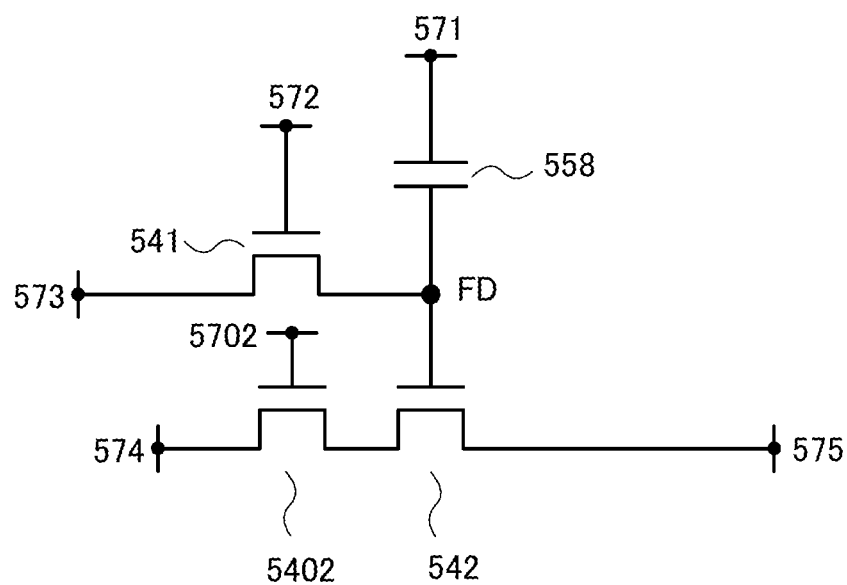

As illustrated in FIG. 30A, a transistor 5401 may be provided between the transistor 542 and the wiring 575. The transistor 5401 functions as a switching transistor whose on/off state is controlled by the potential of a wiring 5701. As illustrated in FIG. 30B, a transistor 5402 may be provided between the transistor 542 and the wiring 574. The transistor 5402 functions as a switching transistor whose on/off state is controlled by the potential of a wiring 5702. The transistor 542 can be a floating gate transistor without the transistor 541.

Figure 31A:
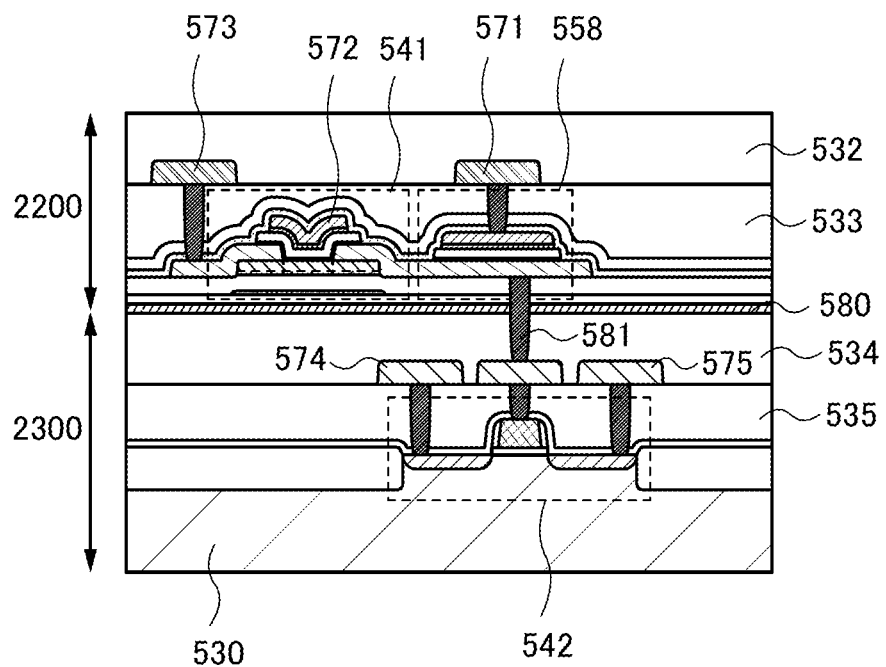
FIGS. 31A to 31C are cross-sectional views illustrating a semiconductor device.

Specific structure examples of the semiconductor device in one embodiment of the present invention are described below with reference to drawings. FIG. 31A is a cross-sectional view of the semiconductor device in one embodiment of the present invention and illustrates a cross-sectional example of a region where the memory element 520 is formed.

The semiconductor device includes a layer 2200 including the oxide semiconductor transistor 541 and the capacitor 558 and a layer 2300 including the transistor 542 formed using the silicon substrate 530.

Although the wirings, the electrodes, and conductors 581 are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor 581 is only an example, and the gate electrode, the source electrode, and the drain electrode of the transistor might each function as a wiring. In some cases, one or more of the wirings and the like illustrated in the drawing are not provided or a wiring, a transistor, or the like that is not illustrated in the drawing is included in each layer.

In addition, insulating layers 532 to 535 and the like that function as protective films, interlayer insulating films, or planarization films are provided over the components. For example, an inorganic insulating film such as a silicon oxide film or a silicon oxynitride film can be used as each of the insulating layers 532 to 535 and the like. Alternatively, an organic insulating film such as an acrylic resin film or a polyimide resin film may be used. Top surfaces of the insulating layers 532 to 535 and the like are preferably planarized by chemical mechanical polishing (CMP) or the like as necessary.

Figure 31B:
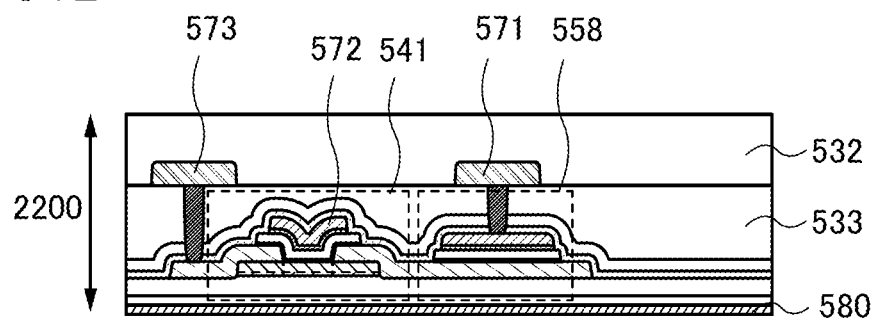

Note that although the transistor 541 includes a back gate in FIG. 31A, as illustrated in FIG. 31B, each transistor does not necessarily include a back gate. The back gate might be electrically connected to a front gate of an opposite transistor. Alternatively, different fixed potentials might be supplied to the back gate and the front gate. Note that the presence or absence of the back gate can also be applied to another semiconductor device described in this embodiment.

Furthermore, typically, the silicon substrate 530 can be a single crystal silicon substrate. However, the silicon substrate 530 can be a substrate made of germanium, silicon germanium, silicon carbide, gallium arsenide, aluminum gallium arsenide, indium phosphide, gallium nitride, or an organic semiconductor.

Figure 31C:
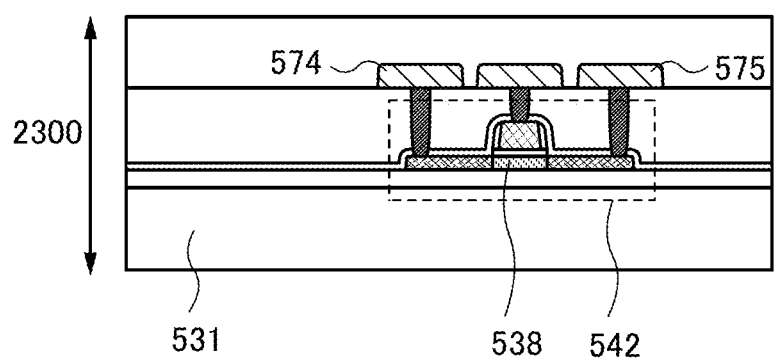

As illustrated in FIG. 31C, the transistor 542 may be a transistor including an active layer 538 formed using a silicon thin film. The active layer 538 can be formed using polycrystalline silicon or single crystal silicon of a silicon-on-insulator (SOI) structure. In this structure, the substrate 530 can be a substrate having an insulating surface, such as a glass substrate.

Here, as illustrated in FIG. 31A, an insulating layer 580 is provided between a region including an oxide semiconductor transistor and a region including a transistor formed using the silicon substrate 530.

Dangling bonds of silicon are terminated with hydrogen in insulating layers provided in the vicinity of the active region of the transistor 542. Therefore, hydrogen has an effect of improving the reliability of the transistor 542. Meanwhile, hydrogen in insulating layers which are provided in the vicinity of the oxide semiconductor layer that is the active layer of the transistor 541 or the like causes generation of carriers in the oxide semiconductor layer. Hydrogen is confined in the one layer by the insulating layer 580, so that the reliability of the transistor 542 can be improved. Furthermore, diffusion of hydrogen from the one layer to the other layer is inhibited, so that the reliability of the transistor 541 or the like can also be improved.

The insulating layer 580 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

An OS transistor can be used as the transistor 541.

Since the OS transistor has extremely low off-state current, for example, in the case where an OS transistor is used as the transistor 541 of the memory element 520, a period during which charge can be held in the charge accumulation portion (FD) can be extremely long. Thus, the refresh frequency of written data can be low, and the power consumption of the semiconductor device can be reduced. Alternatively, the semiconductor device can be used as a substantially nonvolatile storage device.

Figure 32:
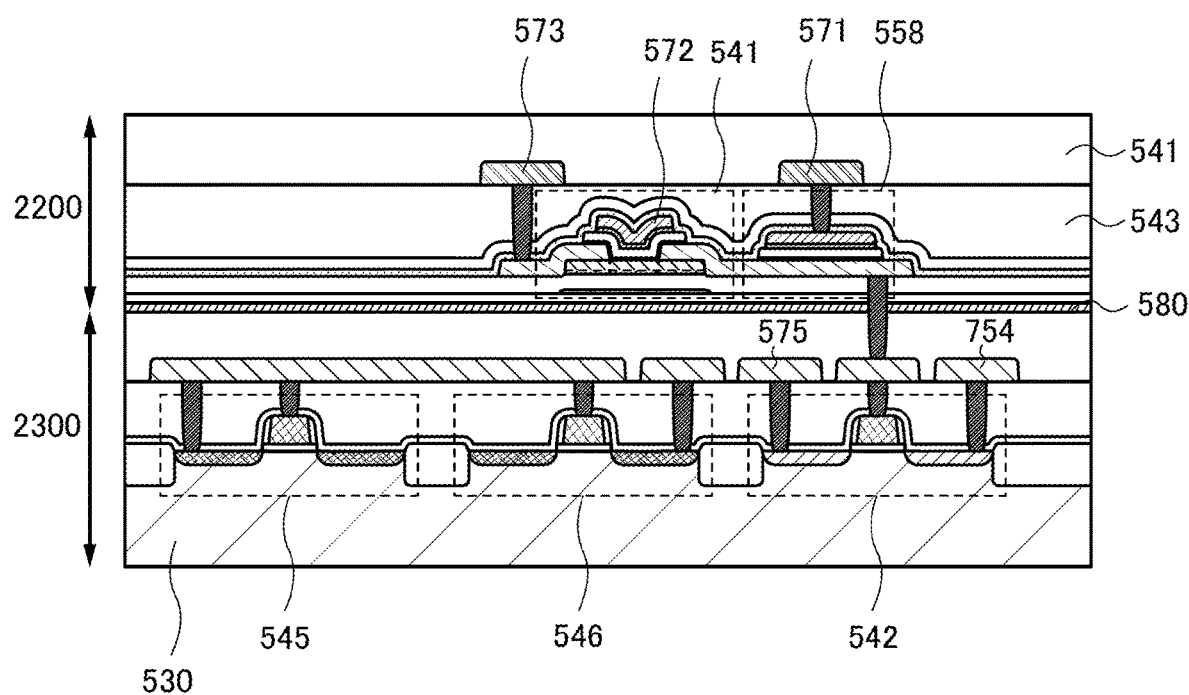
FIG. 32 is a cross-sectional view illustrating a semiconductor device.

The semiconductor device in one embodiment of the present invention can have a structure in FIG. 32.

The semiconductor device in FIG. 32 has a structure in which the current mirror circuit included in the analog processing circuit 524 is formed using the silicon substrate 530 in addition to the structure in FIG. 31A. Note that although FIG. 32 illustrates the current mirror circuit formed using the transistors 545 and 546, another transistor, another capacitor, or the like included in the analog processing circuit 524 may be formed using the silicon substrate 530.

In addition, the transistor, the capacitor, or the like included in the row decoder 525 or the A/D converter 526 may be formed using the silicon substrate 530.

The semiconductor device in one embodiment of the present invention can have a region where an OS transistor overlaps with a Si transistor as illustrated in FIG. 31A and FIG. 32; thus, the semiconductor device can be made small.

Note that the structure of the transistor included in each of the semiconductor devices described in this embodiment is only an example. Therefore, for example, one or more of the transistors 541 to 554 can be formed using a transistor in which an active region or an active layer includes silicon, germanium, silicon germanium, silicon carbide, gallium arsenide, aluminum gallium arsenide, indium phosphide, gallium nitride, an organic semiconductor, or the like. Thus, the active region of the transistor 541 or the like does not necessarily include an oxide semiconductor. Furthermore, each of the transistors 541 to 554 can be formed using a transistor including an oxide semiconductor layer as an active layer.

The circuit including the memory element 520 in FIG. 26 is an example in which stored data can be retained even when power is not supplied and there is no limitation on the number of write cycles.

A transistor formed using an oxide semiconductor enables charge to be held for a long time owing to its electrical characteristics of extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer. On the other hand, a transistor including a material other than an oxide semiconductor, such as crystal silicon, can operate at high speed easily. Thus, the use of both the transistors enables fabrication of a storage device that has high retention capability and operates at high speed.

The circuit including the memory element 520 has a feature that the potential of a gate electrode of the transistor 542 can be held, and thus enables writing, retaining, and reading of data as follows.

Data writing and data retention are described. First, the potential of the wiring 572 is set to a potential at which the transistor 541 is turned on, so that the transistor 541 is turned on.

By the above operation, the potential of the wiring 573 is supplied to the gate electrode of the transistor 542 and the capacitor 558. That is, predetermined charge is supplied to the charge accumulation portion (FD) (writing). Here, charge for supplying either of two different potential levels (hereinafter referred to as low-level charge and high-level charge) is given.

After that, the potential of the wiring 572 is set to a potential at which the transistor 541 is turned off, so that the transistor 541 is turned off. Thus, the charge supplied to the charge accumulation portion (FD) is held (data retention). Since the off-state current of the transistor 541 is extremely low, the charge in the charge accumulation portion (FD) is held for a long time.

Next, data reading is described. An appropriate potential (reading potential) is supplied to the wiring 571 while a predetermined potential (constant potential) is supplied to the wiring 574, so that the potential of the wiring 575 varies depending on the amount of charge held in the charge accumulation portion (FD).

This is because in the case where the transistor 542 is an n-channel transistor, apparent threshold voltage $V_{th\_H}$ when high-level charge is supplied to the gate electrode of the transistor 542 (the charge accumulation portion (FD)) is usually lower than apparent threshold voltage $V_{th\_L}$ when low-level charge is supplied to the gate electrode of the transistor 542 (the charge accumulation portion (FD)).

Here, apparent threshold voltage refers to the potential of the wiring 571 that is needed to turn on the transistor 542. Thus, when the potential of the wiring 571 is set to a potential $V_0$ that is between $V_{th\_H}$ and $V_{th\_L}$, charge given to the gate electrode of the transistor 542 (the charge accumulation portion (FD)) can be determined.

For example, in the case where the high-level charge is given in data writing, the transistor 542 is turned on when the potential of the wiring 571 is $V_0$ ($>V_{th\_H}$). In the case where the low-level charge is given in data writing, the transistor 542 remains in an off state even when the potential of the wiring 571 is set to $V_0$ ($<V_{th\_L}$). Therefore, the retained data can be read by determining the potential of the wiring 575.

Note that in the case where memory elements are arrayed, only data in a desired memory element needs to be read. The wirings 571 of memory cells from which data is not read are supplied with a potential at which the transistor 542 is turned off regardless of the potential supplied to the gate electrode, that is, a potential lower than $V_{th\_H}$. Alternatively, the wirings 571 may be supplied with a potential at which the transistor 542 is turned on regardless of the potential supplied to the gate electrode, that is, a potential higher than $V_{th\_L}$.

When the semiconductor device in FIG. 26 includes a transistor having a channel formation region formed using an oxide semiconductor and having extremely low off-state current, stored data can be retained for an extremely long period. In other words, power consumption can be sufficiently reduced because refresh operation becomes unnecessary or the frequency of refresh operation can be extremely low. Moreover, stored data can be retained for a long period even when power is not supplied (note that a potential is preferably fixed). Note that power may be supplied while the stored data is retained.

The above driving method does not require high voltage for writing data to the charge accumulation portion (FD) and does not have the problem of deterioration of the transistor 542. For example, unlike a conventional nonvolatile memory, it is not necessary to inject and extract electrons into and from a floating gate by application of high voltage; thus, a problem such as deterioration of a gate insulating film of the transistor 542 does not arise. In other words, the semiconductor device in the disclosed invention does not have a limit on the number of write cycles that is a problem in a conventional nonvolatile memory, and reliability thereof is drastically improved. Furthermore, data is written depending on the on state and the off state of the transistor, so that high-speed operation can be easily achieved.

In this embodiment, one embodiment of the present invention has been described. Other embodiments of the present invention are described in the other embodiments. Note that one embodiment of the present invention is not limited thereto. Although an example in which one embodiment of the present invention is applied to a semiconductor device including a memory element is described, one embodiment of the present invention is not limited thereto. Depending on circumstances or conditions, one embodiment of the present invention is not necessarily applied to a semiconductor device including a memory element. One embodiment of the present invention may be applied to a semiconductor device with another function, for example.

This embodiment can be combined with any of the structures described in the other embodiments as appropriate.

Embodiment 3

In this embodiment, a transistor including an oxide semiconductor that can be used in one embodiment of the present invention is described with reference to drawings. In the drawings in this embodiment, some components are enlarged, reduced in size, or omitted for easy understanding.

Figure 33A:
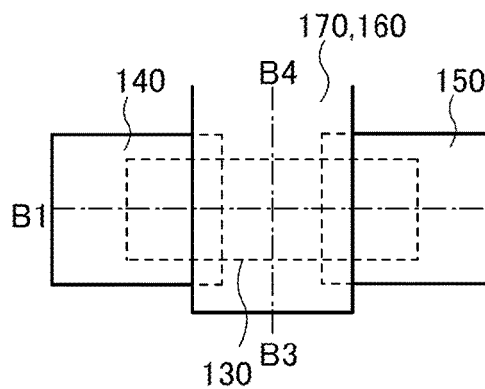
FIGS. 33A to 33F are top views and cross-sectional views illustrating a transistor.
Figure 33B:
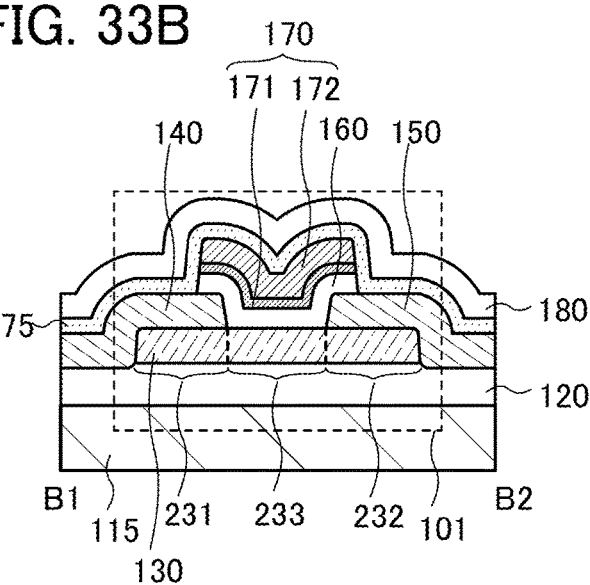
Figure 35A:
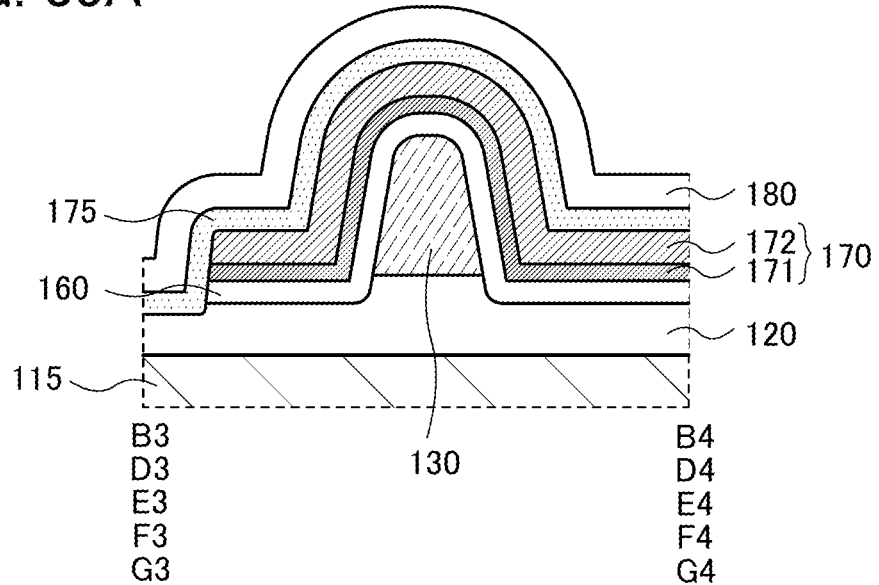
FIGS. 35A to 35D each illustrate a cross section of a transistor in a channel width direction.

FIGS. 33A and 33B are a top view and a cross-sectional view illustrating a transistor 101 in one embodiment of the present invention. FIG. 33A is a top view, and a cross section in the direction of dashed-dotted line B1-B2 in FIG. 33A is illustrated in FIG. 33B. A cross section in the direction of dashed-dotted line B3-B4 in FIG. 33A is illustrated in FIG. 35A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 33B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring."

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 33C:
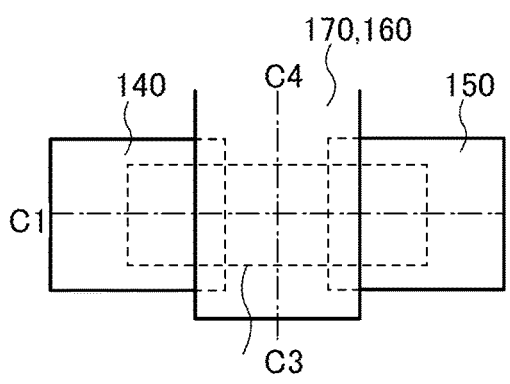
Figure 33D:
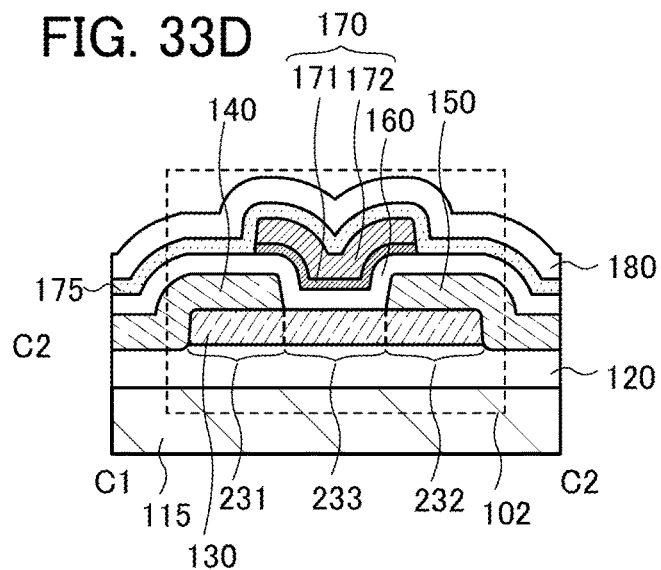
Figure 35B:
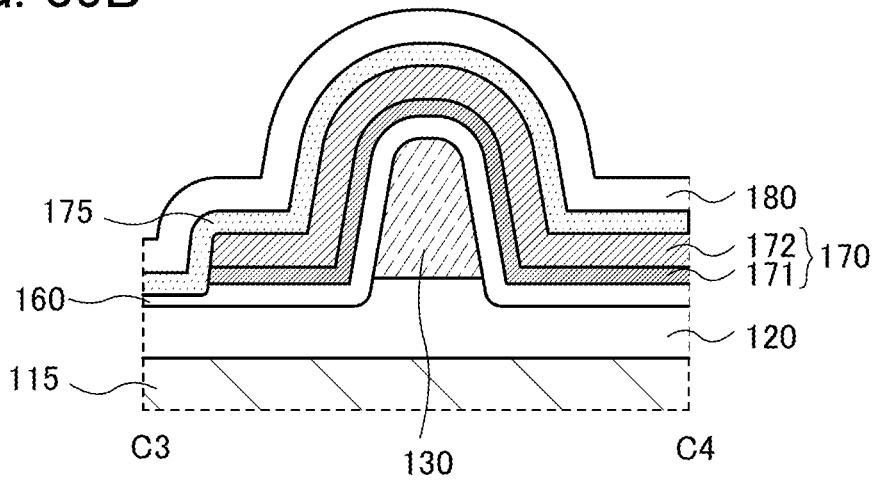

The transistor in one embodiment of the present invention may have a structure illustrated in FIGS. 33C and 33D. FIG. 33C is a top view of a transistor 102. A cross section in the direction of dashed-dotted line C1-C2 in FIG. 33C is illustrated in FIG. 33D. A cross section in the direction of dashed-dotted line C3-C4 in FIG. 33C is illustrated in FIG. 35B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 33E:
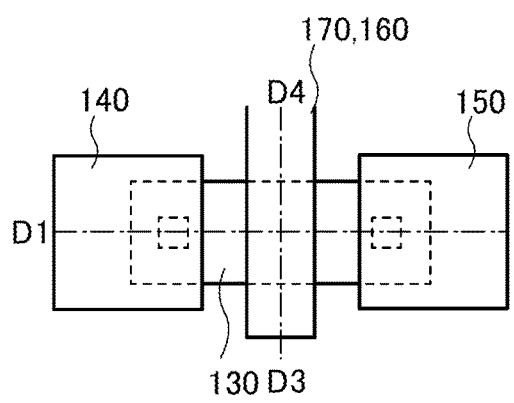
Figure 33F:
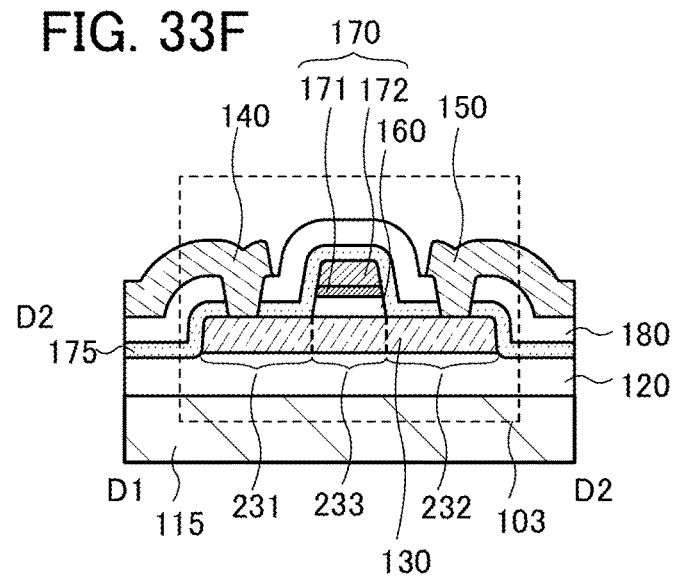

The transistor in one embodiment of the present invention may have a structure illustrated in FIGS. 33E and 33F. FIG. 33E is a top view of a transistor 103. A cross section in the direction of dashed-dotted line D1-D2 in FIG. 33E is illustrated in FIG. 33F. A cross section in the direction of dashed-dotted line D3-D4 in FIG. 33E is illustrated in FIG. 35A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 33F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 34A:
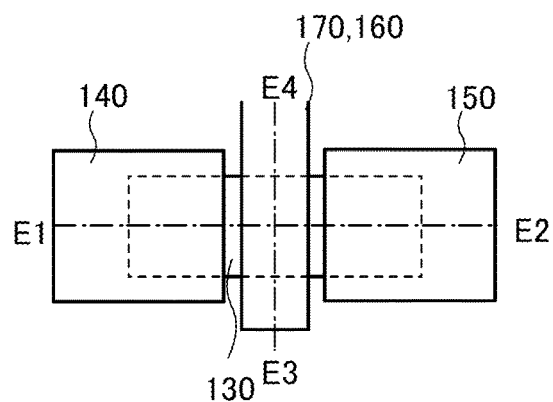
FIGS. 34A to 34F are top views and cross-sectional views illustrating a transistor.
Figure 34B:
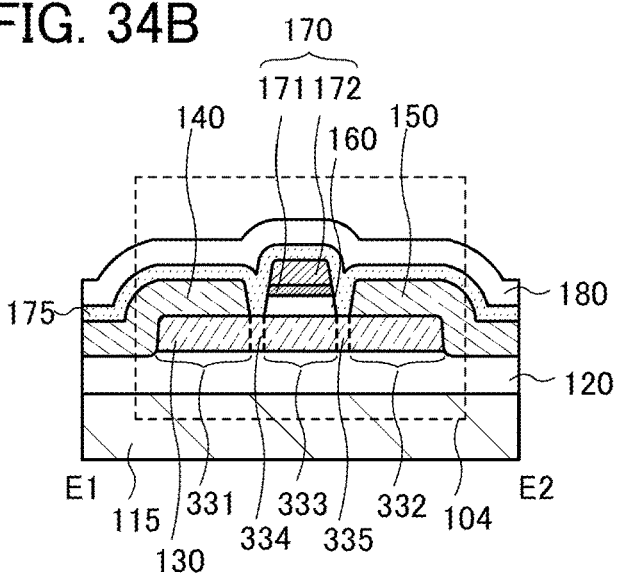

The transistor in one embodiment of the present invention may have a structure illustrated in FIGS. 34A and 34B. FIG. 34A is a top view of a transistor 104. A cross section in the direction of dashed-dotted line E1-E2 in FIG. 34A is illustrated in FIG. 34B. A cross section in the direction of dashed-dotted line E3-E4 in FIG. 34A is illustrated in FIG. 35A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 34B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 34C:
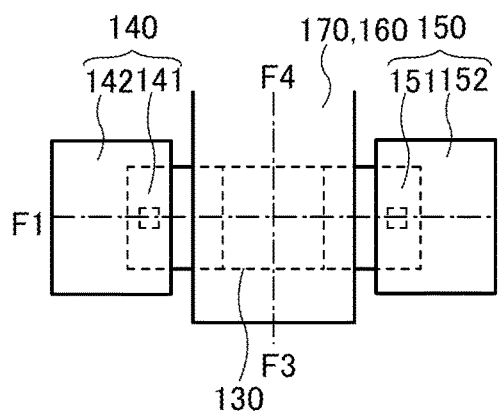
Figure 34D:
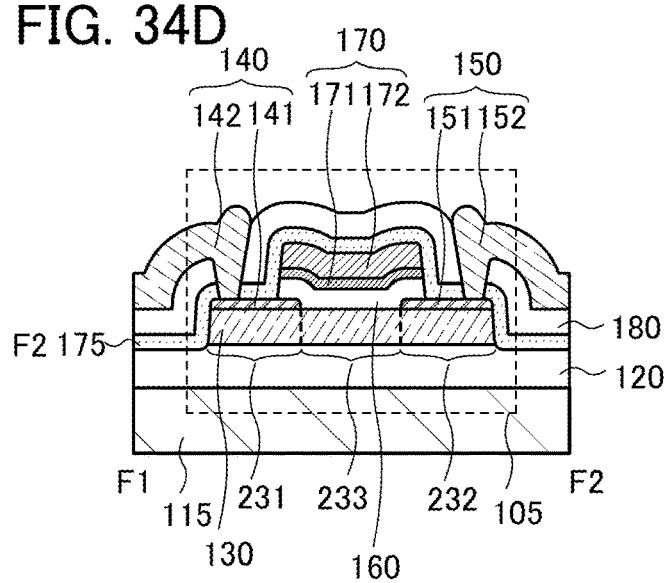

The transistor in one embodiment of the present invention may have a structure illustrated in FIGS. 34C and 34D. FIG. 34C is a top view of a transistor 105. A cross section in the direction of dashed-dotted line F1-F2 in FIG. 34C is illustrated in FIG. 34D. A cross section in the direction of dashed-dotted line F3-F4 in FIG. 34C is illustrated in FIG. 35A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 34E:
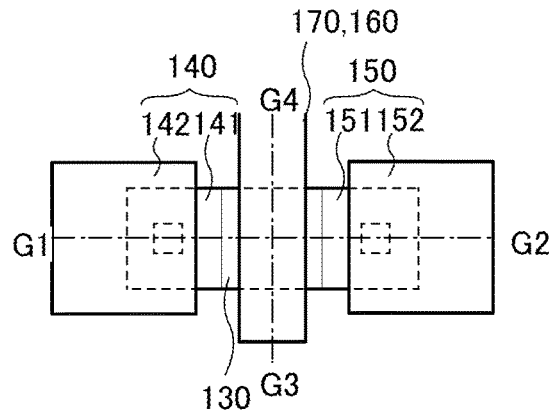
Figure 34F:
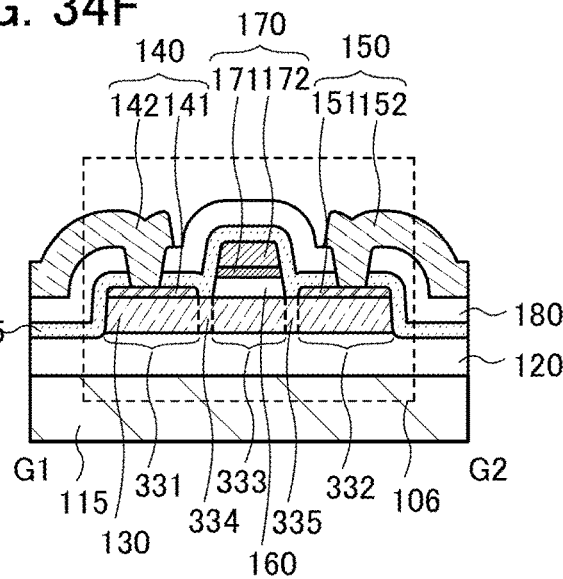

The transistor in one embodiment of the present invention may have a structure illustrated in FIGS. 34E and 34F. FIG. 34E is a top view of a transistor 106. A cross section in the direction of dashed-dotted line G1-G2 in FIG. 34E is illustrated in FIG. 34F. A cross section in the direction of dashed-dotted line G3-G4 in FIG. 34E is illustrated in FIG. 35A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 35C:
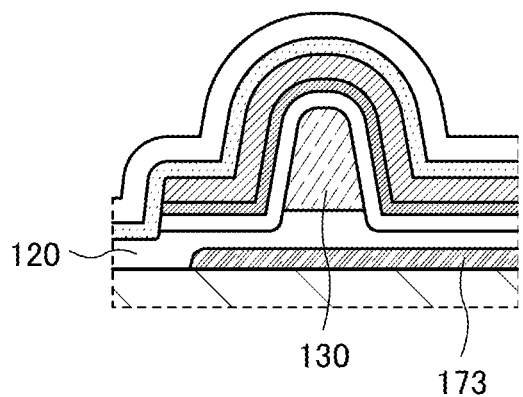
Figure 35D:
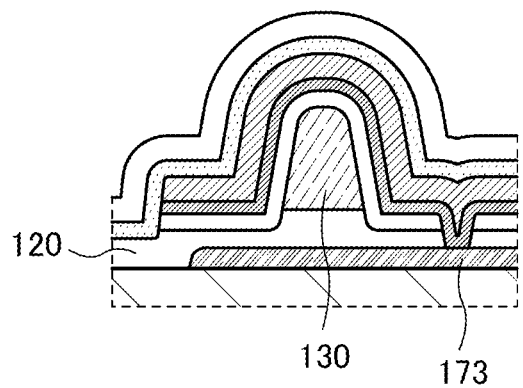
Figure 36A:
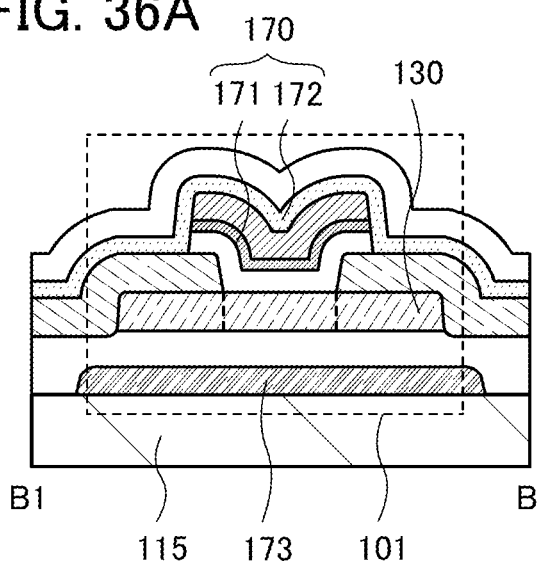
FIGS. 36A to 36F each illustrate a cross section of a transistor in a channel length direction.
Figure 36B:
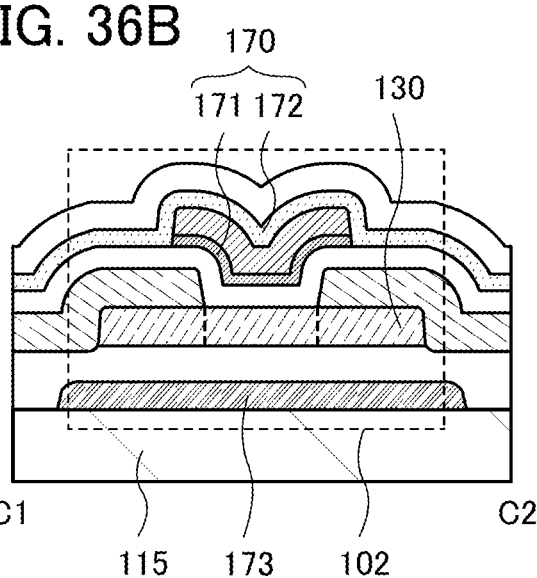
Figure 36C:
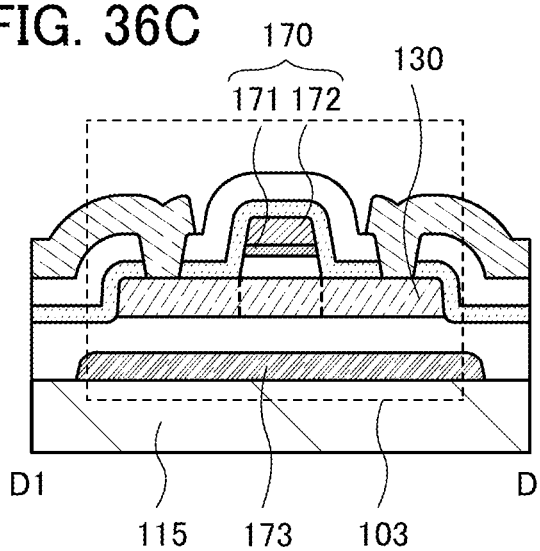
Figure 36D:
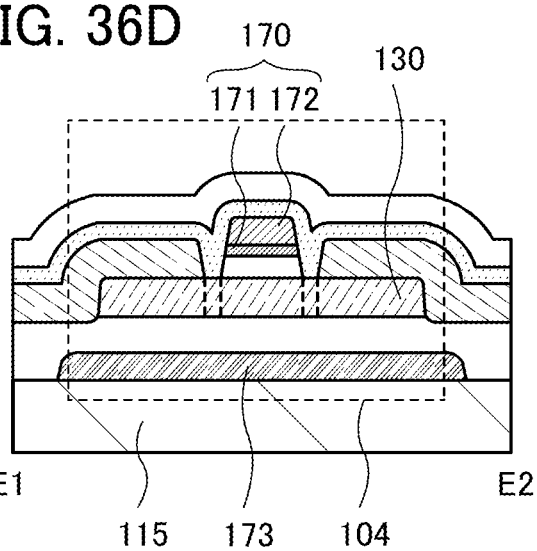
Figure 36E:
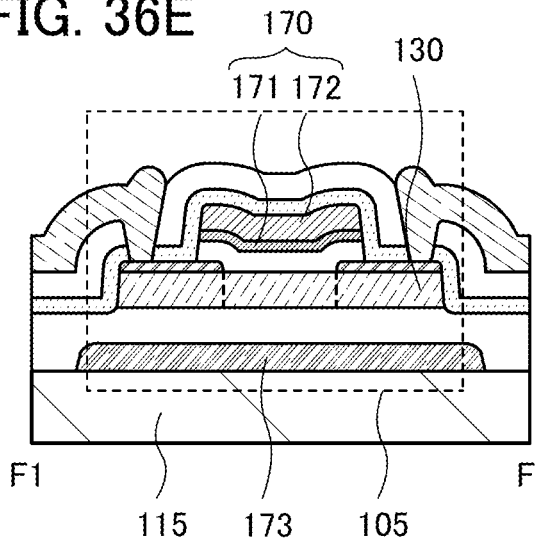
Figure 36F:
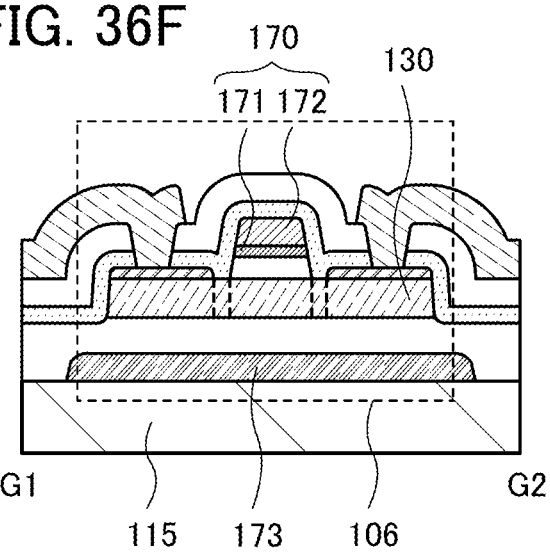

The transistor in one embodiment of the present invention may include a conductive layer 173 between the oxide semiconductor layer 130 and the substrate 115 as illustrated in cross-sectional views in the channel length direction in FIGS. 36A to 36F and cross-sectional views in the channel width direction in FIGS. 35C and 35D. When the conductive layer 173 is used as a second gate electrode layer (back gate), the on-state current can be increased or the threshold voltage can be controlled. In the cross-sectional views in FIGS. 36A to 36F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 35D, the conductive layers 170 and 173 may be electrically connected to each other through a contact hole.

Although the transistors 101 to 106 in FIGS. 33A to 33F and FIGS. 34A to 34F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIG. 37B, 37C, 37D, or 37E.

Figure 37A:
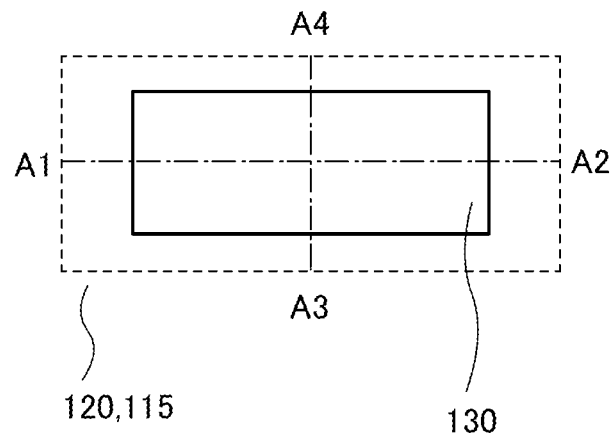
FIGS. 37A to 37E are a top view and cross-sectional views illustrating a semiconductor layer.
Figure 37B:
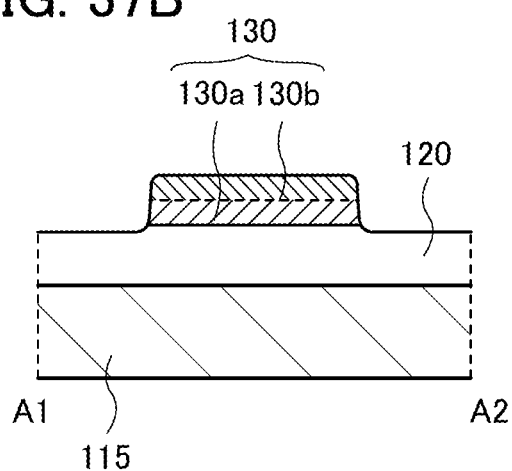
Figure 37D:
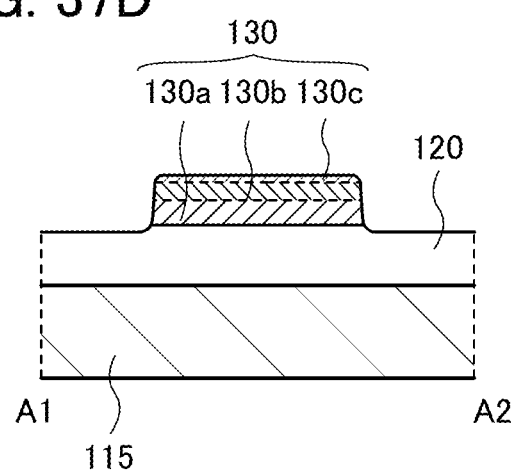
Figure 37C:
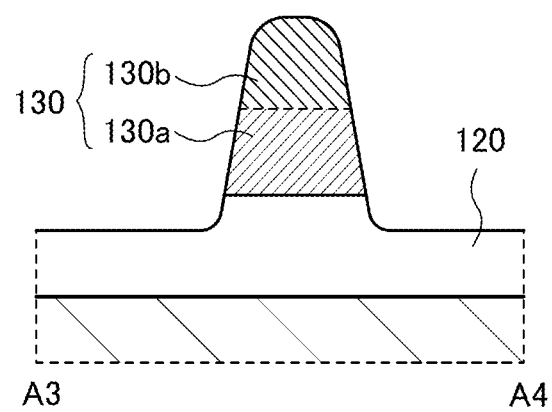
Figure 37E:
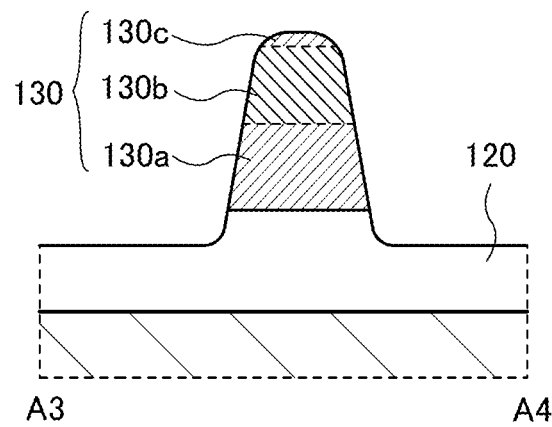

FIG. 37A is a top view of the oxide semiconductor layer 130, and FIGS. 37B and 37C are cross-sectional views of the oxide semiconductor layer 130 with a two-layer structure. FIGS. 37D and 37E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 38A:
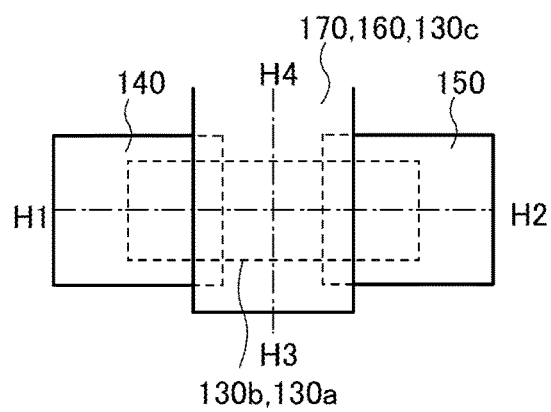
FIGS. 38A to 38F are top views and cross-sectional views illustrating a transistor.
Figure 38B:
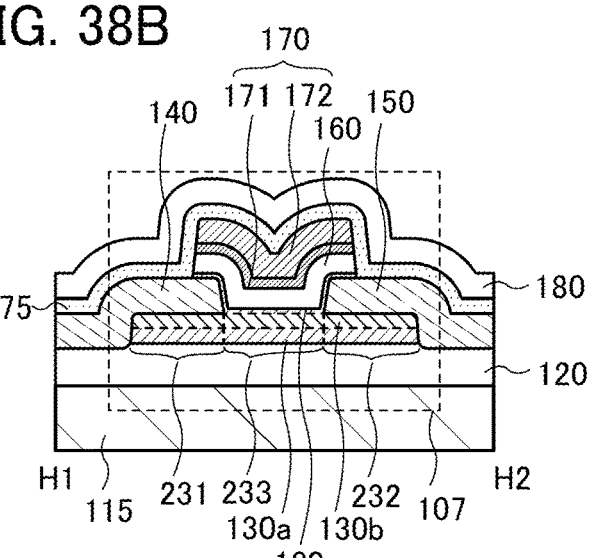
Figure 40A:
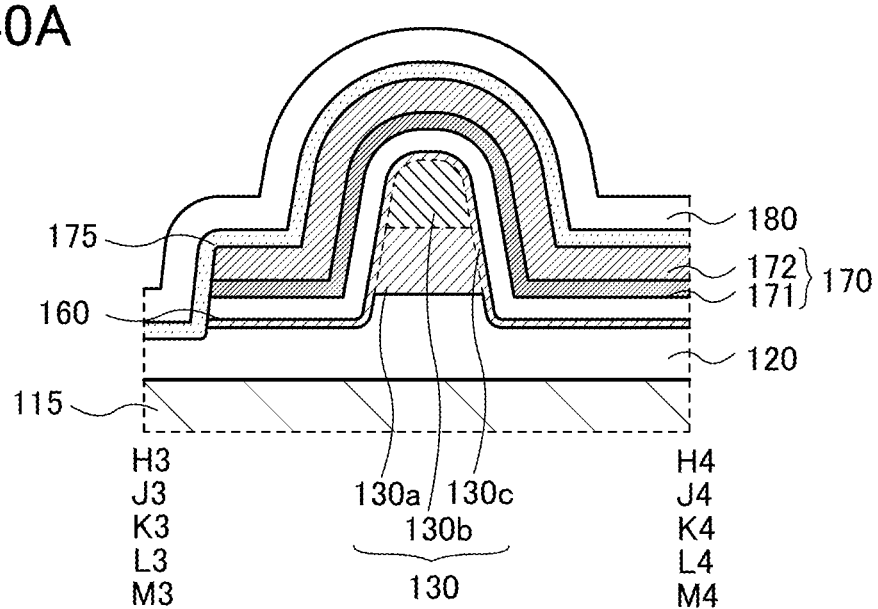
FIGS. 40A to 40D each illustrate a cross section of a transistor in a channel width direction.

The transistor in one embodiment of the present invention may have a structure illustrated in FIGS. 38A and 38B. FIG. 38A is a top view of a transistor 107. A cross section in the direction of dashed-dotted line H1-H2 in FIG. 38A is illustrated in FIG. 38B. A cross section in the direction of dashed-dotted line H3-H4 in FIG. 38A is illustrated in FIG. 40A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 38C:
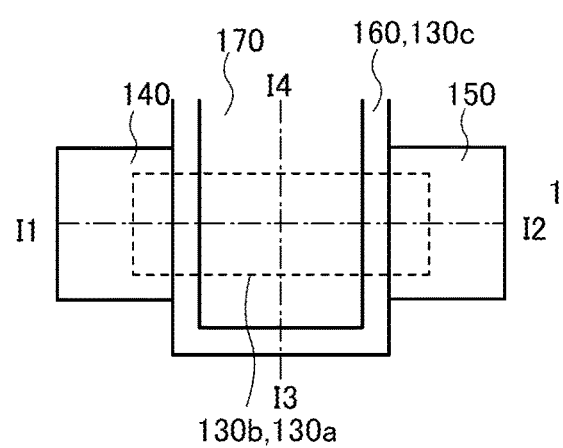
Figure 38D:
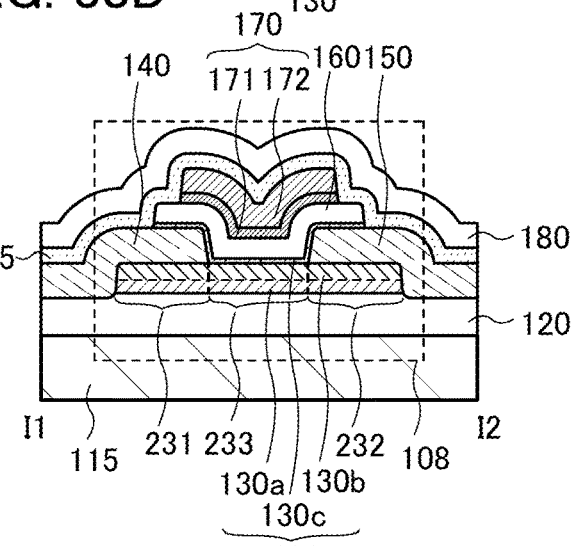
Figure 40B:
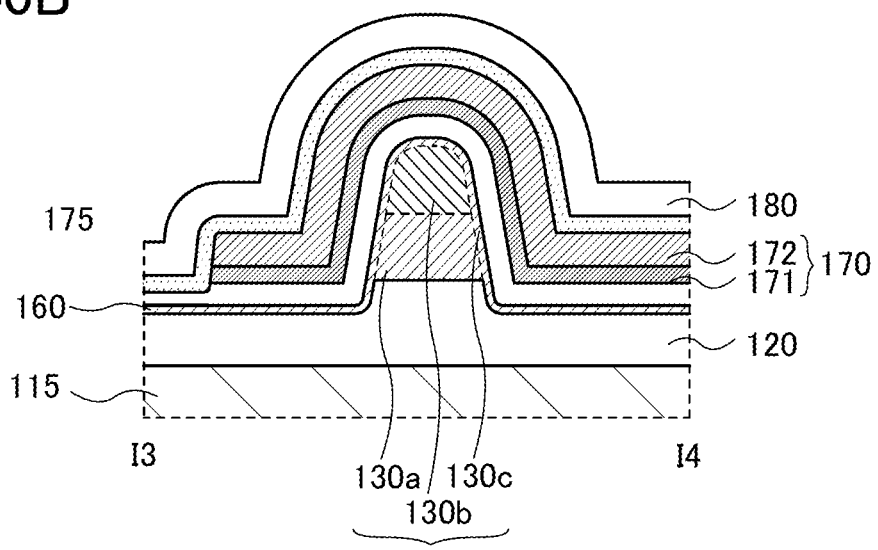

The transistor in one embodiment of the present invention may have a structure illustrated in FIGS. 38C and 38D. FIG. 38C is a top view of a transistor 108. A cross section in the direction of dashed-dotted line I1-I2 in FIG. 38C is illustrated in FIG. 38D. A cross section in the direction of dashed-dotted line I3-I4 in FIG. 38C is illustrated in FIG. 40B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 38E:
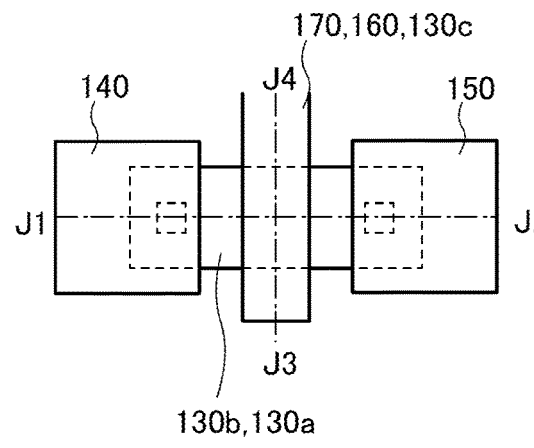
Figure 38F:
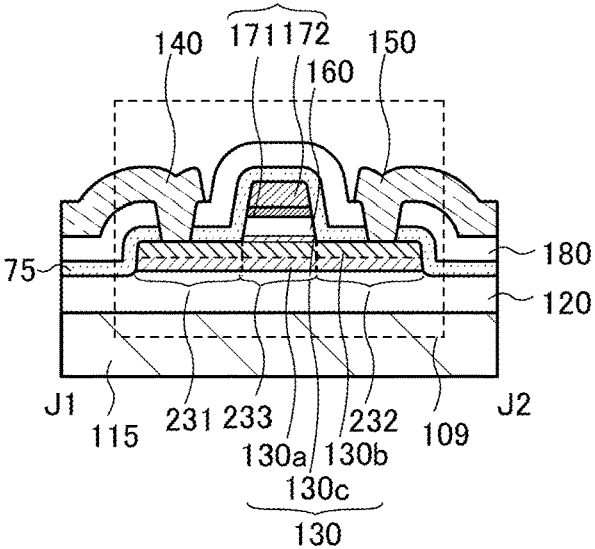

The transistor in one embodiment of the present invention may have a structure illustrated in FIGS. 38E and 38F. FIG.

38E is a top view of a transistor 109. A cross section in the direction of dashed-dotted line J1-J2 in FIG. 38E is illustrated in FIG. 38F. A cross section in the direction of dashed-dotted line J3-J4 in FIG. 38E is illustrated in FIG. 40A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 39A:
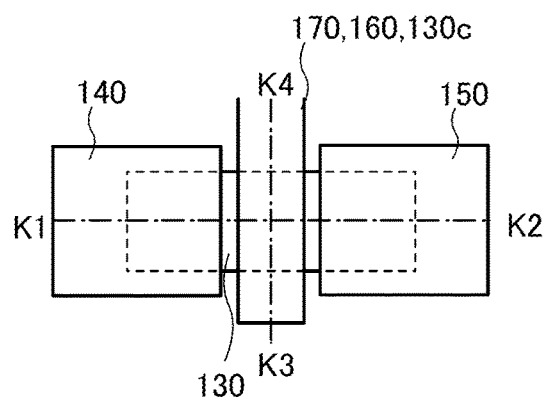
FIGS. 39A to 39F are top views and cross-sectional views illustrating a transistor.
Figure 39B:
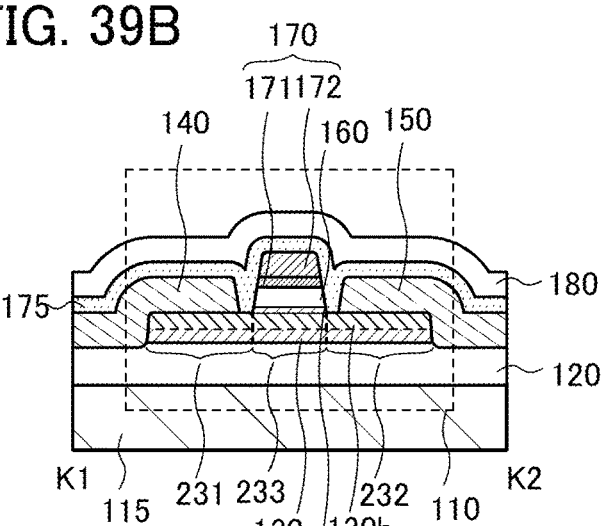

The transistor in one embodiment of the present invention may have a structure illustrated in FIGS. 39A and 39B. FIG. 39A is a top view of a transistor 110. A cross section in the direction of dashed-dotted line K1-K2 in FIG. 39A is illustrated in FIG. 39B. A cross section in the direction of dashed-dotted line K3-K4 in FIG. 39A is illustrated in FIG. 40A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 39C:
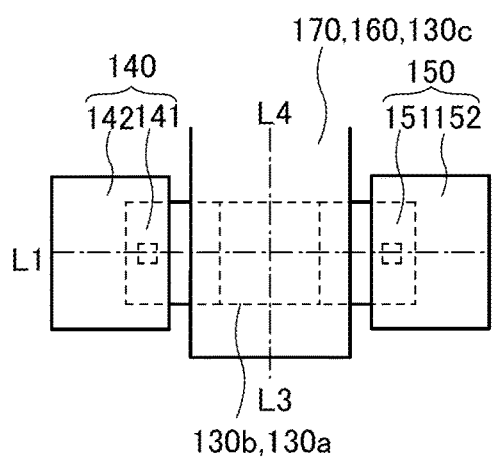
Figure 39D:
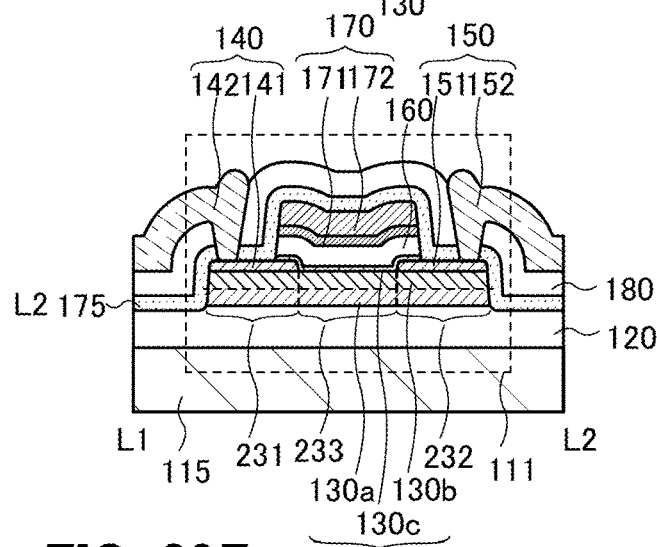

The transistor in one embodiment of the present invention may have a structure illustrated in FIGS. 39C and 39D. FIG. 39C is a top view of a transistor 111. A cross section in the direction of dashed-dotted line K1-K2 in FIG. 39C is illustrated in FIG. 39D. A cross section in the direction of dashed-dotted line L3-L4 in FIG. 39C is illustrated in FIG. 40A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 39E:
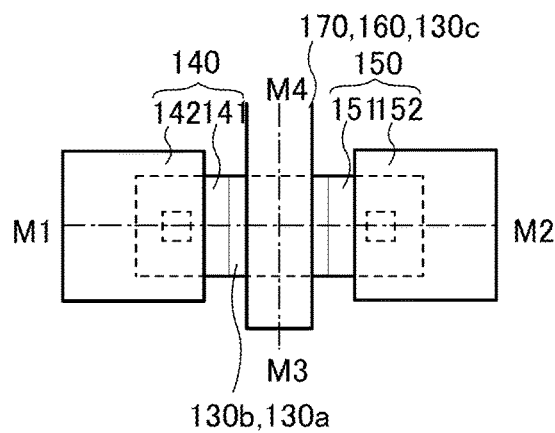
Figure 39F:
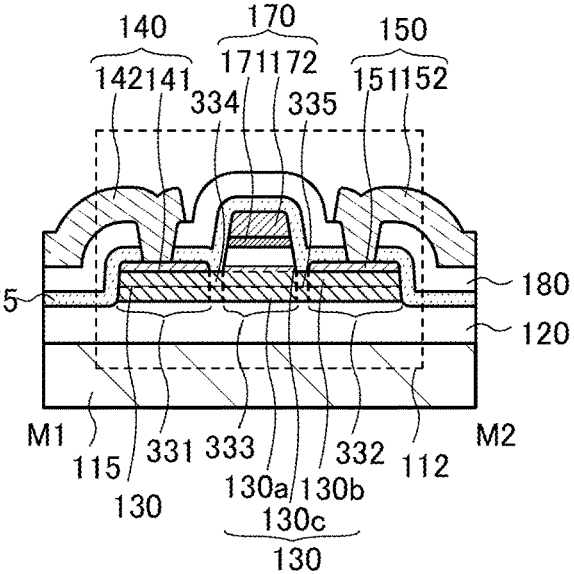

The transistor in one embodiment of the present invention may have a structure illustrated in FIGS. 39E and 39F. FIG. 39E is a top view of a transistor 112. A cross section in the direction of dashed-dotted line M1-M2 in FIG. 39E is illustrated in FIG. 39F. A cross section in the direction of dashed-dotted line M3-M4 in FIG. 39E is illustrated in FIG. 40A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 40C:
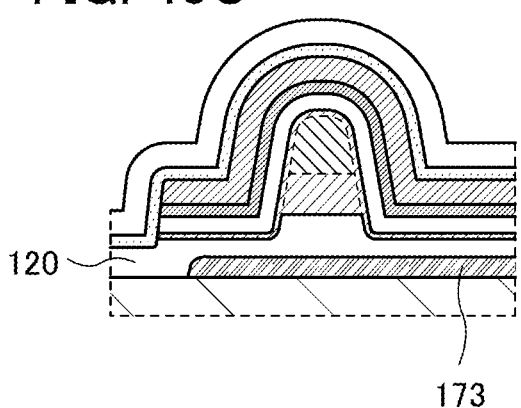
Figure 40D:
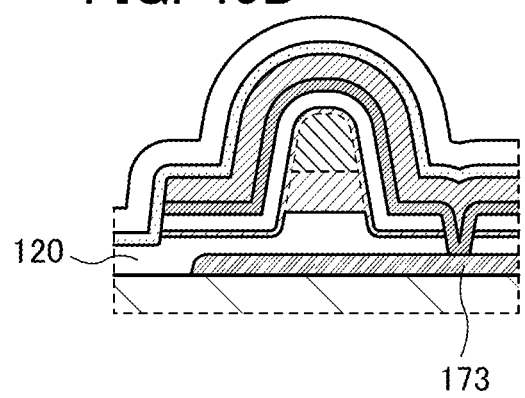
Figure 41A:
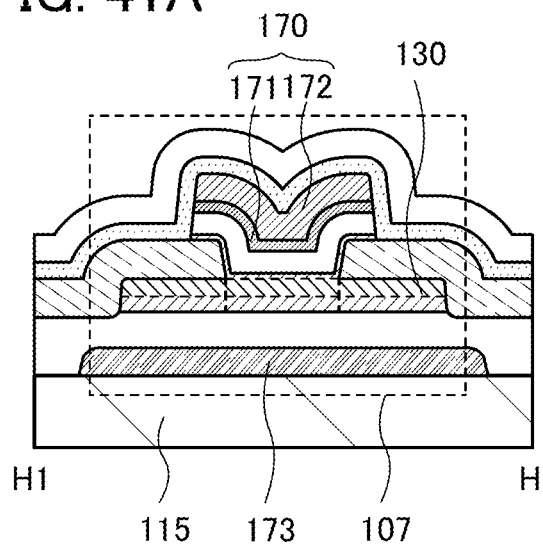
FIGS. 41A to 41F each illustrate a cross section of a transistor in a channel length direction.
Figure 41B:
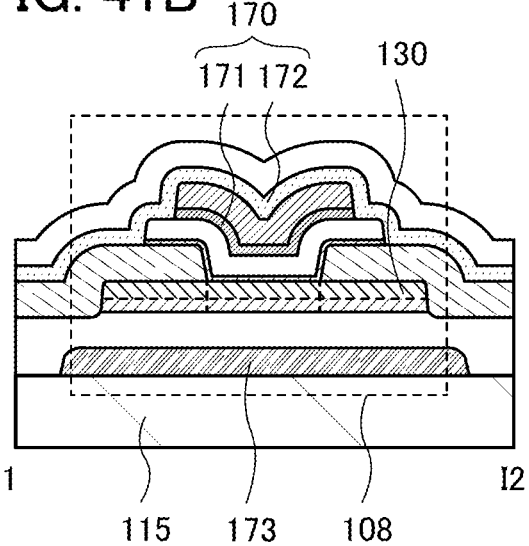
Figure 41C:
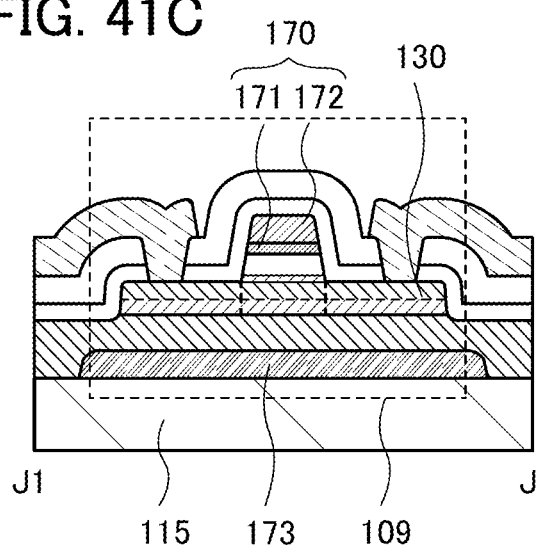
Figure 41D:
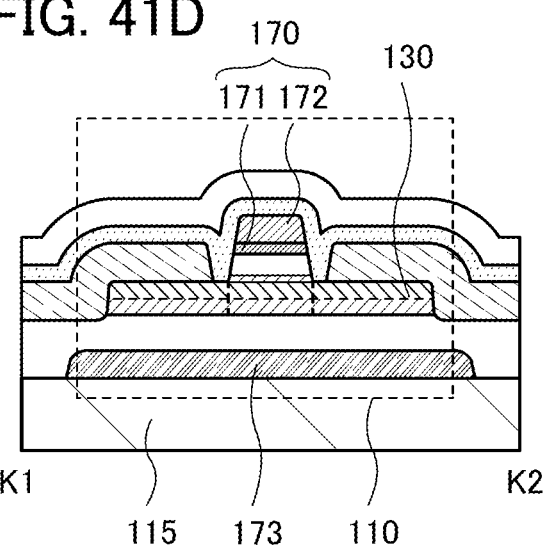
Figure 41E:
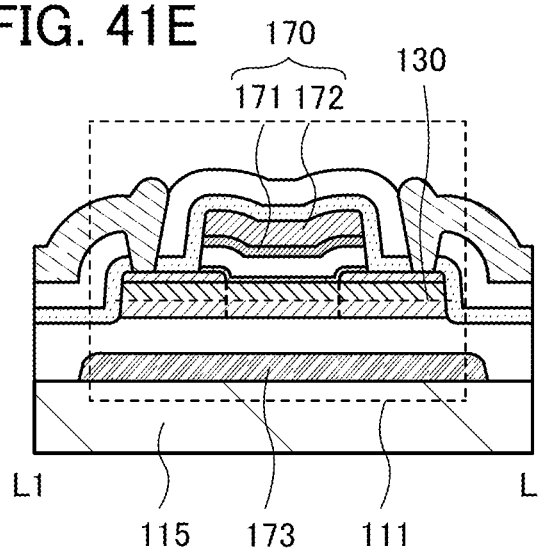
Figure 41F:
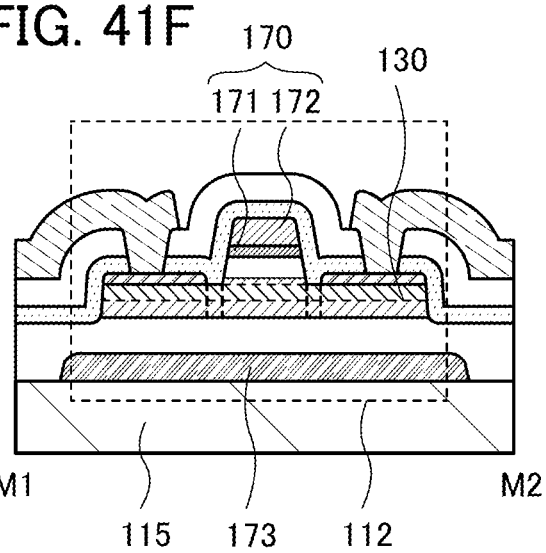

The transistor in one embodiment of the present invention may include the conductive layer 173 between the oxide semiconductor layer 130 and the substrate 115 as illustrated in cross-sectional views in the channel length direction in FIGS. 41A to 41F and cross-sectional views in the channel width direction in FIGS. 40C and 40D. When the conductive layer is used as a second gate electrode layer (back gate), the on-state current can be increased or the threshold voltage can be controlled. In the cross-sectional views in FIGS. 41A to 41F, the width of the conductive layer 173 may be shorter than that of the oxide semiconductor layer 130. Moreover, the width of the conductive layer 173 may be shorter than that of the conductive layer 170.

Figure 42A:
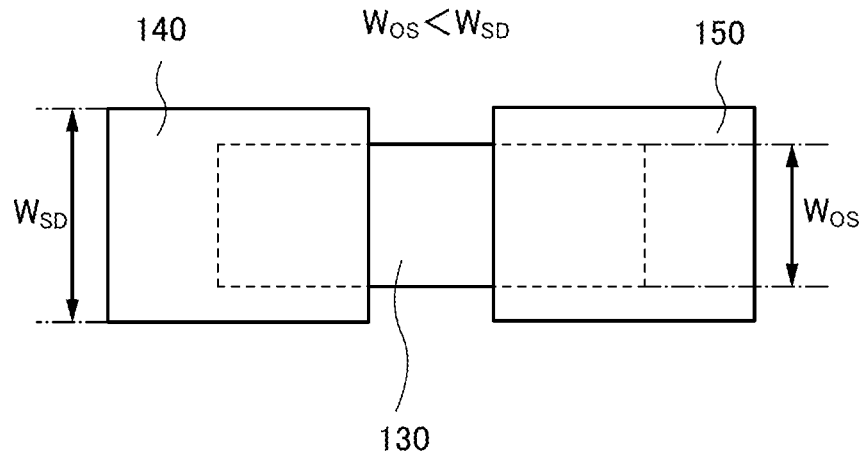
FIGS. 42A to 42C are top views each illustrating a transistor.
Figure 42B:
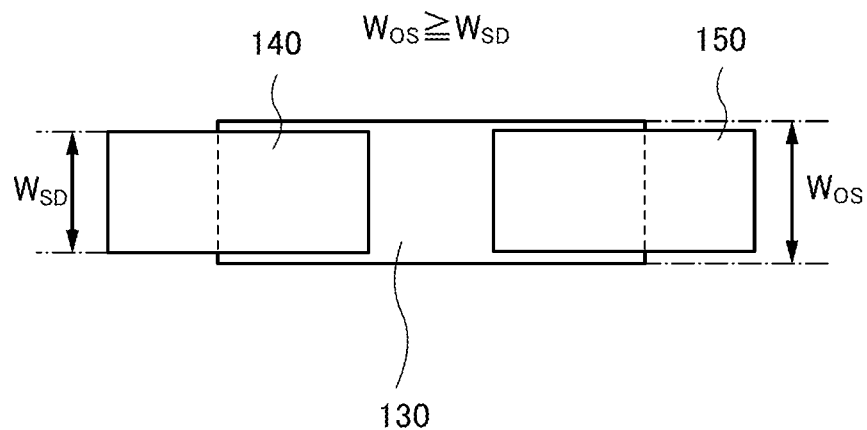
Figure 42C:
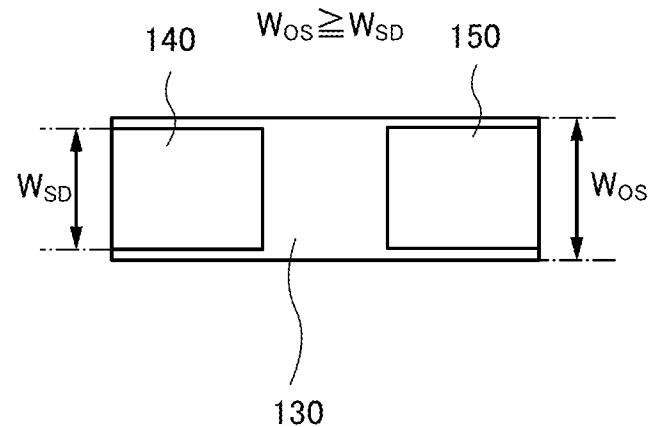

As illustrated in FIGS. 42A and 42B (illustrating only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 42C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Therefore, increasing the thickness of the oxide semiconductor layer 130b might increase the on-state current.

A semiconductor device including a transistor with any of the above structures can have favorable electrical characteristics.

The structure described above in this embodiment can be combined with any of the structures described in the other embodiments as appropriate.

Embodiment 4

In this embodiment, components of the transistors described in Embodiment 2 are described in detail.

As the substrate 115, a glass substrate, a quartz substrate, a semiconductor substrate, a ceramic substrate, a metal substrate having a surface subjected to insulation treatment, or the like can be used. The substrate 115 can be a silicon substrate provided with a transistor and/or a photodiode; and an insulating layer, a wiring, a conductor functioning as a contact plug, and the like that are provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed using the silicon substrate, a surface of the silicon substrate where the transistor is formed preferably has a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and more preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also functions as an interlayer insulating film. In that case, the insulating layer 120 is preferably subjected to planarization treatment such as CMP so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side described in this embodiment is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, more preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

Note that in order that a transistor in which a channel is formed in an oxide semiconductor layer have stable electrical characteristics, it is effective to make the oxide semiconductor layer intrinsic (i-type) or substantially intrinsic by reducing the concentration of impurities in the oxide semiconductor layer. The term "substantially intrinsic" refers to a state where an oxide semiconductor layer has a carrier density lower than $1\times10^{19}/cm^3$, lower than $1\times10^{15}/cm^3$, lower than $1\times10^{13}/cm^3$, or higher than or equal to $1\times10^{-9}/cm^3$ and lower than $1\times10^{8}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably higher than or equal to $1\times10^{17}$ atoms/$cm^3$ and lower than or equal to $5\times10^{18}$ atoms/$cm^3$. Furthermore, the oxide semiconductor layer is controlled to have a region in which the concentration of nitrogen is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably higher than or equal to $5\times10^{16}$ atoms/$cm^3$ and lower than or equal to $5\times10^{17}$ atoms/$cm^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1\times10^{19}$ atoms/$cm^3$, preferably higher than or equal to $1\times10^{18}$ atoms/$cm^3$ and lower than $5\times10^{18}$ atoms/$cm^3$. Furthermore, the oxide semiconductor layer is controlled to have a region in which the concentration of carbon is lower than $1\times10^{19}$ atoms/$cm^3$, preferably lower than or equal to $5\times10^{18}$ atoms/$cm^3$, more preferably higher than or equal to $6\times10^{17}$ atoms/$cm^3$ and lower than $1\times10^{18}$ atoms/$cm^3$.

A transistor in which a highly purified oxide semiconductor film is used for a channel formation region exhibits extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor in one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In each of the oxide semiconductor layers 130a to 130c, the proportion of each atom in the atomic ratio varies within a range of ±20% as a margin.

The oxide semiconductor layer 130b of the oxide semiconductor layer 130 serves as a well, so that a channel is formed in the oxide semiconductor layer 130b. Since the conduction band minimums are continuous, the oxide semiconductor layer 130 can also be referred to as a U-shaped well. Furthermore, a channel formed to have such a structure can also be referred to as a buried channel.

Trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in a positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor film that is in contact with any of the above materials, oxygen is released from the oxide semiconductor layer and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 3, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 3. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor in one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas) are sequentially introduced to form an In—O layer, a $Ga(CH_3)_3$ gas and an $O_3$ gas) are sequentially introduced to form a Ga—O layer, and then a $Zn(CH_3)_2$ gas and an $O_3$ gas) are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas), it is preferable to use an $O_3$ gas), which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in a film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor layer can be lowered.

The structure described above in this embodiment can be combined with any of the structures described in the other embodiments as appropriate.

Embodiment 5

The structure of an oxide semiconductor film that can be used for one embodiment of the present invention is described below.

In this specification, the term "parallel" indicates that the angle formed between two straight lines is greater than or equal to −10° and less than or equal to 10°, and accordingly includes the case where the angle is greater than or equal to −5° and less than or equal to 5°. The term "perpendicular" indicates that an angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an a-like OS film, a microcrystalline oxide semiconductor film, and a CAAC-OS film, for example.

The structure described above in this embodiment can be combined with any of the structures described in the other embodiments as appropriate.

Embodiment 6

A semiconductor device in one embodiment of the present invention can be used for display devices, personal computers, or image reproducing devices provided with recording media (typically, devices that reproduce the content of recording media such as digital versatile discs (DVD) and have displays for displaying the reproduced images). Furthermore, as electronic devices that can include the semiconductor device in one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 43A to 43F illustrate specific examples of these electronic devices.

Figure 43A:
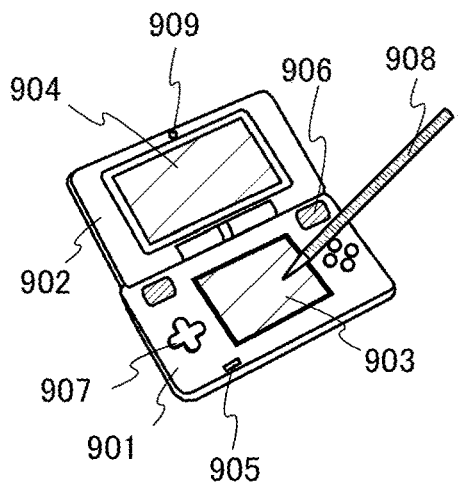
FIGS. 43A to 43F illustrate electronic devices.

FIG. 43A illustrates a portable game machine, which includes housings 901 and 902, display portions 903 and 904, a microphone 905, speakers 906, an operation key 907, a stylus 908, a camera 909, and the like. Although the portable game machine in FIG. 43A has the two display portions 903 and 904, the number of display portions included in the portable game machine is not limited to this. The semiconductor device in one embodiment of the present invention can be used for the portable game machine.

Figure 43B:
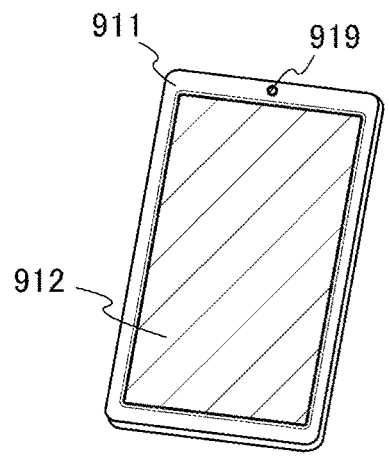

FIG. 43B illustrates a portable data terminal, which includes a first housing 911, a display portion 912, a camera 919, and the like. The touch panel function of the display portion 912 enables input and output of information. The semiconductor device in one embodiment of the present invention can be used for the portable data terminal.

Figure 43C:
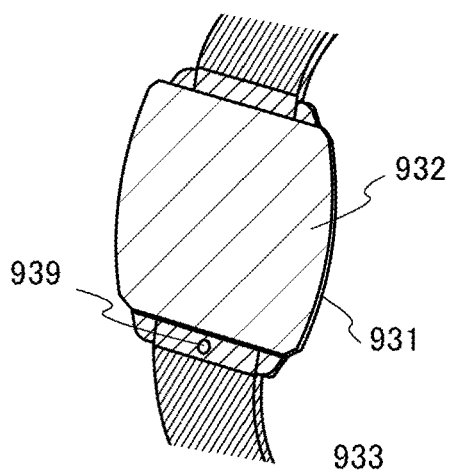

FIG. 43C illustrates a wrist-watch-type information terminal, which includes a housing 931, a display portion 932, a wristband 933, a camera 939, and the like. The display portion 932 may be a touch panel. The imaging device in one embodiment of the present invention can be used for the information terminal.

Figure 43D:
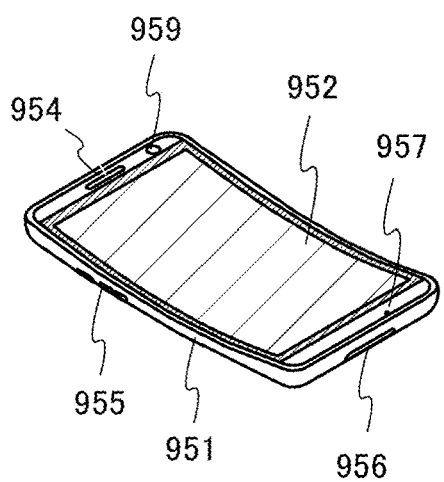

FIG. 43D illustrates a cellular phone, which includes a display portion 952, a microphone 957, a speaker 954, a camera 959, an input/output terminal 956, an operation button 955, and the like in a housing 951. The imaging device in one embodiment of the present invention can be used for the cellular phone.

Figure 43E:
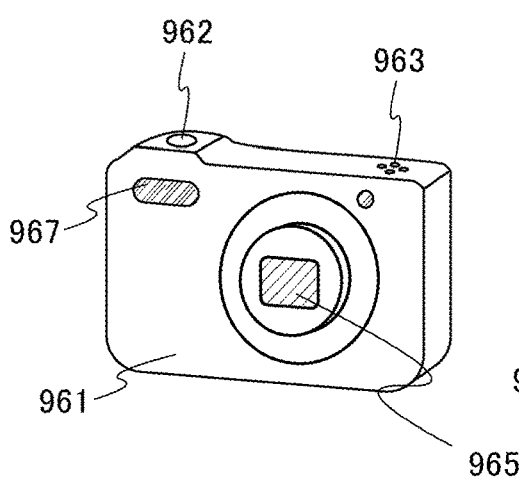

FIG. 43E illustrates a digital camera, which includes a housing 961, a shutter button 962, a microphone 963, a light-emitting portion 967, a lens 965, and the like. The imaging device in one embodiment of the present invention can be used for the digital camera.

Figure 43F:
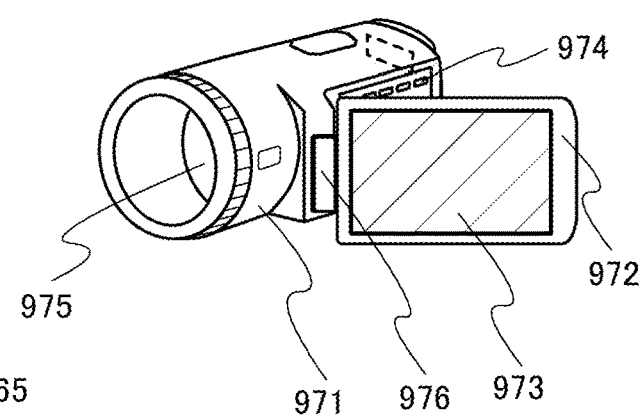

FIG. 43F illustrates a video camera, which includes a first housing 971, a second housing 972, a display portion 973, operation keys 974, a lens 975, a joint 976, and the like. The operation keys 974 and the lens 975 are provided in the first housing 971, and the display portion 973 is provided in the second housing 972. The first housing 971 and the second housing 972 are connected to each other with the joint 976, and an angle between the first housing 971 and the second housing 972 can be changed with the joint 976. An image displayed on the display portion 973 may be switched in accordance with the angle between the first housing 971 and the second housing 972 at the joint 976. The imaging device in one embodiment of the present invention can be used for the video camera.

This embodiment can be combined with any of the other embodiments described in this specification as appropriate.

This application is based on Japanese Patent Application serial No. 2014-250013 filed with Japan Patent Office on Dec. 10, 2014 and Japanese Patent Application serial No. 2014-266957 filed with Japan Patent Office on Dec. 29, 2014, the entire contents of which are hereby incorporated by reference.

What is claimed is:

1. A semiconductor device comprising:
a first pixel comprising a first photoelectric conversion element;
a second pixel comprising a second photoelectric conversion element;
a circuit comprising an input transistor and an output transistor; and
a light-blocking layer,
wherein a first current corresponding to a current flowing through the first pixel flows to the input transistor,
wherein a second current flows to the output transistor,
wherein a difference between the second current and a third current corresponding to a current flowing through the second pixel is calculated, and
wherein the light-blocking layer does not cover the first pixel while the light-blocking layer covers the second pixel to shield the second pixel from light.

2. The semiconductor device according to claim 1,
wherein the first pixel further comprises a first transistor,
wherein the second pixel further comprises a second transistor, and
wherein each of the first transistor and the second transistor comprises an oxide semiconductor in a channel formation region.

3. The semiconductor device according to claim 1,
wherein the first pixel further comprises a first transistor,
wherein the second pixel further comprises a second transistor,
wherein a gate the first transistor is electrically connected to the first photoelectric conversion element,
wherein a gate of the second transistor is electrically connected to the second photoelectric conversion element, and
wherein each of the first transistor and the second transistor comprises a back gate.

4. The semiconductor device according to claim 1,
wherein the first pixel further comprises a first transistor and a first capacitor,
wherein the second pixel further comprises a second transistor and a second capacitor,
wherein a gate the first transistor is electrically connected to the first photoelectric conversion element and one electrode of the first capacitor, and
wherein a gate of the second transistor is electrically connected to the second photoelectric conversion element and one electrode of the second capacitor.

5. A semiconductor device comprising:
a first pixel comprising a first photoelectric conversion element;
a second pixel comprising a second photoelectric conversion element; and
a light-blocking layer,
wherein the light-blocking layer does not cover the first pixel while the light-blocking layer covers the second pixel to shield the second pixel from light.

6. The semiconductor device according to claim 5,
wherein the first pixel further comprises a first transistor,
wherein the second pixel further comprises a second transistor, and
wherein each of the first transistor and the second transistor comprises an oxide semiconductor in a channel formation region.

7. The semiconductor device according to claim 5,
wherein the first pixel further comprises a first transistor,
wherein the second pixel further comprises a second transistor,
wherein a gate the first transistor is electrically connected to the first photoelectric conversion element,
wherein a gate of the second transistor is electrically connected to the second photoelectric conversion element, and
wherein each of the first transistor and the second transistor comprises a back gate.

8. The semiconductor device according to claim 5,
wherein the first pixel further comprises a first transistor and a first capacitor,
wherein the second pixel further comprises a second transistor and a second capacitor,
wherein a gate the first transistor is electrically connected to the first photoelectric conversion element and one electrode of the first capacitor, and
wherein a gate of the second transistor is electrically connected to the second photoelectric conversion element and one electrode of the second capacitor.

* * * * *